(12) United States Patent
Tobioka

(10) Patent No.: US 11,749,600 B2
(45) Date of Patent: Sep. 5, 2023

(54) THREE-DIMENSIONAL MEMORY DEVICE WITH HYBRID STAIRCASE STRUCTURE AND METHODS OF FORMING THE SAME

(71) Applicant: SANDISK TECHNOLOGIES LLC, Addison, TX (US)

(72) Inventor: Akihiro Tobioka, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 160 days.

(21) Appl. No.: 17/224,370

(22) Filed: Apr. 7, 2021

(65) Prior Publication Data

US 2022/0328403 A1 Oct. 13, 2022

(51) Int. Cl.
| | |
|---|---|
| H01L 23/528 | (2006.01) |
| H01L 23/522 | (2006.01) |
| H01L 21/768 | (2006.01) |
| H10B 41/27 | (2023.01) |
| H10B 43/27 | (2023.01) |

(52) U.S. Cl.
CPC .... *H01L 23/5283* (2013.01); *H01L 21/76816* (2013.01); *H01L 21/76877* (2013.01); *H01L 23/5226* (2013.01); *H10B 41/27* (2023.02); *H10B 43/27* (2023.02)

(58) Field of Classification Search
None
See application file for complete search history.

(56) References Cited

U.S. PATENT DOCUMENTS

| | | | |
|---|---|---|---|
| 5,915,167 A | 6/1999 | Leedy | |
| 9,543,318 B1 | 1/2017 | Lu et al. | |
| 10,115,681 B1 | 10/2018 | Ariyoshi | |
| 2019/0081061 A1* | 3/2019 | Tessariol | ........... H01L 21/76877 |

OTHER PUBLICATIONS

Endoh et al., "Novel Ultra High Density Memory with a Stacked-Surrounding Gate Transistor (S-SGT) Structured Cell," IEDM Proc. (2001) 33-36.
U.S. Appl. No. 16/547,971, filed Aug. 22, 2019, SanDisk Technologies LLC.
U.S. Appl. No. 16/675,459, filed Nov. 6, 2019, SanDisk Technologies LLC.

(Continued)

*Primary Examiner* — Hsien Ming Lee
(74) *Attorney, Agent, or Firm* — THE MARBURY LAW GROUP PLLC

(57) ABSTRACT

A vertically alternating sequence of unit layer stacks is formed over a substrate. Each unit layer stacks includes an insulating layer and a spacer material layer that is formed as, or is subsequently replaced with, a first electrically conductive layer. A 2×N array of stepped surfaces is formed. Each column of two stepped surfaces other than one column is vertically extended by performing a set of processing sequences at least once. The set of processing sequences includes forming a patterned etch mask layer and etching an unmasked subset of the 2×N array. One or more patterned etch mask layer has a respective continuous opening including an entire area of a respective 2×M array of stepped surfaces that is a subset of the 2×N array of stepped surfaces. Vertical stacks of memory elements are formed through the vertically alternating sequence.

13 Claims, 66 Drawing Sheets

(56) References Cited

OTHER PUBLICATIONS

U.S. Appl. No. 16/782,307, filed Feb. 5, 2020, SanDisk Technologies LLC.
U.S. Appl. No. 16/827,990, filed Mar. 24, 2020, SanDisk Technologies LLC.
U.S. Appl. No. 16/881,346, filed May 22, 2020, SanDisk Technologies LLC.
U.S. Appl. No. 16/881,401, filed May 22, 2020, SanDisk Technologies LLC.
U.S. Appl. No. 16/921,146, filed Jul. 6, 2020, SanDisk Technologies LLC.
U.S. Appl. No. 17/039,160, filed Sep. 30, 2020, SanDisk Technologies LLC.
U.S. Appl. No. 17/146,866, filed Jan. 12, 2021, SanDisk Technologies LLC.

* cited by examiner

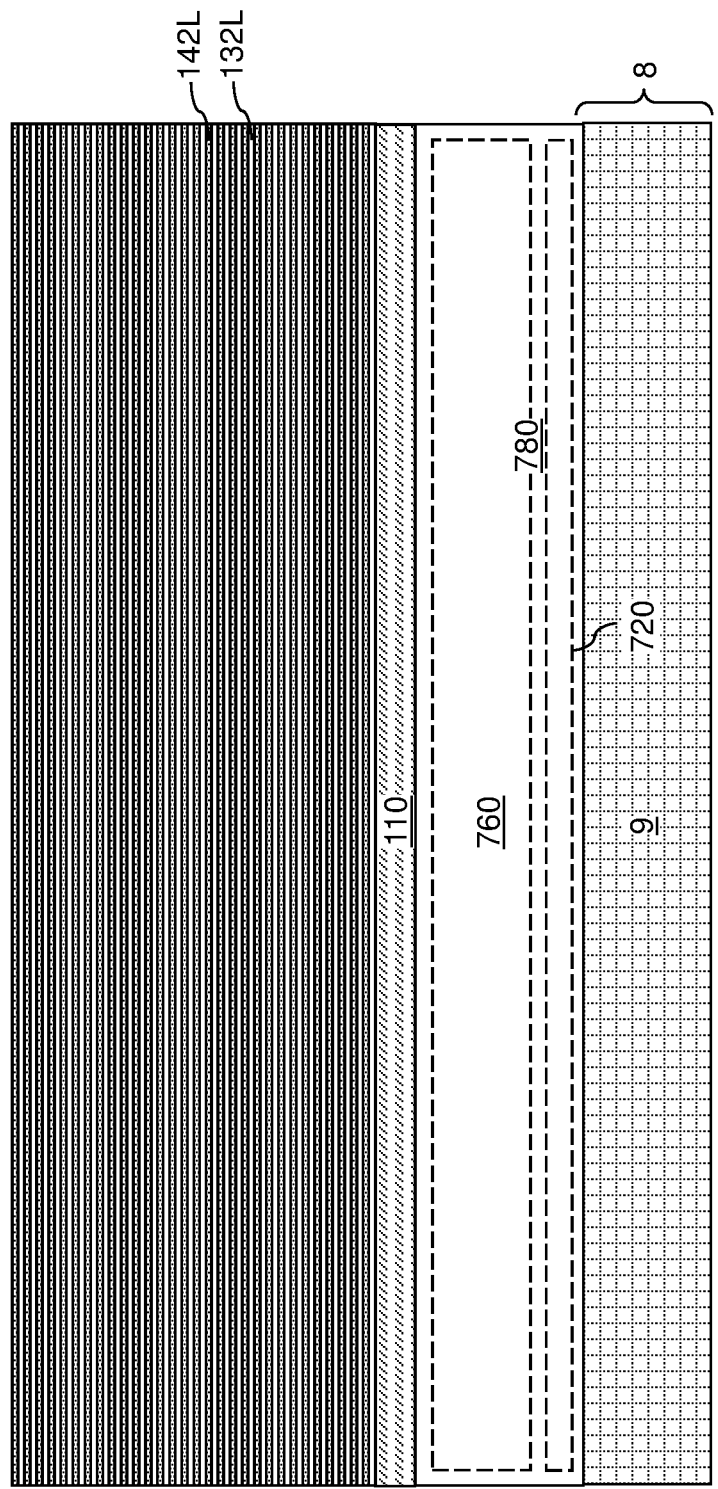

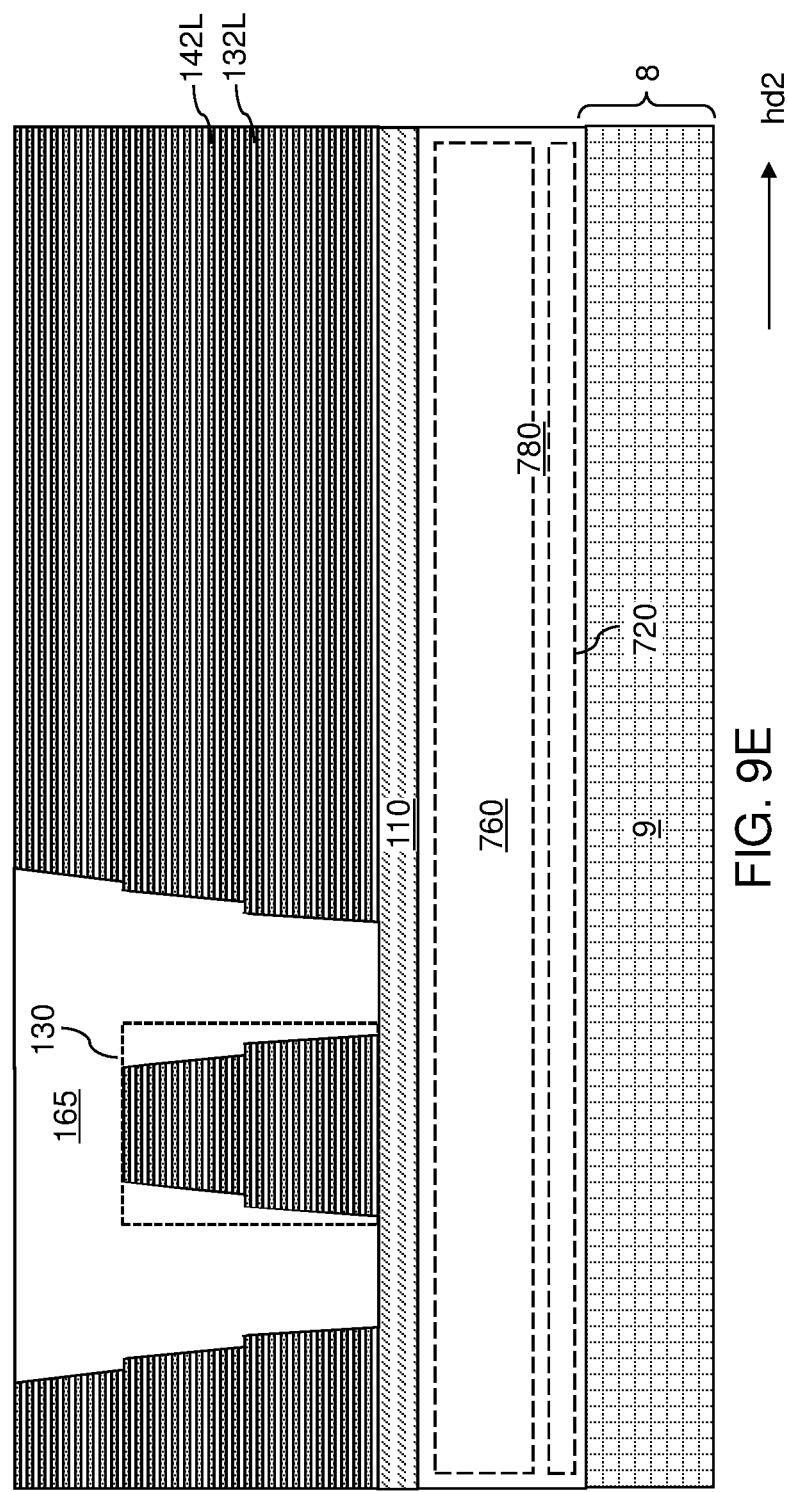

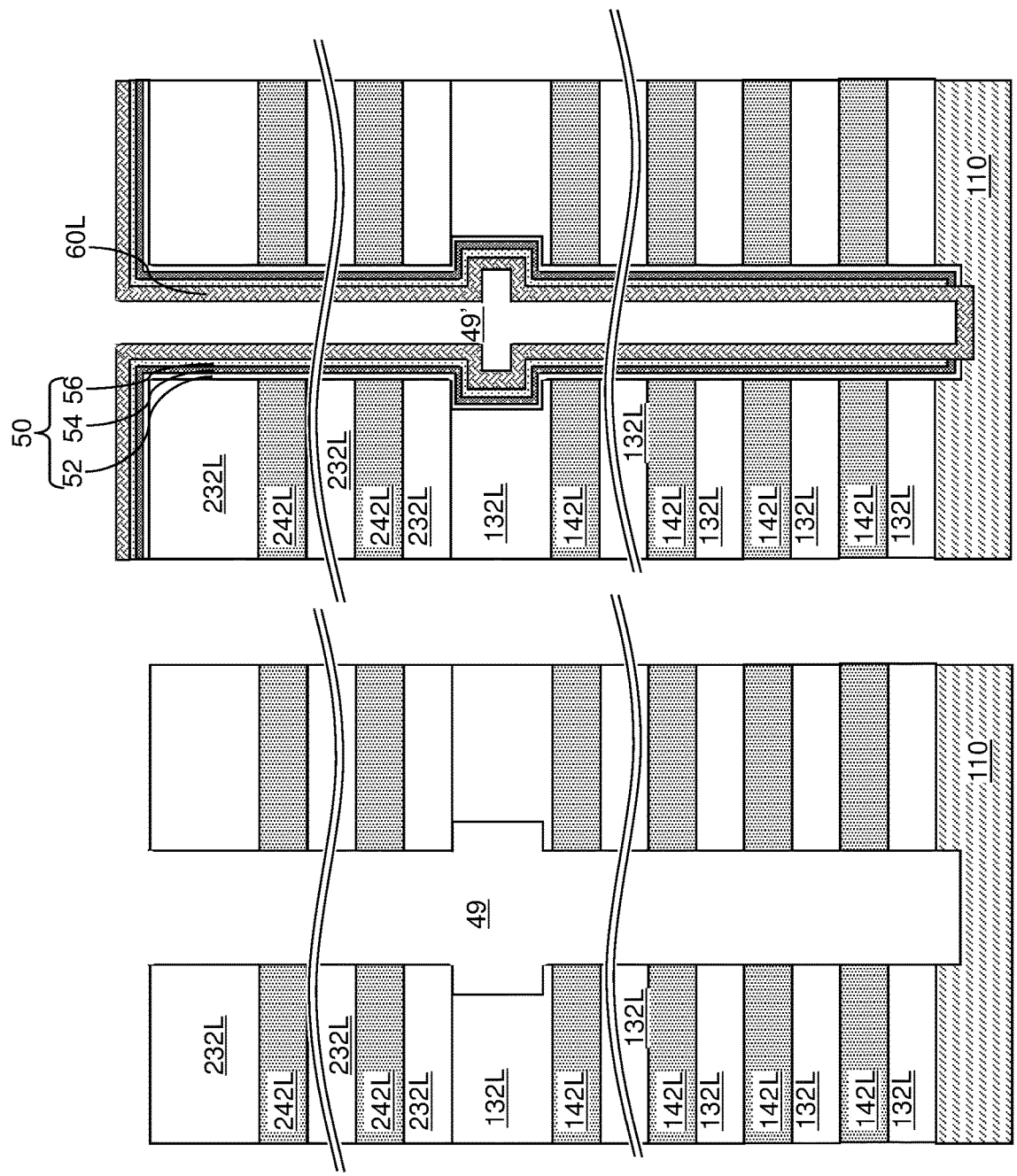

THREE-DIMENSIONAL MEMORY DEVICE WITH HYBRID STAIRCASE STRUCTURE AND METHODS OF FORMING THE SAME

FIELD

The present disclosure relates generally to the field of semiconductor devices, and particularly to a three-dimensional memory device including a hybrid staircase structure and methods of forming the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a three-dimensional memory device is provided, which comprises: first alternating stacks of first insulating layers and first electrically conductive layers located over a substrate, wherein the first alternating stacks laterally extend along a first horizontal direction and are laterally spaced apart along a second horizontal direction that is perpendicular to the first horizontal direction by line trenches, and wherein each of the first alternating stacks comprises a respective first staircase region in which a lateral extent of the first electrically conductive layers along the first horizontal direction decreases with a vertical distance from the substrate; trench fill structures located between and contacting a respective neighboring pair of the first alternating stacks and filling a respective one of the line trenches; arrays of memory stack structures vertically extending through a respective one of the first alternating stacks, wherein each of the memory stack structures comprises a respective vertical stack of memory elements located at levels of the first electrically conductive layers; first retro-stepped dielectric material portions overlying a first staircase region of a respective one of the first alternating stacks, wherein one of the first retro-stepped dielectric material portions has a vertical cross-sectional profile within a vertical plane that is perpendicular to the first horizontal direction in which: a first boundary of the one of the first retro-stepped dielectric material portions continuously extends from a first horizontal plane including a bottommost surface of the one of first retro-stepped dielectric material portions to a second horizontal plane including topmost surfaces of the first alternating stacks; and a second boundary of the one of the first retro-stepped dielectric material portions continuously extends from the first horizontal plane to a first point on a sidewall of a respective one of the trench fill structures, the first point being located at a height located between the first horizontal plane and the second horizontal plane.

According to another aspect of the present disclosure, a method of forming a three-dimensional memory device is provided. The method comprises: forming a vertically alternating sequence of unit layer stacks over a substrate, wherein each of the unit layer stacks comprises a first insulating layer and a first spacer material layer, wherein the first spacer material layers are formed as, or are subsequently replaced with, first electrically conductive layers; forming a 2×N array of stepped surfaces within an upper region of the vertically alternating sequence by patterning a subset of the unit layer stacks, wherein N stepped surfaces are arranged in each row extending along a first horizontal direction within the 2×N array and two stepped surfaces are arranged in each column extending along a second horizontal direction within the 2×N array, and wherein N is an integer greater than 1; vertically extending each column of stepped surfaces other than one column of stepped surfaces by performing a set of processing sequences at least once, wherein the set of processing sequences comprises forming a patterned etch mask layer and etching an unmasked subset of the 2×N array employing a respective anisotropic etch process, wherein one or more patterned etch mask layer employed within the set of processing steps has a respective continuous opening including an entire area of a respective 2×M array of stepped surfaces that is a subset of the 2×N array of stepped surfaces, and wherein each M is an integer less than N; and forming vertical stacks of memory elements through the vertically alternating sequence.

BRIEF DESCRIPTION OF THE DRAWINGS

FIG. 2 is a vertical cross-sectional view of an exemplary structure for forming a semiconductor die after formation of optional semiconductor devices, optional lower level dielectric layers, optional lower metal interconnect structures, a semiconductor material layer, and a first vertically alternating sequence of first continuous insulating layers and first continuous sacrificial material layers according to an embodiment of the present disclosure.

FIG. 9E is a vertical cross-sectional view of the exemplary structure along a vertical plane E-E' of FIG. 9A.

FIGS. 17A-17D illustrate sequential vertical cross-sectional views of a memory opening during formation of a memory opening fill structure according to an embodiment of the present disclosure.

DETAILED DESCRIPTION

Figure 1A:
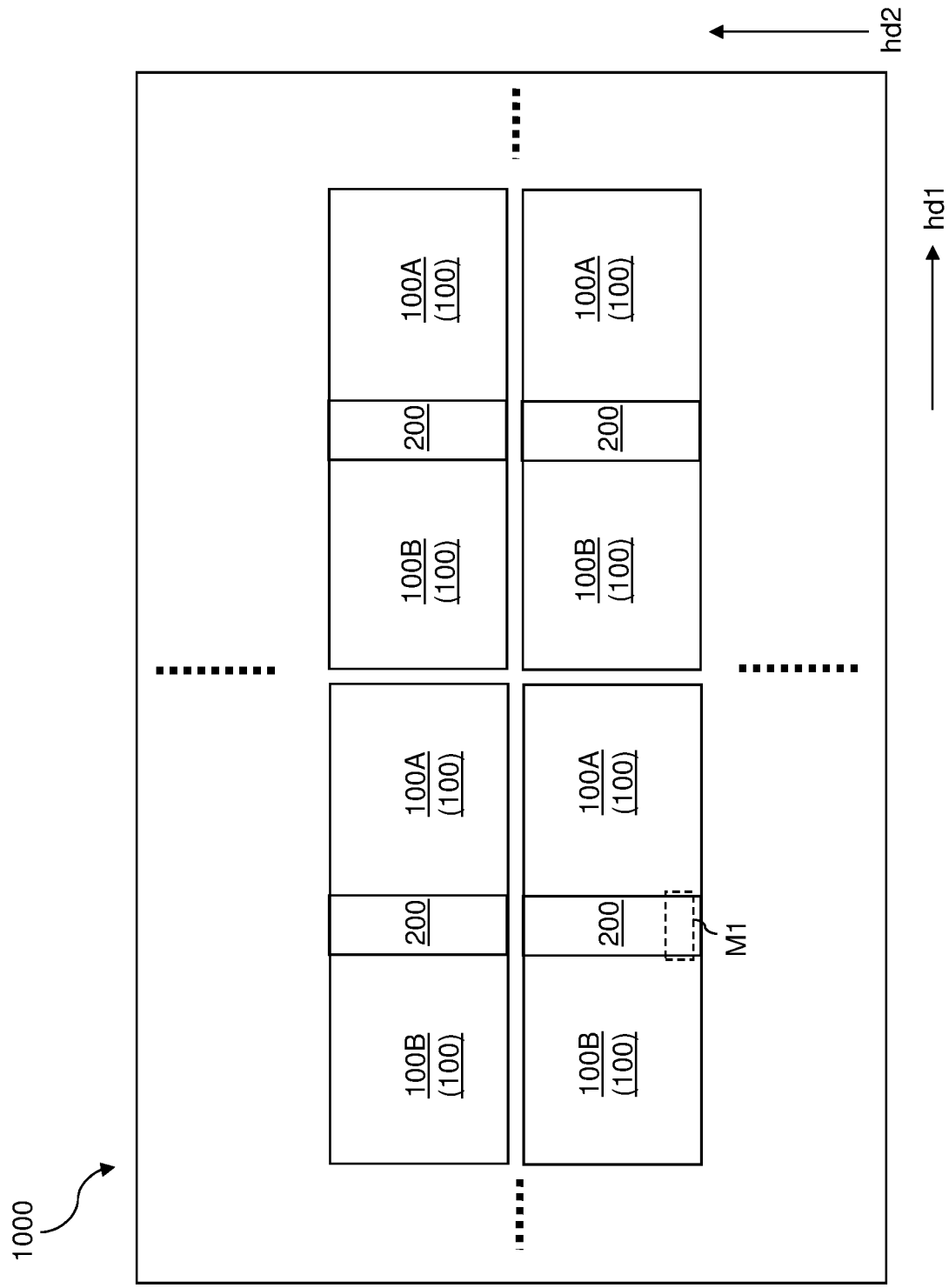
FIG. 1A is a plan view of an exemplary semiconductor die including multiple three-dimensional memory array regions according to an embodiment of the present disclosure.
Figure 1B:
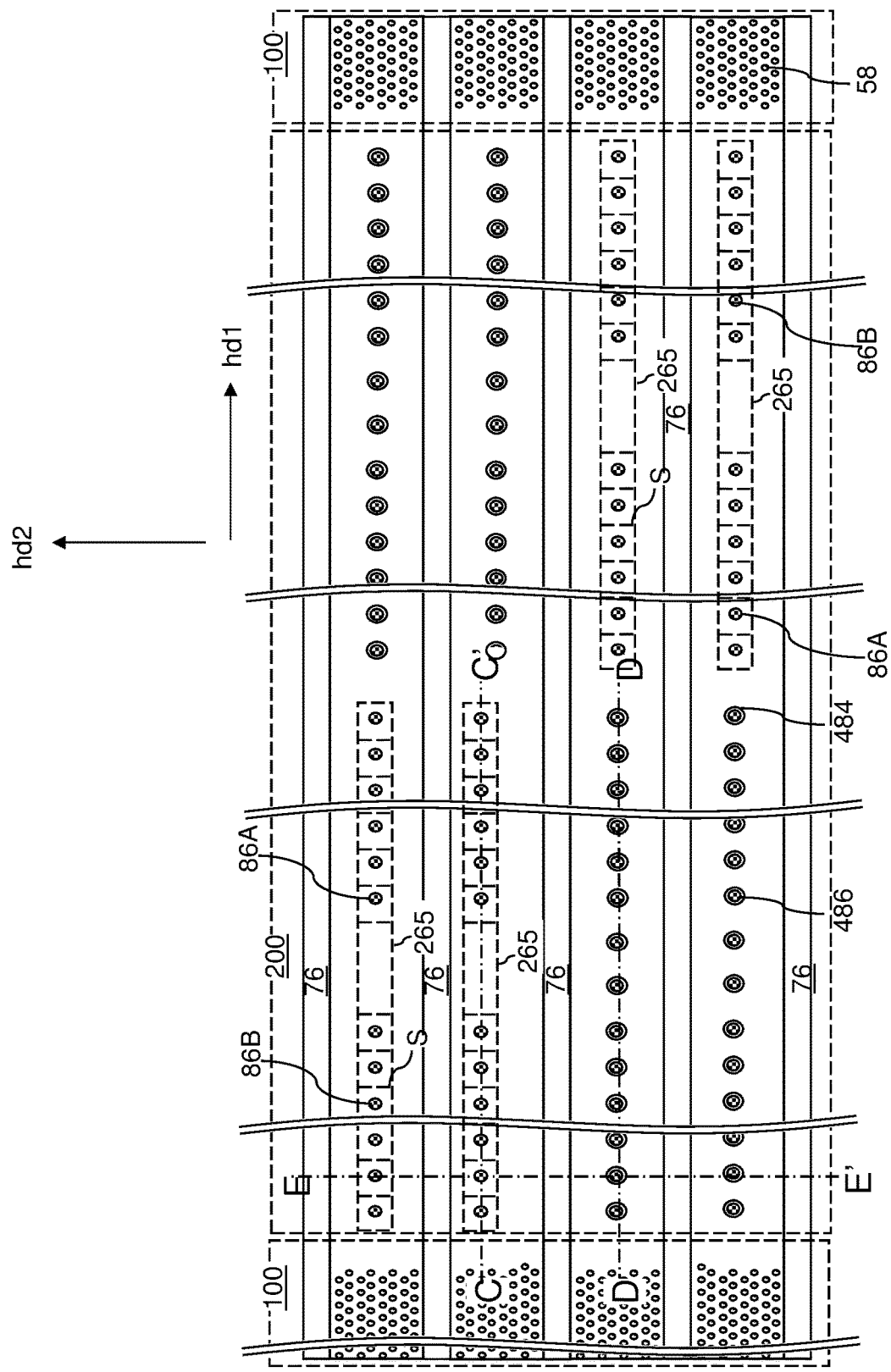
FIG. 1B is a schematic see-through top-down view of region M1 of FIG. 1A.
Figure 1C:
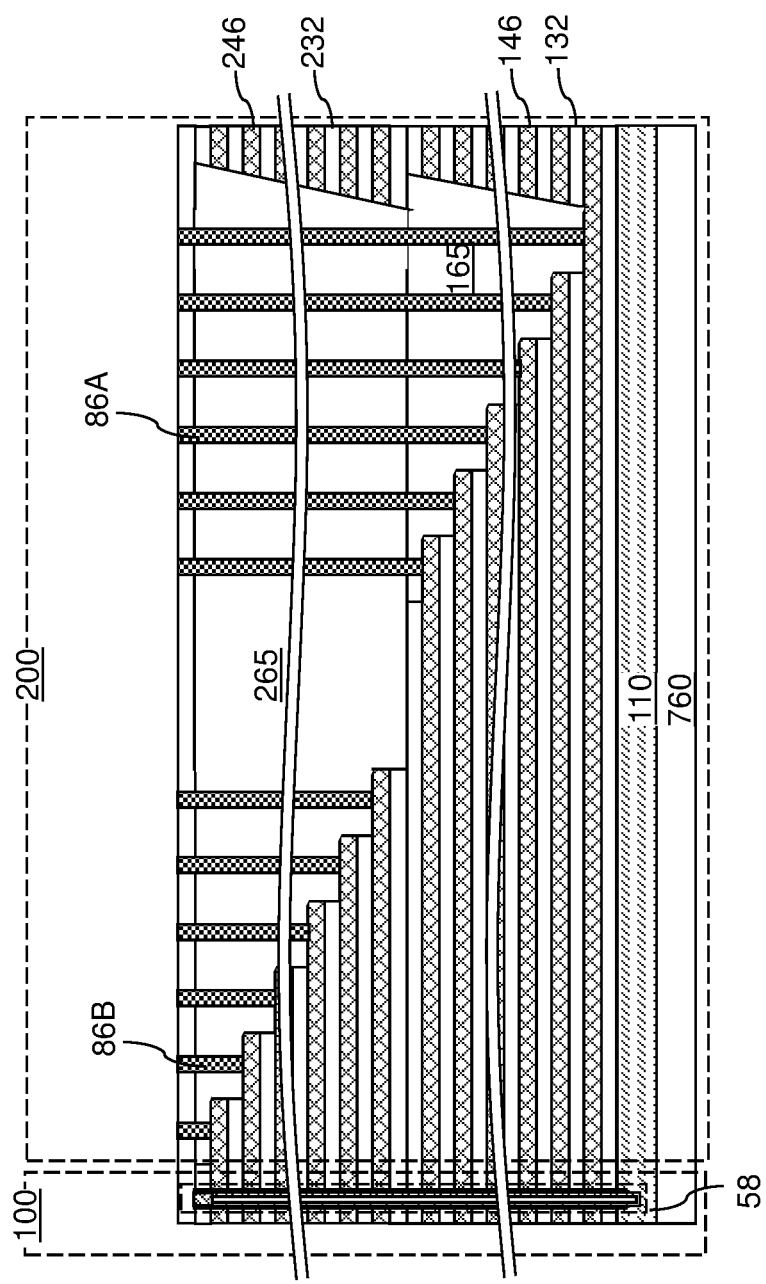
FIG. 1C is a schematic vertical cross-sectional view of a region of the exemplary semiconductor die along the vertical plane C-C' of FIG. 1B.
Figure 1D:
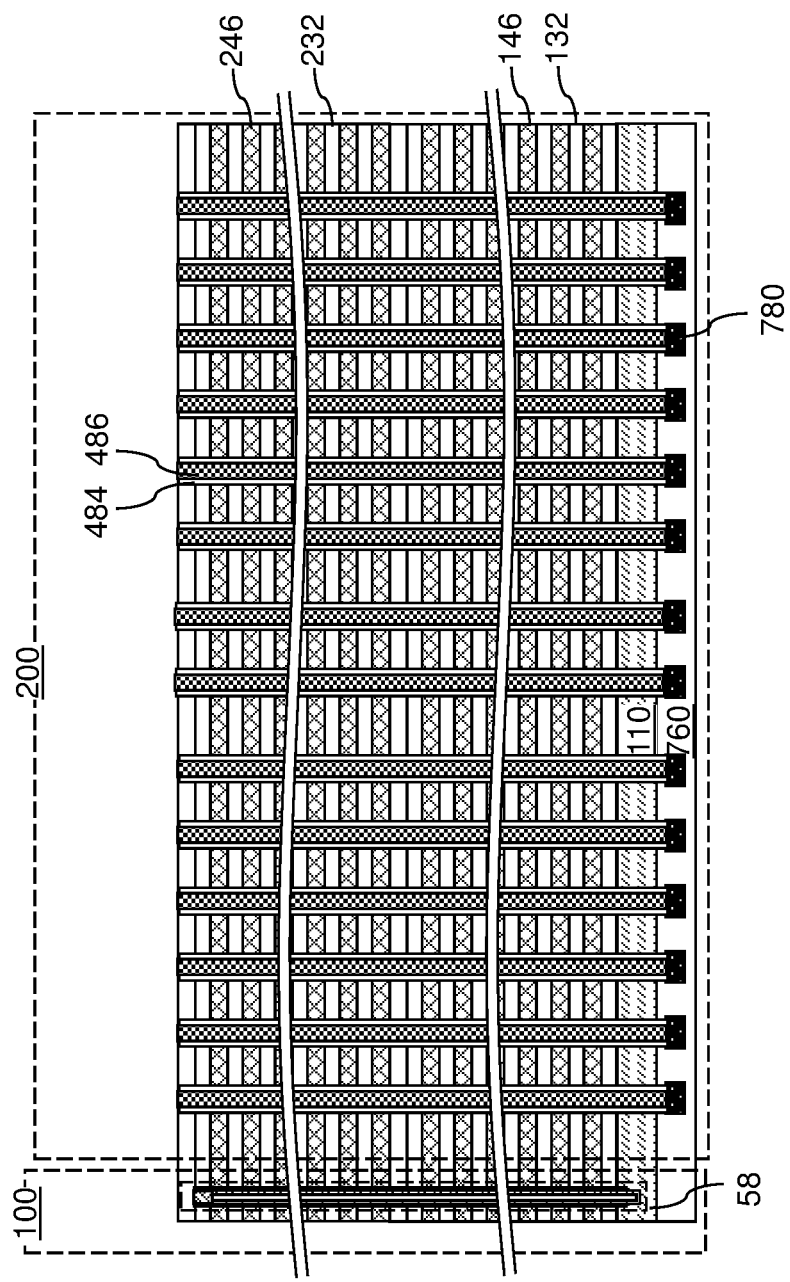
FIG. 1D is a schematic vertical cross-sectional view of a region of the exemplary semiconductor die along the vertical plane D-D' of FIG. 1B.

As discussed above, an embodiments of the present disclosure are directed to a three-dimensional memory device including a hybrid staircase structure and methods of forming the same, the various aspects of which are now described in detail. As used herein, a "hybrid" staircase structure refers a staircase structure in which two sets of stepped surfaces of a neighboring pair of insulating layers and electrically conductive layers are neither fully connected to each other nor are fully separated from each other during a formation process, but are connected in upper regions and are disconnected in lower regions.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or from each other, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to $1.0$ S/m in the absence of electrical dopants therein, and is capable of producing a doped material having electrical conductivity in a range from $1.0$ S/m to $1.0 \times 10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device.

The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIGS. 1A-1E, an exemplary semiconductor die 1000 according to an embodiment of the present disclosure is illustrated. The exemplary semiconductor die 1000 includes multiple three-dimensional memory array regions and multiple inter-array regions. The exemplary semiconductor die 1000 can include multiple planes, each of which includes two memory array regions 100, such as a first memory array region 100A and a second memory array region 100B that are laterally spaced apart by a respective inter-array region 200. Generally, a semiconductor die 1000 may include a single plane or multiple planes. The total number of planes in the semiconductor die 1000 may be selected based on performance requirements on the semiconductor die 1000. A pair of memory array regions 100 in a plane may be laterally spaced apart along a first horizontal direction hd1 (which may be the word line direction). A second horizontal direction hd2 (which may be the bit line direction) can be perpendicular to the first horizontal direction hd1.

Each memory array region 100 includes first-tier alternating stacks of first insulating layers 132 and first electrically conductive layers 146 (which function as first word lines) and second-tier alternating stacks of second insulating layers 232 and second electrically conductive layers 246 (which function as second word lines). Each second-tier alternating stack (232, 246) overlies a respective first-tier alternating stack (132, 146), and each first-tier alternating stack (132, 146) underlies a respective second-tier alternating stack (232, 246). Each combination of a first-tier alternating stack (132, 146) and an overlying second-tier alternating stack (232, 246) may be laterally spaced apart from neighboring combinations of a respective first-tier alternating stack (132, 146) and a respective second-tier alternating stack (232, 246) by trench fill structures 76 that laterally extend along the first horizontal direction hd1.

The exemplary structure can include an optional semiconductor material layer 110 that includes a single crystalline or polycrystalline semiconductor material, such as single crystalline silicon or polysilicon. In one embodiment, the semiconductor material layer 110 may be a substrate. Optionally, underlying dielectric material layers may be provided underneath the semiconductor material layer 110. In this case, the underlying dielectric material layers are referred to as lower-level dielectric material layers 760.

A first-tier alternating stack of first insulating layers 132 and first electrically conductive layers 146 is located over a substrate (which may include the semiconductor material layer 110 or another structure, such as a silicon wafer that underlies the semiconductor material layer 110) between each neighboring pair of trench fill structures 76. A first-tier retro-stepped dielectric material portion 165 overlies, and contacts, first stepped surfaces of the first-tier alternating stack (132, 146). A second-tier alternating stack of second insulating layers 232 and second electrically conductive layers 246 overlies the first-tier alternating stack (132, 146), and overlies a horizontal plane including a planar top surface of the first-tier retro-stepped dielectric material portion 165 between each neighboring pair of trench fill structures 76. A second-tier retro-stepped dielectric material portion 265 overlies, and contacts, second stepped surfaces of the second-tier alternating stack (232, 246). Vertical steps S of the first stepped surfaces and the second stepped surfaces laterally extend along the second horizontal direction hd2 (e.g., bit line direction).

Memory opening fill structures 58 can be located within each memory array region 100 (which includes a first memory array region 100A and a second memory array region 100B) between each neighboring pair of trench fill structures 76. The memory opening fill structures 58 can be located within memory openings that vertically extend through each layer within the first-tier alternating stack (132, 146) and the second-tier alternating stack (232, 246) that are located between a respective neighboring pair of trench fill structures 76.

Each memory opening fill structure 58 includes a respective memory stack structure, which includes a respective memory film and a respective vertical semiconductor channel. The memory openings and the memory opening fill structures 58 are formed in region in which each layer of a first-tier alternating stack and each layer of the second-tier alternating stack are present. For each area within which a continuous combination of a first-tier alternating stack (132, 146) and a second-tier alternating stack (232, 246) continuously laterally extends, first memory stack structures can be located within a respective first memory array region 100A and second memory stack structures can be located within a respective second memory array region 100B. The second memory array region 100B can be connected to the first memory array region 100A through a respective inter-array region 200, in which a first-tier retro-stepped dielectric material portion 165 and a second-tier retro-stepped dielectric material portion 265 are located.

A first-tier retro-stepped dielectric material portion 165 can be located between each neighboring pair of trench fill structures 76. Each first-tier retro-stepped dielectric material portion 165 overlies first stepped surfaces of a respective first-tier alternating stack (132, 146). Each first-tier retro-stepped dielectric material portion 165 can have a sidewall that laterally extends along the first horizontal direction hd1 and contacts a respective trench fill structure 76. The first stepped surfaces comprise vertical steps of the first-tier alternating stack (132, 146) that are laterally spaced apart along the first horizontal direction hd1 and vertically offset from each other.

A second-tier retro-stepped dielectric material portion 265 can be located between each neighboring pair of trench fill structures 76. Each second-tier retro-stepped dielectric material portion 265 overlies second stepped surfaces of a respective second-tier alternating stack (232, 246). Each second-tier retro-stepped dielectric material portion 265 can have a sidewall that laterally extends along the second horizontal direction hd1 and contacts a respective trench fill structure 76. The second stepped surfaces comprise vertical steps of the second-tier alternating stack (232, 246) that are laterally spaced apart along the first horizontal direction hd1 and vertically offset from each other. In one embodiment, each second-tier retro-stepped dielectric material portion 265 overlies, and contacts, a respective one of the first-tier retro-stepped dielectric material portions 165.

Backside trenches can laterally extend along the first horizontal direction hd1. Each backside trench can be filled with a trench fill structure 76, which may include a combination of a backside contact via structure and an insulating spacer that laterally surround the backside contact via structure. Alternatively, each trench fill structure 76 may consist of an insulating fill structure. Each contiguous combination of a first-tier alternating stack (132, 146) and an overlying second-tier alternating stack (232, 246) can be located between a neighboring pair of trench fill structure 76.

For each contiguous combination of a first-tier alternating stack (132, 146) and an overlying second-tier alternating stack (232, 246), a respective first trench fill structure 76 laterally extends along the first horizontal direction hd1 (e.g., word line direction) and contacts first sidewalls of the first-tier alternating stack (132, 146) and first sidewalls of the second-tier alternating stack (232, 246), and a second trench fill structure 76 laterally extends along the first horizontal direction hd1 and contacts second sidewalls of the first-tier alternating stack (132, 146) and second sidewalls of the second-tier alternating stack (232, 246). The first trench fill structure 76 can contact each layer within the first-tier alternating stack (132, 146) and the second-tier alternating stack (232, 246), and can contact a sidewall of the first-tier retro-stepped dielectric material portion 165. The second trench fill structure 76 can contact each layer within the first-tier alternating stack (132, 146) and the second-tier alternating stack (232, 246), and can be laterally spaced from the first-tier retro-stepped dielectric material portion 165.

A contact-level dielectric layer 280 can be provided over each second-tier alternating stack (232, 246). In one embodiment, first contact via structures 86A vertically extend through a second retro-stepped dielectric material portion 265 and a first-tier retro-stepped dielectric material portion 165, and contact a respective one of the first electrically conductive layers 146. Second contact via structures 86B vertically extend through a second-tier retro-stepped dielectric material portion 265 and contact a respective one of the second electrically conductive layers 246.

For each contiguous combination of a first-tier alternating stack (132, 146) and an overlying second-tier alternating stack (232, 246), a second-tier retro-stepped dielectric material portion 265 overlies second stepped surfaces of the second-tier alternating stack (232, 246), and second contact via structures 86B vertically extend through the second-tier retro-stepped dielectric material portion 265 and contact a respective one of the second electrically conductive layers 246.

For each contiguous combination of a first-tier alternating stack (132, 146) and an overlying second-tier alternating stack (232, 246), first memory opening fill structures 58 can be located within a first memory array region 100A in which each layer of the first-tier alternating stack and each layer of the second-tier alternating stack are present. Second memory opening fill structures 58 can be located within a second memory array region 100B that is laterally offset along the first horizontal direction hd1 from the first memory array region 100A by the first-tier retro-stepped dielectric material portion 165 and the second-tier retro-stepped dielectric material portion 265. Each layer of the first-tier alternating stack (132, 146) and each layer of the second-tier alternating stack (232, 246) are present within the second memory array region 100B. At least a portion of the first electrically conductive layers 146 and at least a portion of the second electrically conductive layers 246 continuously extend from the first memory array region 100A to the second memory array region 100B through a strip-shaped connection region within an inter-array region 200 located between a trench fill structures 76 and the second-tier retro-stepped dielectric material portion 265 at the level of the second-tier alternating stack (232, 246), and between the trench fill structure 76 and the first-tier retro-stepped dielectric material portion 165 at the level of the first-tier alternating stack (132, 146).

Each combination of a first-tier alternating stack (132, 146) and an overlying second-tier alternating stack (232, 246) can be located between a respective neighboring pair of trench fill structures 76. Thus, for each combination of a first-tier alternating stack (132, 146) and an overlying second-tier alternating stack (232, 246), a neighboring combination of an additional first-tier alternating stack (132, 146) and an additional second-tier alternating stack (232, 246) may be provided. A structure that is adjacent to each combination of a first-tier alternating stack (132, 146) and an overlying second-tier alternating stack (232, 246) can include an additional first-tier alternating stack of additional first insulating layers 132 and additional first electrically conductive layers 146 located over the substrate, an additional first-tier retro-stepped dielectric material portion 165 overlying additional first stepped surfaces of the additional first-tier alternating stack (132, 146), an additional second-tier alternating stack of additional second insulating layers 232 and additional second electrically conductive layers 246, additional memory opening fill structures 58 located within an additional memory array region 100B and vertically extending through each layer within the additional first-tier alternating stack (132, 146) and the additional second-tier alternating stack (232, 246), an additional second-tier retro-stepped dielectric material portion 265 overlying additional second stepped surfaces of the additional second-tier alternating stack (232, 246), and a trench fill structure 76 laterally extending along the first horizontal direction hd1 and contacting sidewalls of the first-tier alternating stack (132, 146), sidewalls of the second-tier alternating stack (232, 246), sidewalls of the additional first-tier alternating stack (132, 146), and sidewalls of the additional second-tier alternating stack (232, 246). The additional second-tier alternating stack (232, 246) overlies the additional first-tier alternating stack (132, 146) and overlies a horizontal plane including the planar top surface of the first-tier retro-stepped dielectric material portion 165.

Staircases including the first stepped surfaces and the second stepped surfaces of combinations of a first-tier alternating stack (132, 146) and an overlying second-tier alternating stack (232, 246) can rise from the substrate along the first horizontal direction hd1, or along the opposite direction of the first horizontal direction hd1. In one embodiment, the direction of rise of the staircases can change for every other pair of combinations of a respective first-tier alternating stack (132, 146) and a respective second-tier alternating stack (232, 246). In other words, the direction of rise is staggered in adjacent alternating stacks that are separated along the second horizontal direction. For example, upon sequentially numbering each combination of a respective first-tier alternating stack (132, 146) and a respective second-tier alternating stack (232, 246) with positive integers N starting with 1, each (4N+1)-th combination and each (4N+2)-th combination of a respective first-tier alternating stack (132, 146) and a respective second-tier alternating stack (232, 246) can have stairs that rise along the first horizontal direction hd1, and each (4N+3)-th combination and each (4N+4)-th combination of a respective first-tier alternating stack (132, 146) and a respective second-tier alternating stack (232, 246) can have stairs that rise along the opposite direction of the first horizontal direction hd1. In this embodiment, a vertical distance between the first stepped surfaces and the substrate increases along the first horizontal direction hd1, a vertical distance between the second stepped surfaces and the substrate increases along the first horizontal direction hd1, a vertical distance between the additional first stepped surfaces and the substrate decreases along the first horizontal direction hd1, and a vertical distance between the additional second stepped surfaces and the substrate decreases along the first horizontal direction hd1.

In an alternative embodiment, the direction of rise of the staircases does not change for every other pair of combinations of a respective first-tier alternating stack (132, 146) and a respective second-tier alternating stack (232, 246). In other words, the direction of rise is the same (i.e., non-staggered) in adjacent alternating stacks that are separated along the second horizontal direction.

The inter-array region 200 includes strips of the first insulating layers 132, the first electrically conductive layers 146, the second insulating layers 232, and the second electrically conductive layers 246 between each laterally neighboring pair of trench fill structures 76. The strip have a narrower width along the second horizontal direction hd2 than portions of the alternating stacks (132, 146, 232, 246) located in the memory array regions 100, and can be located adjacent to a respective first-tier retro-stepped dielectric material portion 165 and a respective second-tier retro-stepped dielectric material portion 265. Each layer within the first-tier alternating stack (132, 146) and the second-tier alternating stack (232. 246) comprises a respective strip portion located within the inter-array region 200 and laterally extending continuously from the first memory array region 100A to the second memory array region 100B. Thus, each strip of the first insulating layers 132, the first electrically conductive layers 146, the second insulating layers 232, and the second electrically conductive layers 246 can continuously extend from the first memory array region 100A to the second memory array region 100B.

Figure 1E:
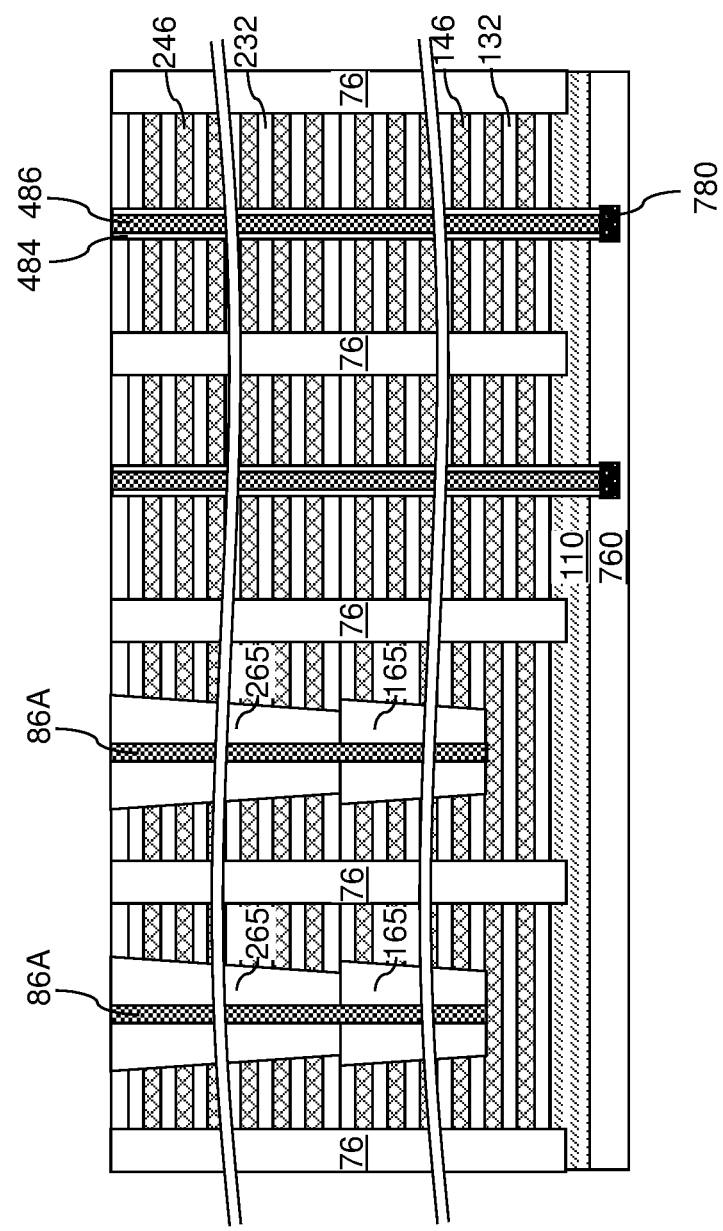
FIG. 1E is a schematic vertical cross-sectional view of a region of the exemplary semiconductor die along the vertical plane E-E' of FIG. 1B.

Laterally-isolated vertical interconnection structures (484, 486) can be formed through the inter-array region 200. Each laterally-isolated vertical interconnection structure (484, 486) can include a through-memory-level conductive via structure 486 and a tubular insulating spacer 484 that laterally surrounds the conductive via structure 486. Each through-memory-level conductive via structure 486 can contact a lower-level metal interconnect structure 780 located in the lower-level dielectric material layers 760, as shown in FIG. 1E. The lower-level metal interconnect structures 780 can be embedded in the lower-level dielectric material layers 760, which are located between the first-tier alternating stack (132, 146) and a substrate (not shown) that can be provided underneath the lower-level dielectric material layers 760. The laterally-isolated vertical interconnection structures (484, 486) vertically extend through the strip portions of the first-tier alternating stack (132, 146) and the second-tier alternating stack (232, 246), and contact a respective one of the lower-level metal interconnect structures 780.

Drain contact via structures (not illustrated) can extend through the contact-level dielectric layer 280, and can contact an upper portion of a respective memory opening fill structure 58 (such as a drain region within the respective memory opening fill structure 58). Bit lines (not illustrated) can laterally extend along the second horizontal direction hd2, and can contact top surfaces of a respective subset of the drain contact via structures. Additional metal interconnect structures embedded in overlying dielectric material layers (not shown) may be employed to provide electrical connection among the various nodes of the three-dimensional memory device located in the semiconductor die 1000.

According to an aspect of the present disclosure, upon sequentially numbering the trench fill structures 76 along the second horizontal direction with positive integers such that each odd-numbered trench fill structure 76 contacts a respective pair of first retro-stepped dielectric material portions 165 (and a respective pair of second retro-stepped dielectric material portions 265), and each even-numbered trench fill structure 76 does not contact any of the first retro-stepped dielectric material portions 165 (or any of the second retro-stepped dielectric material portions 265).

Each trench fill structure 76 includes an insulating material portion that contacts sidewalls of a neighboring pair of alternating stacks (132, 146, 232, 246). In one embodiment, each insulating material portion may comprise as an insulating spacer that laterally surrounds a contact via structure such as a backside contact via structure (not expressly shown) or a dielectric wall structure that does not laterally surrounded a contact via structure. In one embodiment, each sidewall of the first alternating stacks (132, 146) can be contacted by a sidewall of an insulating material portion of a respective one of the trench fill structures 76.

The exemplary semiconductor die 1000 of FIGS. 1A-1E can be manufactured employing a sequence of processing steps. Referring to FIG. 2, an exemplary structure for formation of the structure of FIGS. 1A-1E is illustrated in a vertical cross sectional view along the first horizontal direction hd1 (e.g., the word line direction) according to an embodiment of the present disclosure. The structure shown in FIG. 2 is provided after formation of semiconductor devices 720 on a substrate semiconductor layer 9 (which is provided at least within an upper portion of a substrate 8), lower level dielectric layers 760, lower-level metal interconnect structures 780 (schematically represented by a dotted area including physical implementations of the lower level metal interconnect structures) that are embedded in the lower-level dielectric layers 760, a semiconductor material layer 110, and a first vertically alternating sequence of first continuous insulating layers 132L and first continuous sacrificial material layers 142L. The substrate semiconductor layer 9 may comprise a top portion (e.g., a doped well) of a substrate 8, such as silicon wafer, or a semiconductor layer located over a substrate, such as a silicon on insulator substrate or a semiconductor substrate. The semiconductor devices 720 may include field effect transistors that are formed over a top surface of the substrate 8. The lower-level dielectric layers 760 may be interconnect-level dielectric material layers that embed the lower-level metal interconnect structures 780.

As used herein, a vertically alternating sequence refers to a sequence of multiple instances of a first element and multiple instances of a second element that is arranged such that an instance of a second element is located between each vertically neighboring pair of instances of the first element, and an instance of a first element is located between each vertically neighboring pair of instances of the second element.

The first continuous insulating layers 132L can be composed of the first material, and the first continuous sacrificial material layers 142L can be composed of the second material, which is different from the first material. Each of the first continuous insulating layers 132L is an insulating layer that continuously extends over the entire area of the substrate 8, and may have a uniform thickness throughout. Each of the first continuous sacrificial material layers 142L includes is a sacrificial material layer that includes a dielectric material and continuously extends over the entire area of the substrate 8, and may have a uniform thickness throughout. Insulating materials that may be used for the first continuous insulating layers 132L include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first continuous insulating layers 132L may be silicon oxide.

The second material of the first continuous sacrificial material layers 142L is a dielectric material, which is a sacrificial material that may be removed selective to the first material of the first continuous insulating layers 132L. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The second material of the first continuous sacrificial material layers 142L may be subsequently replaced with electrically conductive electrodes which may function, for example, as control gate electrodes of a vertical NAND device. In one embodiment, the first continuous sacrificial material layers 142L may be material layers that comprise silicon nitride.

Generally, a vertically alternating sequence of unit layer stacks is located over a substrate. Each of the unit layer stacks comprises a first insulating layer (such as a first continuous insulating layer 132L) and a first spacer material layer (such as a first continuous sacrificial material layer 142L). Generally, the first spacer material layers are formed as, or are subsequently replaced with, first electrically conductive layers. While the present disclosure is described employing an embodiment in which the first spacer material layers are formed as first continuous sacrificial material layers 142L that are subsequently replaced with first electrically conductive layers, embodiments are expressly contemplated herein in which the first spacer material layers are formed as first electrically conductive layers. In such embodiments, steps for replacing the material of the first spacer material layers with an electrically conductive material can be omitted.

Figure 3A:
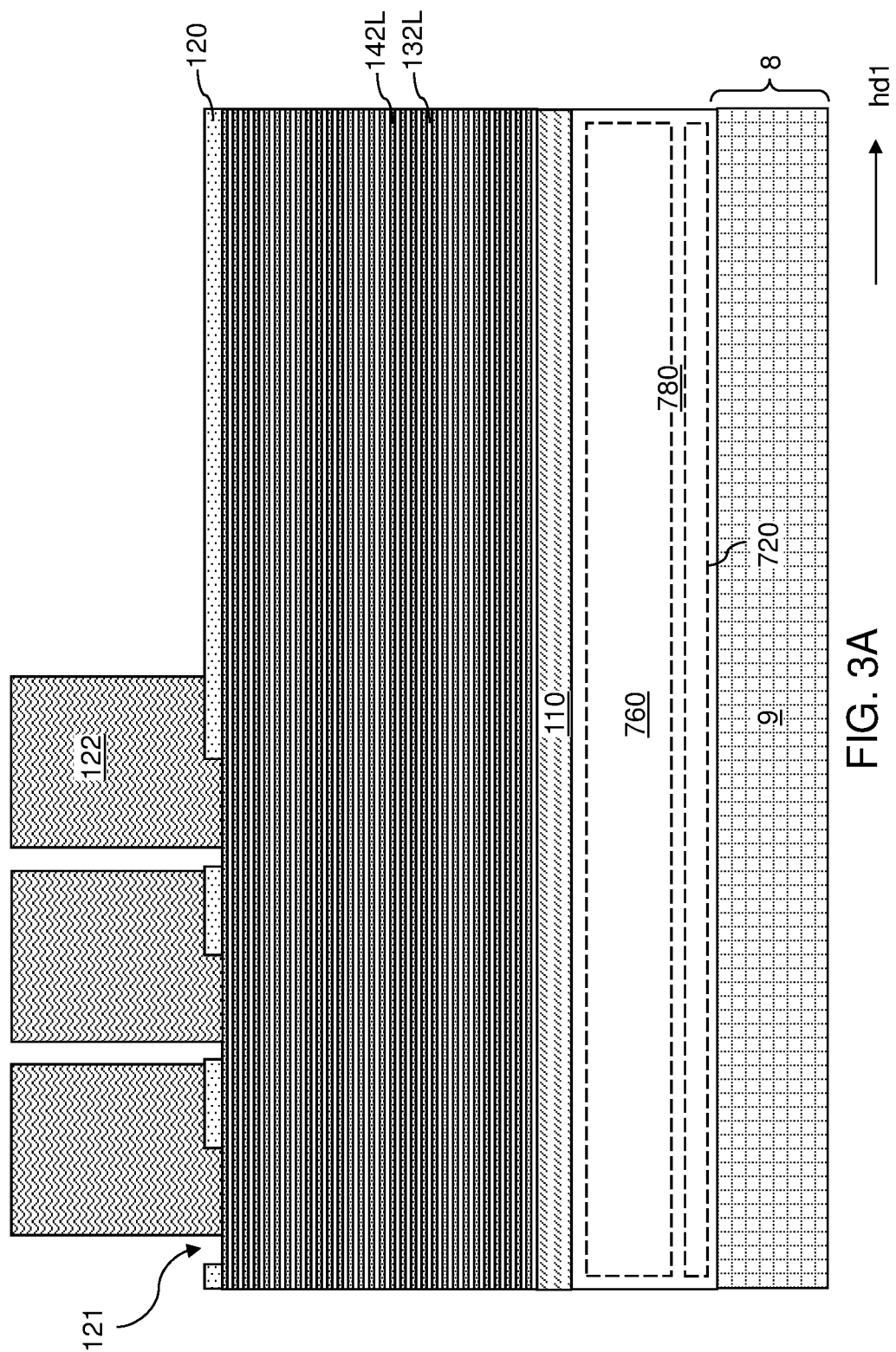
FIG. 3A is a vertical cross-sectional view of the exemplary structure after formation of a hard mask layer and a trimmable etch mask layer in the inter-array region according to an embodiment of the present disclosure.
Figure 3B:
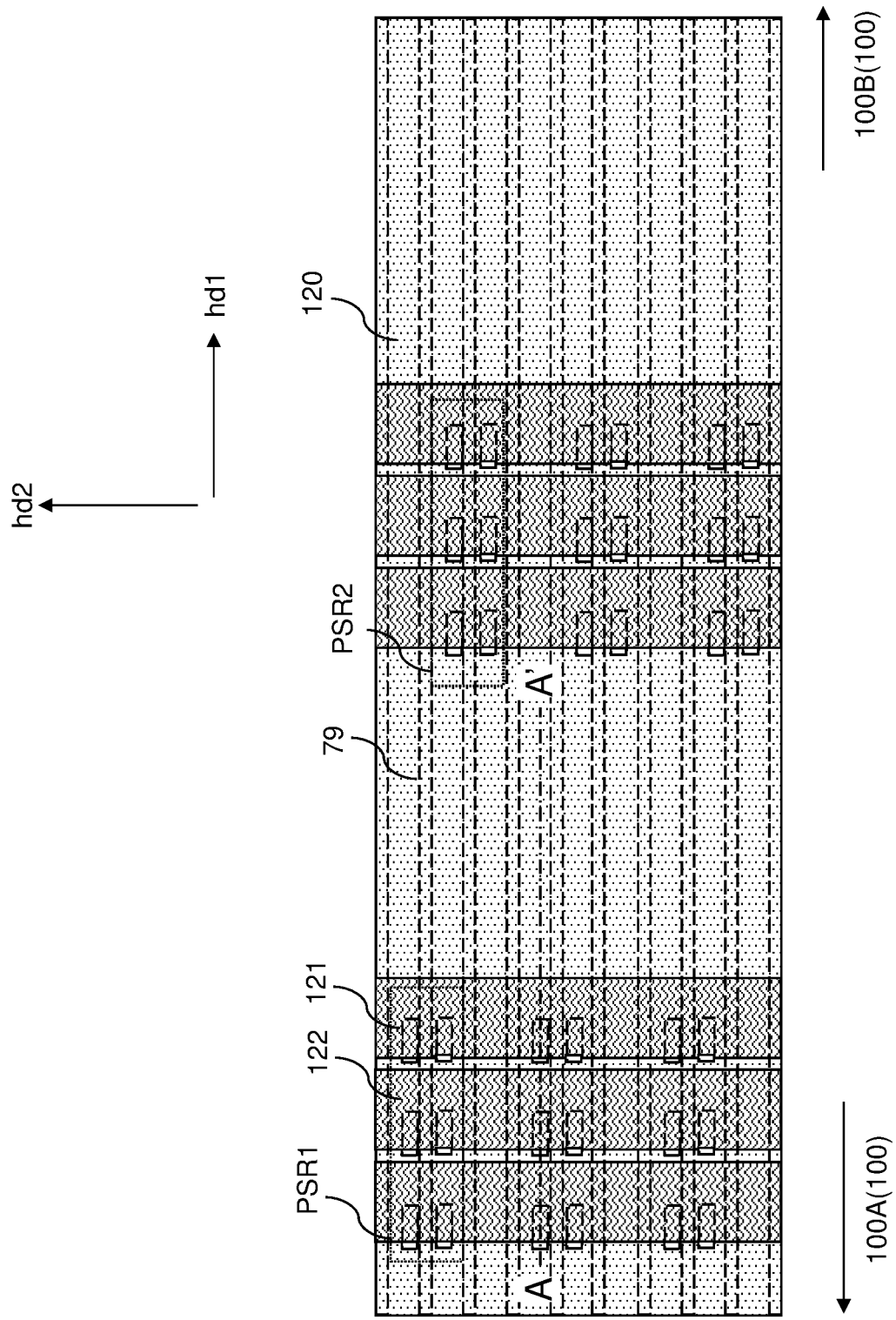
FIG. 3B is a top-down view of the exemplary structure of FIG. 3A. The vertical plane A-A' corresponds to the plane of the vertical cross-sectional view of FIG. 3A.

Referring to FIGS. 3A and 3B, a first hard mask layer 120 can be deposited over the first vertically alternating sequence of first continuous insulating layers 132L and first continuous sacrificial material layers 142L. The first hard mask layer 120 includes a hard mask material that is different from the materials of the first vertically alternating sequence of first continuous insulating layers 132L and first continuous sacrificial material layers 142L. For example, the first hard mask layer 120 may include a metallic material, such as TiN, TaN, or WN, a dielectric metal oxide material, such as amorphous aluminum oxide, a semiconductor material such as silicon, and/or a carbon-based material such as amorphous carbon or diamond-like carbon (DLC).

The first hard mask layer 120 can be patterned to define areas in which stepped surfaces are to be subsequently formed. First openings 121 are formed through the first hard mask layer 120 within each area in which first stepped surfaces are to be subsequently formed. A row of N rectangular openings can be formed within each area located between areas of a neighboring pair of backside trenches 79 that are formed in a subsequent processing step. The areas of the backside trenches 79 can be the same as the areas of the trench fill structures 76 illustrated in FIGS. 1A-1E. The number N may be in a range from 2 to 10, such as from 3 to 6.

According to an aspect of the present disclosure, a pair of rows of N first openings 121 can be arranged as a rectangular 2×N array of first openings 121 through the first hard mask layer 120. Each rectangular 2×N array of first openings 121 forms a cluster of 2N first openings 121. Clusters of 2N first openings 121 can be alternately laterally offset along the first horizontal direction hd1. In other words, upon sequentially numbering each cluster of 2N first openings with a positive integer beginning with 1 from one end of an inter-array region 200 to another end of the inter-array region along the second horizontal direction hd2, each odd-numbered cluster of 2N first openings 121 may be laterally offset toward a first memory array region 100A, and each even-numbered cluster of 2N first openings 121 may be laterally offset toward a second memory array region 100B. Each first opening 121 through the first hard mask layer 120 may be rectangular, and may have a pair of sides that are parallel to the first horizontal direction hd1 and a pair of sides that are parallel to the second horizontal direction hd2. Each row of N first openings 121 within each rectangular 2×N array of first openings 121 may be laterally spaced from the other row of N first openings 121 within the same rectangular 2×N array of first openings 121 along the second horizontal direction hd2 by the area of a respective backside trench 79 to be subsequently formed through the exemplary structure. Each 2×N array of first opening 121 may be laterally spaced from a neighboring 2×N array of first openings 121 by the area of a respective backside trench 79 to be subsequently formed through the exemplary structure.

According to an aspect of the present disclosure, a first trimmable etch mask layer 122 can be applied over the first hard mask layer 120, and can be lithographically patterned to form line-shaped patterns that laterally extend along the second horizontal direction hd2. The first trimmable etch mask layer 122 includes a trimmable etch mask material that can be isotropically recessed at a controlled recess rate, for example, employing a recess etching or ashing process. For example, the first trimmable etch mask layer 122 may include an organic material, such as photoresist. In one embodiment, each patterned portion of the first trimmable etch mask layer 122 can have a respective first lengthwise edge that overlies a peripheral region of a respective first opening in the first hard mask layer 120 and a respective second lengthwise edge that overlies the first hard mask layer 120. In one embodiment, a straight edge of each first opening 121 in the first hard mask layer 120 can underlie a respective patterned portion of the first trimmable etch mask layer 122, and can be located at about the same lateral distance from two straight lengthwise edges of the respective patterned portion of the first trimmable etch mask layer 122.

Figure 4A:
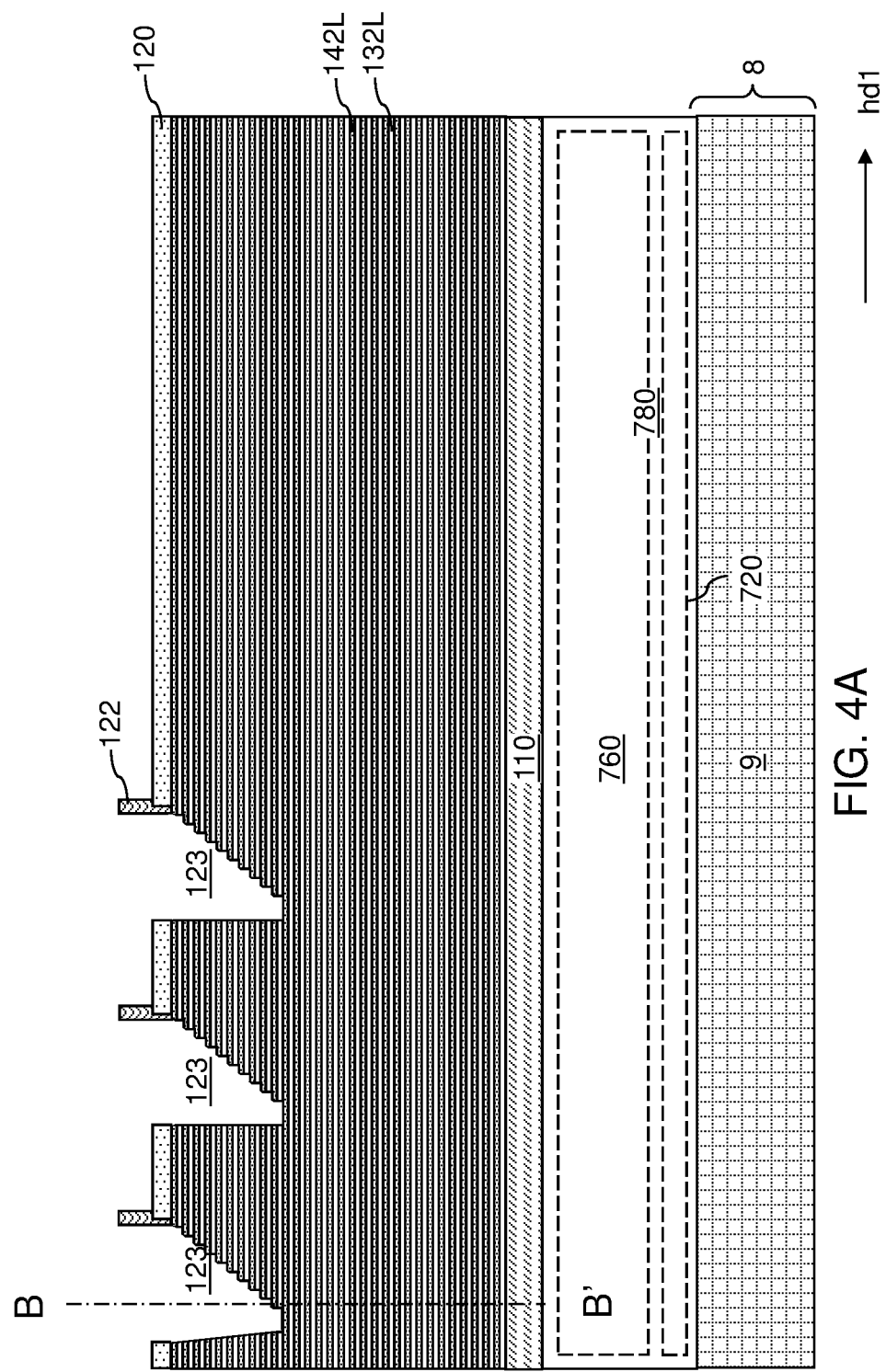
FIG. 4A is a vertical cross-sectional view of the exemplary structure along a first horizontal direction after formation of first stepped surfaces in the inter-array region according to an embodiment of the present disclosure.
Figure 4B:
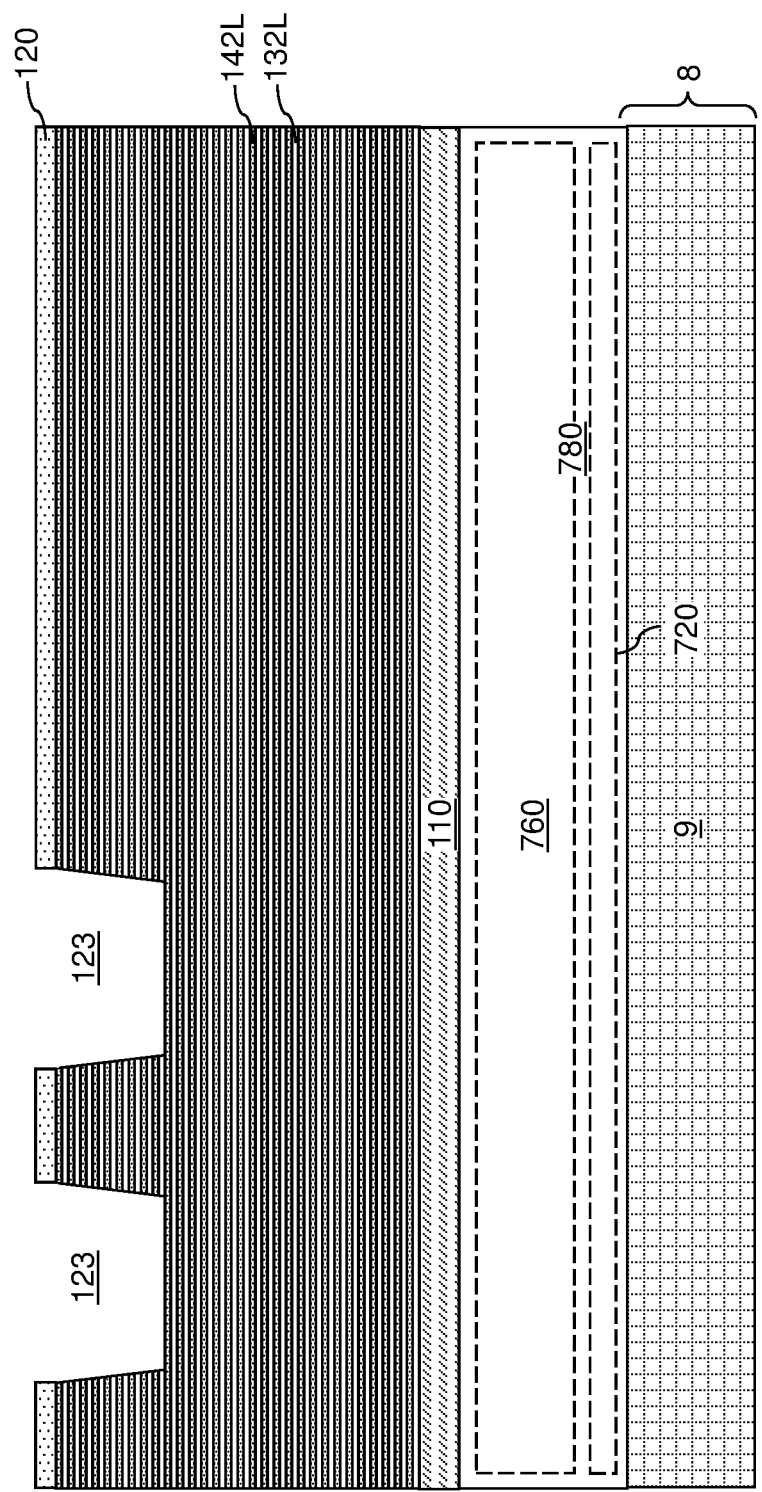
FIG. 4B is a vertical cross-sectional view of the exemplary structure along a vertical plane B-B' of FIG. 4A that laterally extends along a second horizontal direction.

Referring to FIGS. 4A and 4B, sets of first stepped surfaces can be formed within the areas of the first openings 121 in the first hard mask layer 120 by iteratively performing a set of layer patterning processing steps for a number of times that is less than the total number of first continuous sacrificial material layers 142L within the first vertically alternating sequence. One set of first stepped surfaces can be formed within each first opening 121 in the first hard mask layer. In one embodiment, the number of times by which the set of layer patterning processing steps is performed may be in a range from about 20% to 60% of the total number of the first continuous sacrificial material layers 142L (which may be the same as the total number of the first insulating layers 132L and/or the total number of a unit layer stack of a first insulating layer 132L and a first spacer material layer). If the total number of the first continuous sacrificial material layers 142L in the vertically alternating sequence (132L, 142L) is $M_1$, the total number of times (i.e., number of repetitions) by which the set of layer patterning processing steps is repeated may be in a range from 20% to 60%, such as from 25% to 50%, of the number $M_1$. In the illustrative example employed to describe the invention herein, the total number of times by which the set of layer patterning processing steps is repeated is $M_1/3$.

The set of layer patterning processing steps comprises an anisotropic etch process that etches unmasked portions of a pair of a first continuous insulating layer 132L and a first continuous sacrificial material layer 142L, and a mask trimming process in which the first trimmable etch mask layer 122 is isotropically trimmed to provide shifted sidewalls that are shifted by a respective trimming distance. FIGS. 4A and 4B illustrates the exemplary structure after a final anisotropic etch process, which is performed after the last mask trimming process.

A first stepped cavity 123 can be formed within each area of the rectangular opening in the first hard mask layer 120. Each first stepped cavity 123 can include a cliff region in which a tapered sidewall of the first vertically alternating sequence vertically extends from the bottommost patterned layer of the first vertically alternating sequence (132L, 142L) to the topmost layer of the first vertically alternating sequence (132L, 142L). Each first stepped cavity 123 has respective first stepped surfaces as stepped bottom surfaces. Each first stepped cavity 123 has a pair of stepped sidewalls that laterally extend along the first horizontal direction hd1. Each stepped sidewall of the first stepped cavity 123 adjoins the first stepped surfaces at the bottom edge, and extends to the top surface of the topmost layer of the first vertically alternating sequence (132L, 142L) to form a staircase region.

Pairs of staircase regions can be arranged along the second horizontal direction hd2 with an alternating lateral offsets along the first horizontal direction hd1 to provide a staggered configuration for the staircase regions. In other words, upon sequentially numerically labeling pairs of staircase regions with positive integers starting with 1 along the second horizontal direction hd2 (each pair being labeled with a same number), every odd-numbered pair of staircase region (such as a first pair PSR1 of staircase regions) may be closer to the first memory array region 100A than to the second memory array region 100B, and every even-numbered pair of staircase regions (such as a second pair PSR2 of staircase regions) may be closer to the second memory array region 100B than to the first memory array region 100A.

Figure 5A:
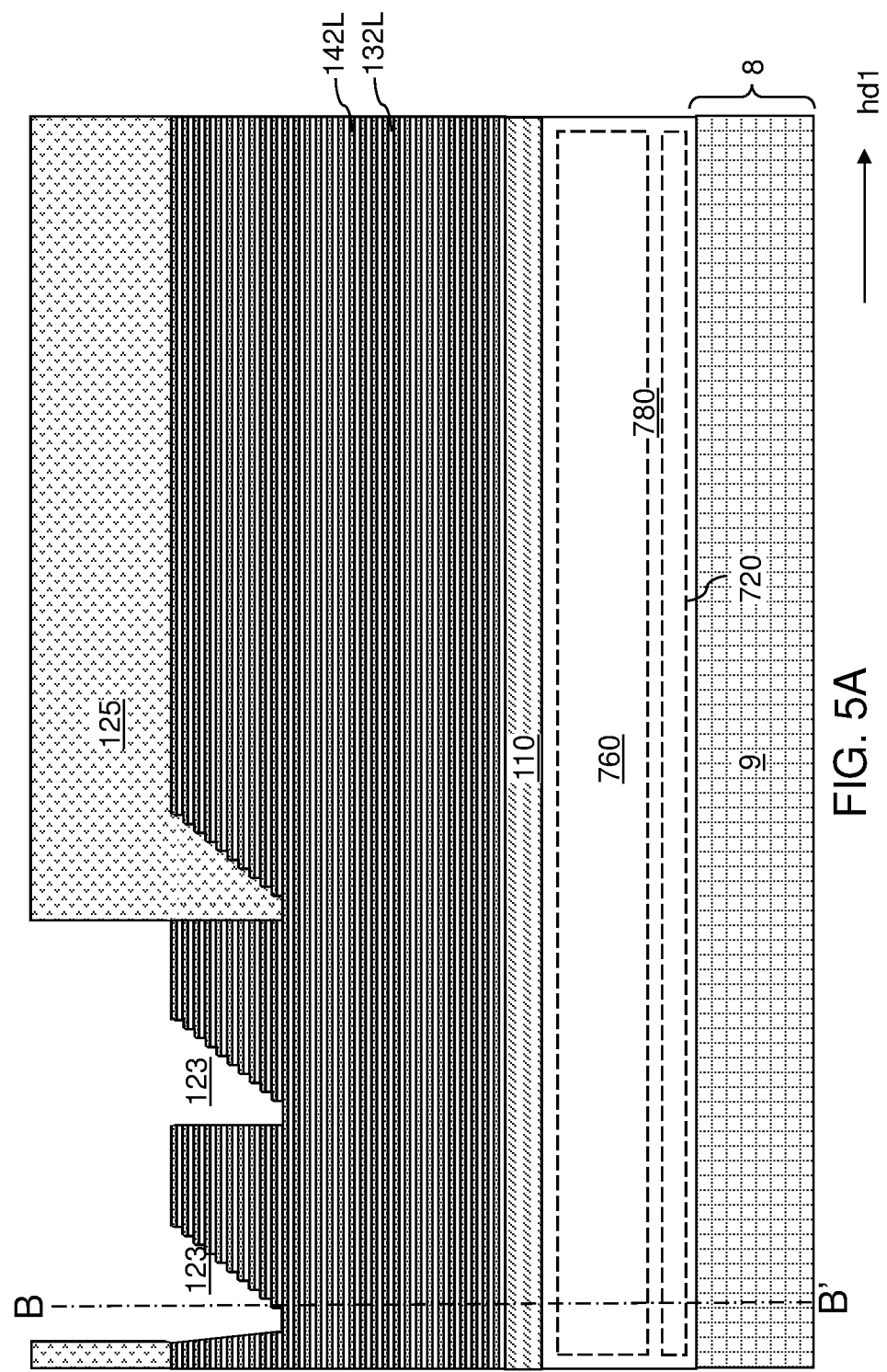
FIG. 5A is a vertical cross-sectional view of the exemplary structure along the first horizontal direction after formation of a first recess etch mask layer according to an embodiment of the present disclosure.
Figure 5B:
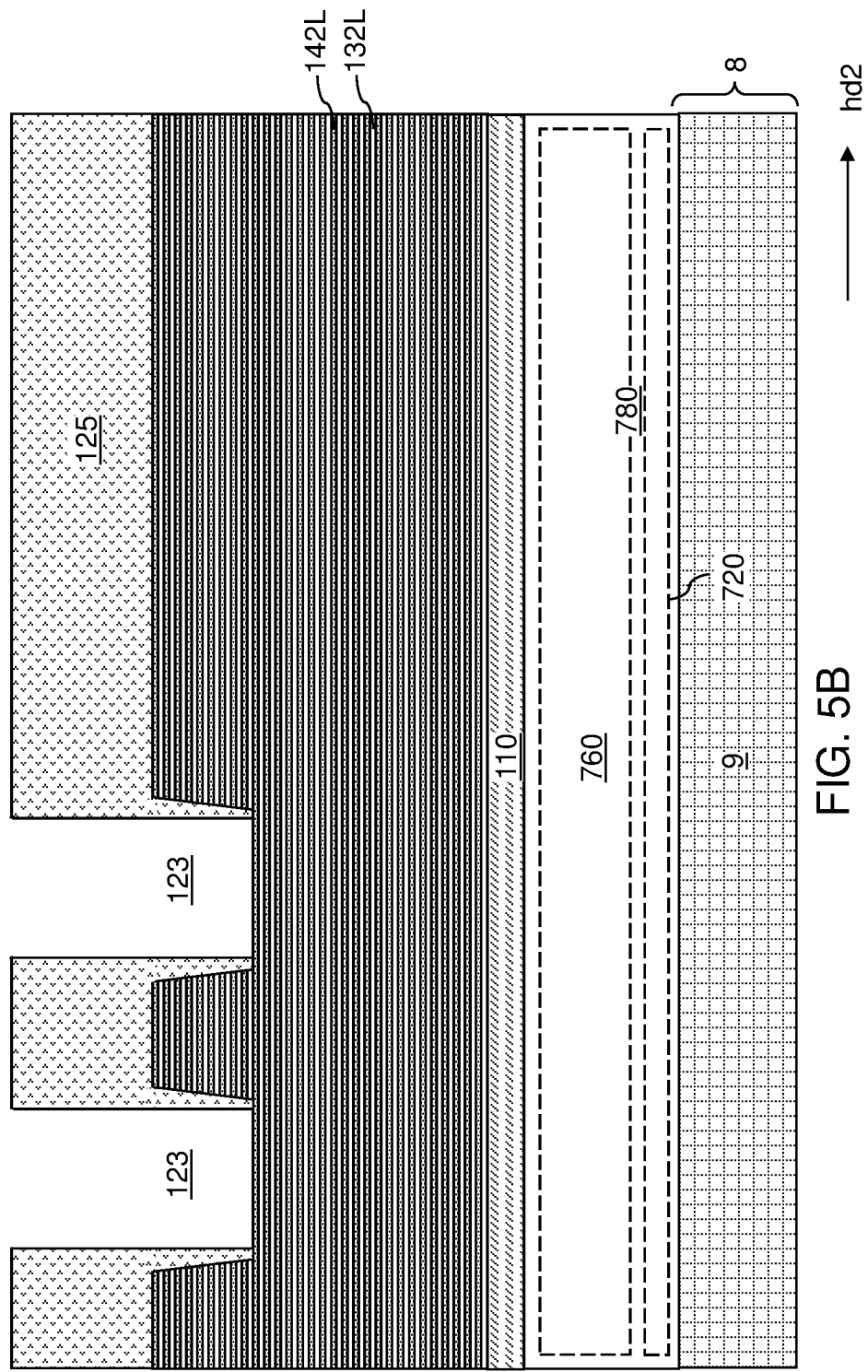
FIG. 5B is a vertical cross-sectional view of the exemplary structure along a vertical plane B-B' of FIG. 5A.

Referring to FIGS. 5A and 5B, the first trimmable etch mask layer 122 can be removed after the final anisotropic etch process, for example, by ashing. The first hard mask layer 120 can be removed selective to the materials of the first vertically alternating sequence (132L, 142L), for example, by an isotropic etch process (such as a wet etch process).

A first recess etch mask layer 125 can be formed over the exemplary structure by applying and lithographically patterning an etch mask material. In one embodiment, the first recess etch mask layer 125 may include a photoresist material that is applied over the exemplary structure, and is subsequently patterned by lithographic exposure and development. The first recess etch mask layer 125 may cover a set of first stepped surfaces within each row of N sets of first stepped surfaces that are arranged along the first horizontal direction hd1, and may include a rectangular opening in which all other sets of first stepped surfaces within the row of N sets of first stepped surfaces are physically exposed. In an illustrative example, if three sets of first stepped surfaces underlying a respective first stepped cavity 123 is present within each cluster of first stepped surfaces, a first set of first stepped surfaces can be covered with the first recess etch mask layer 125 while a second set and a third set of stepped surfaces are physically exposed within an opening in the first recess etch mask layer 125.

According to an aspect of the present disclosure, two disjoined rectangular openings may be formed through the first recess etch mask layer 125 over each 2×N array of first stepped cavities 123. In this case, one first stepped cavity 123 per each row of N first stepped cavities may be covered by the first recess etch mask layer 125. A row of (N−1) first stepped cavities 123 may be physically exposed within a first opening in the first recess etch mask layer 125 within the area of the 2×N array of first stepped cavities 123. Another row of (N−1) first stepped cavities 123 may be physically exposed within a second opening in the first recess etch mask layer 125 within the area of the 2×N array of first stepped cavities 123. A strip of the first recess etch mask layer 125 is present between the two openings (which may be rectangular openings) in the first recess etch mask layer 125 that overlie a respective row of (N−1) first stepped cavities 123.

Figure 6A:
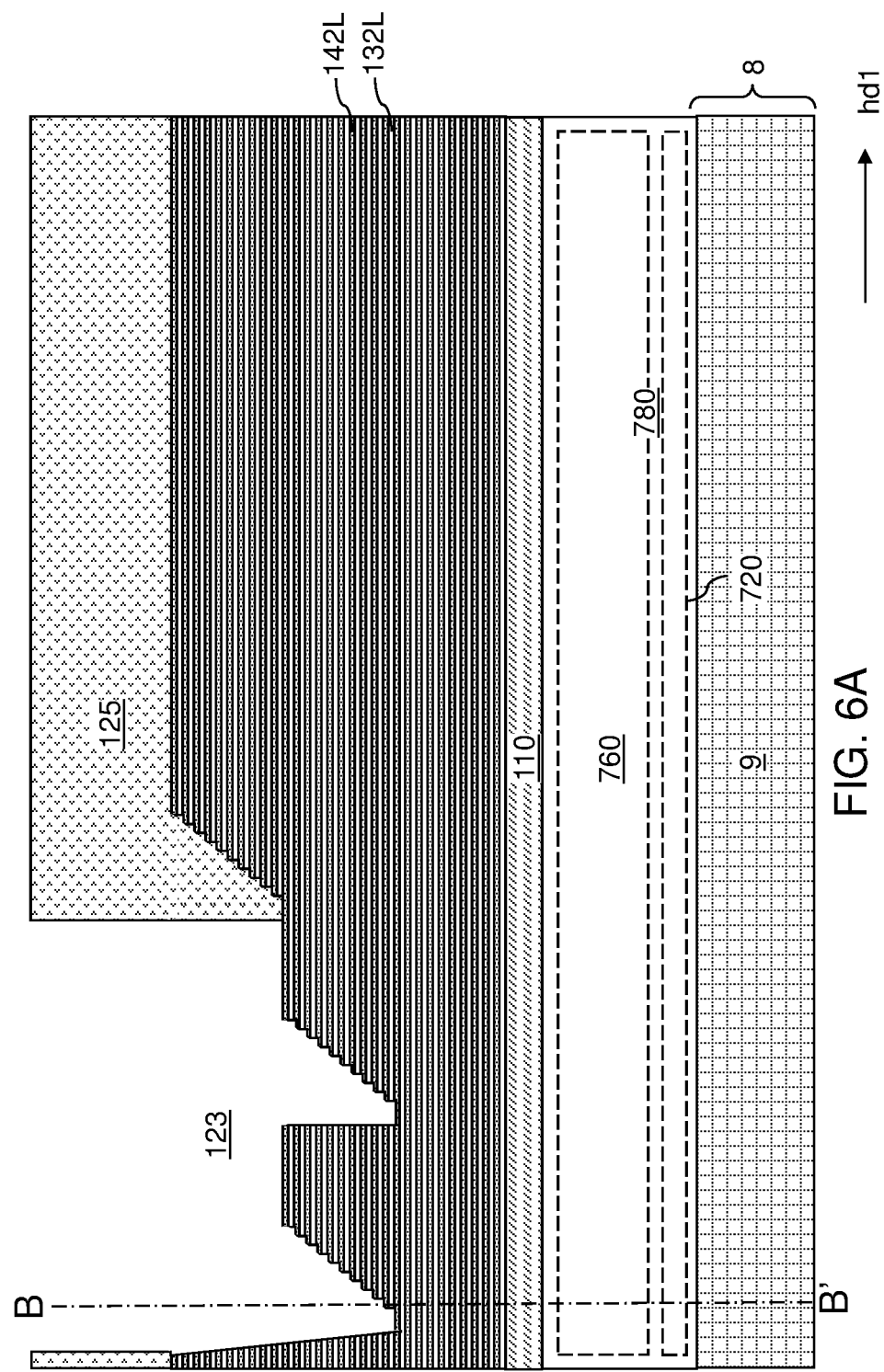
FIG. 6A is a vertical cross-sectional view of the exemplary structure along the first horizontal direction after a first area recess etch process according to an embodiment of the present disclosure.
Figure 6B:
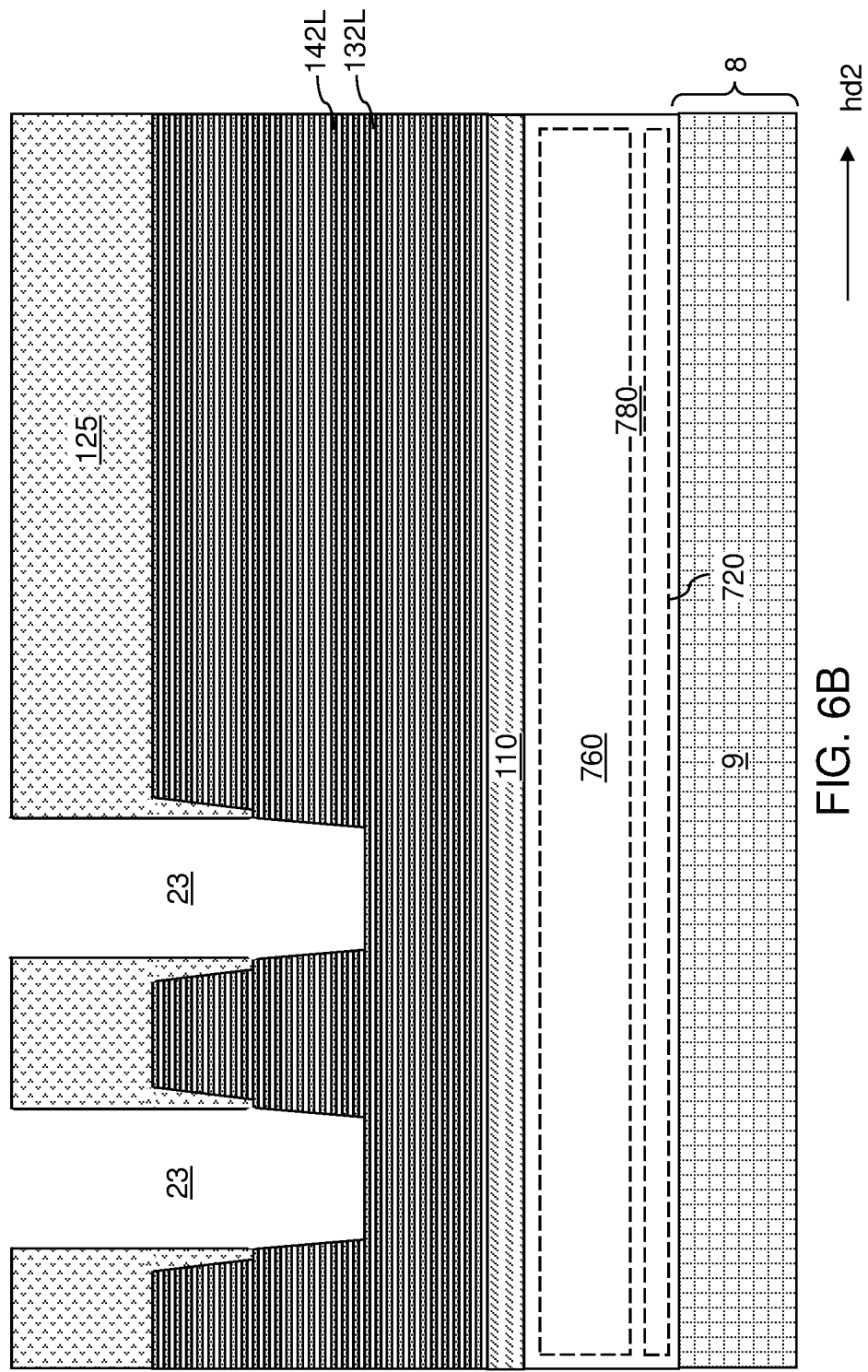
FIG. 6B is a vertical cross-sectional view of the exemplary structure along a vertical plane B-B' of FIG. 6A.

Referring to FIGS. 6A and 6B, a first area recess etch process can be performed to vertically shift the levels of the physically exposed first stepped surfaces by a first vertical recess distance. In one embodiment, the first vertical recess distance may be the same as, or may be substantially the same as, the maximum depth of each first stepped cavity 123 as formed at the processing steps of FIGS. 4A and 4B (as measured from the horizontal plane including the topmost surface of the first vertically alternating sequence (132L, 142L)). Thus, the levels of the physically exposed first stepped surfaces can shift downward by the first vertical recess distance within each area that is not masked by the first recess etch mask layer 125. In the illustrative example, the total number of times by which the set of layer patterning processing steps is repeated can be $M_1/3$, and the first vertical recess distance can be the same as the total thickness of $M_1/3$ unit layer stacks of a respective first continuous insulating layer 132L and a first continuous sacrificial material layer 142L. The total number of first continuous sacrificial material layers 142L having a respective first stepped surface can be $2 \times M_1$ at the end of this processing step. The first recess etch mask layer 125 can be subsequently removed, for example, by ashing.

Figure 7A:
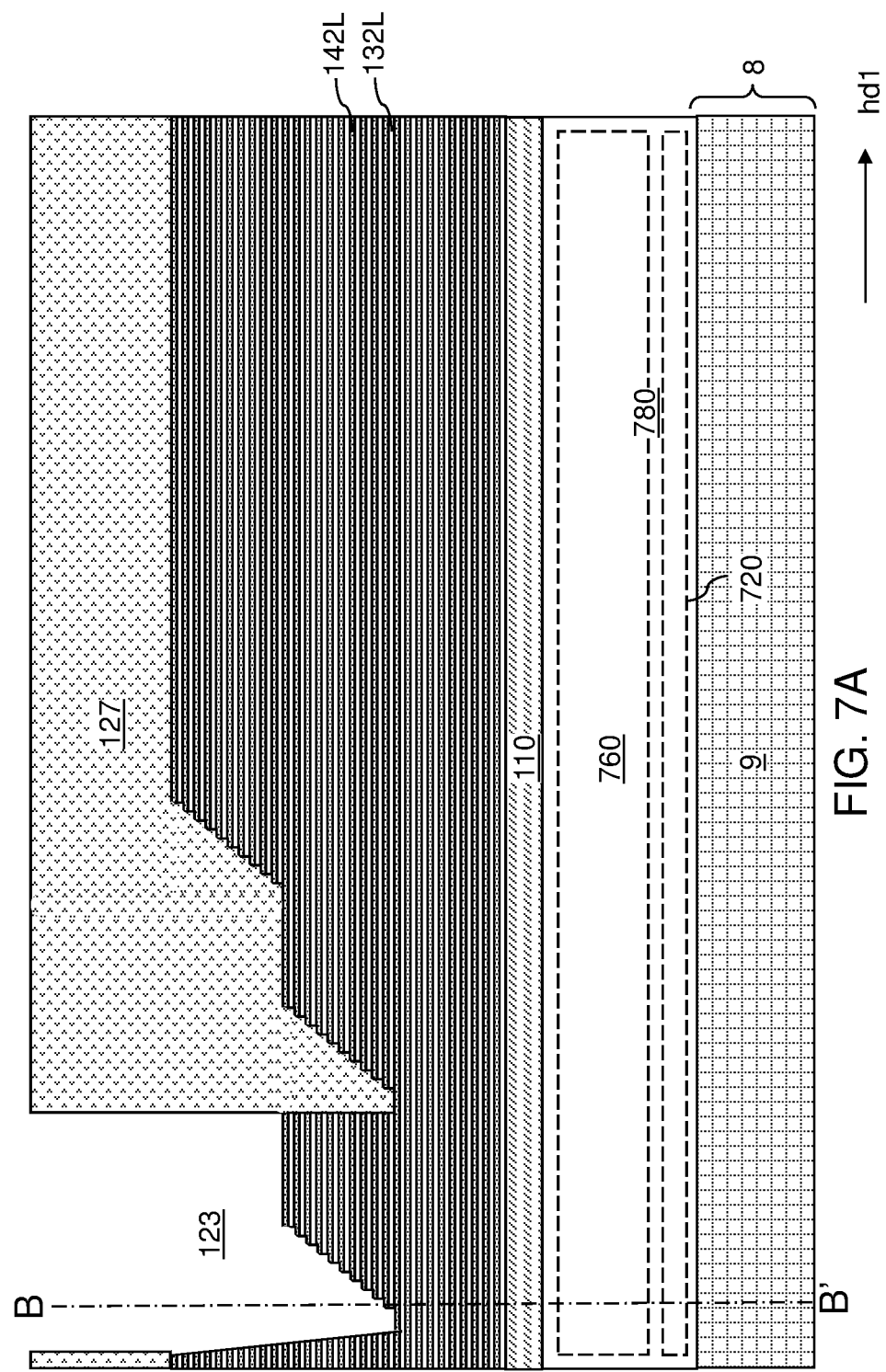
FIG. 7A is a vertical cross-sectional view of the exemplary structure along the first horizontal direction after formation of a second recess etch mask layer according to an embodiment of the present disclosure.
Figure 7B:
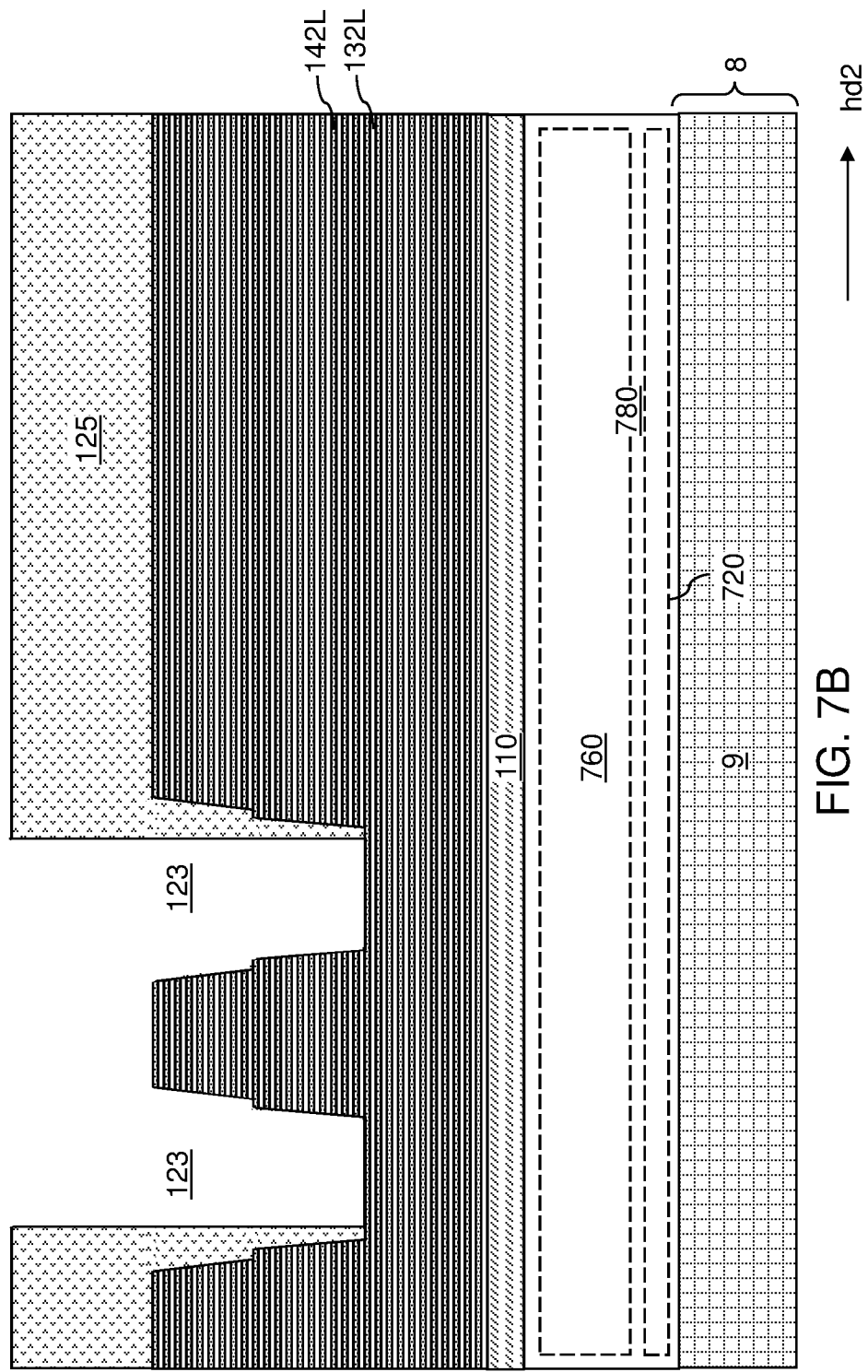
FIG. 7B is a vertical cross-sectional view of the exemplary structure along a vertical plane B-B' of FIG. 7A.

Referring to FIGS. 7A and 7B, a second recess etch mask layer 127 can be formed over the exemplary structure by applying and lithographically patterning an etch mask material. In one embodiment, the second recess etch mask layer 127 may include a photoresist material that is applied over the exemplary structure, and is subsequently patterned by lithographic exposure and development. According to an aspect of the present disclosure, the second recess etch mask layer 127 may cover two sets of first stepped surfaces among the multiple sets of first stepped surfaces that are arranged along the first horizontal direction hd1, and may include a rectangular opening in which all other sets of first stepped surfaces among the multiple sets of first stepped surfaces are physically exposed. In an illustrative example, if three sets of first stepped surfaces underlying a respective first stepped cavity 123 is present within each cluster of first stepped surfaces (i.e., if N is 3), a first set and a second set of first stepped surfaces can be covered with the second recess etch mask layer 127 while a third set of second stepped surfaces is physically exposed within an opening in the second recess etch mask layer 127.

According to an aspect of the present disclosure, a single rectangular opening may be formed through the second recess etch mask layer 127 over each 2×N array of first stepped cavities 123. In this case, two first stepped cavities 123 per each row of N first stepped cavities may be covered by the second recess etch mask layer 127. Two rows of (N−2) first stepped cavities 123 may be physically exposed within an opening in the second recess etch mask layer 127 within the area of the 2×N array of first stepped cavities 123. Thus, a strip-shaped area between the two rows of (N−2) first stepped cavities 123 is physically exposed within the opening in the second recess etch mask layer 127 within the area of the 2×N array of first stepped cavities 123.

Figure 8A:
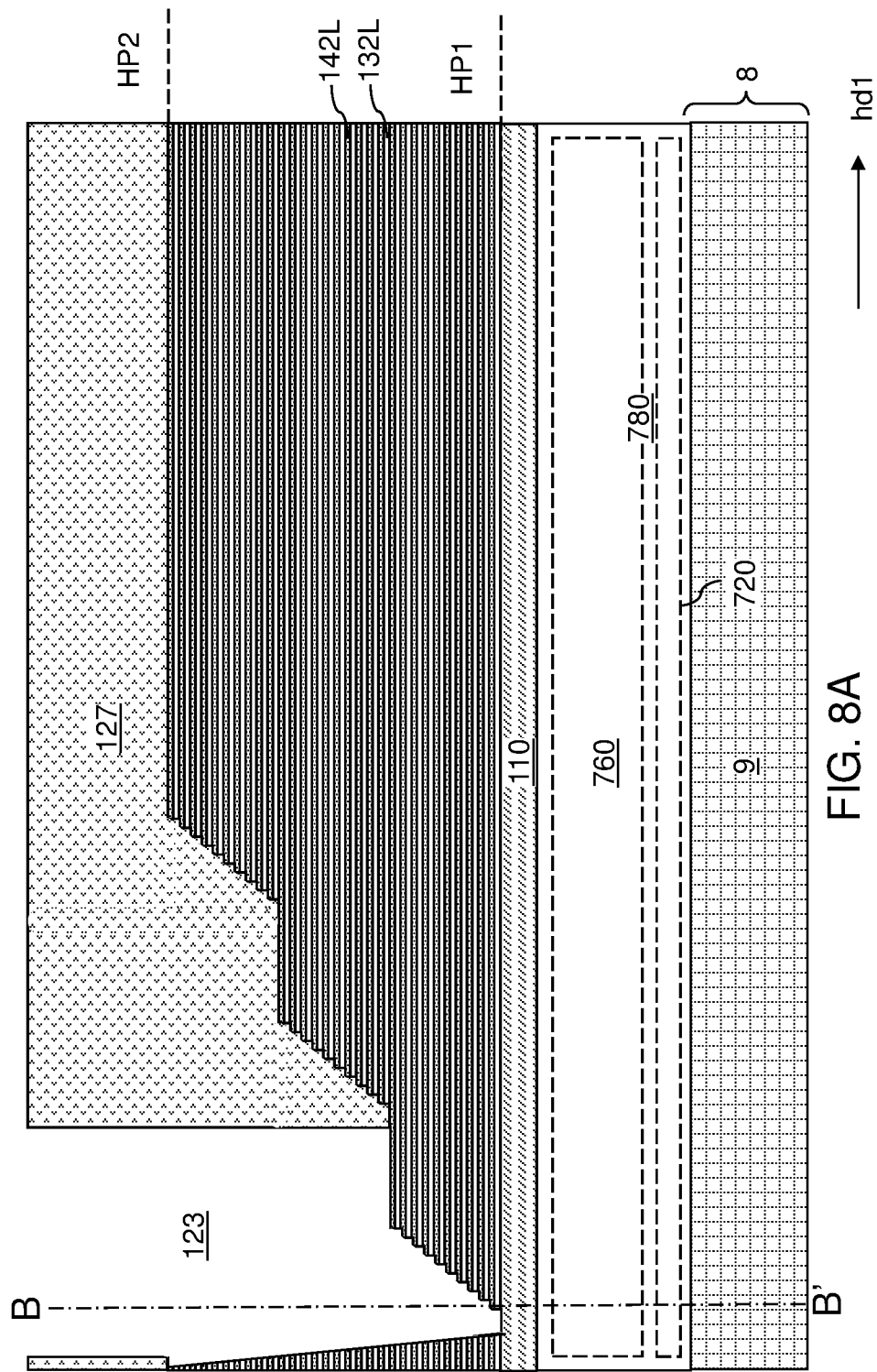
FIG. 8A is a vertical cross-sectional view of the exemplary structure along the first horizontal direction after a second area recess etch process according to an embodiment of the present disclosure.
Figure 8B:
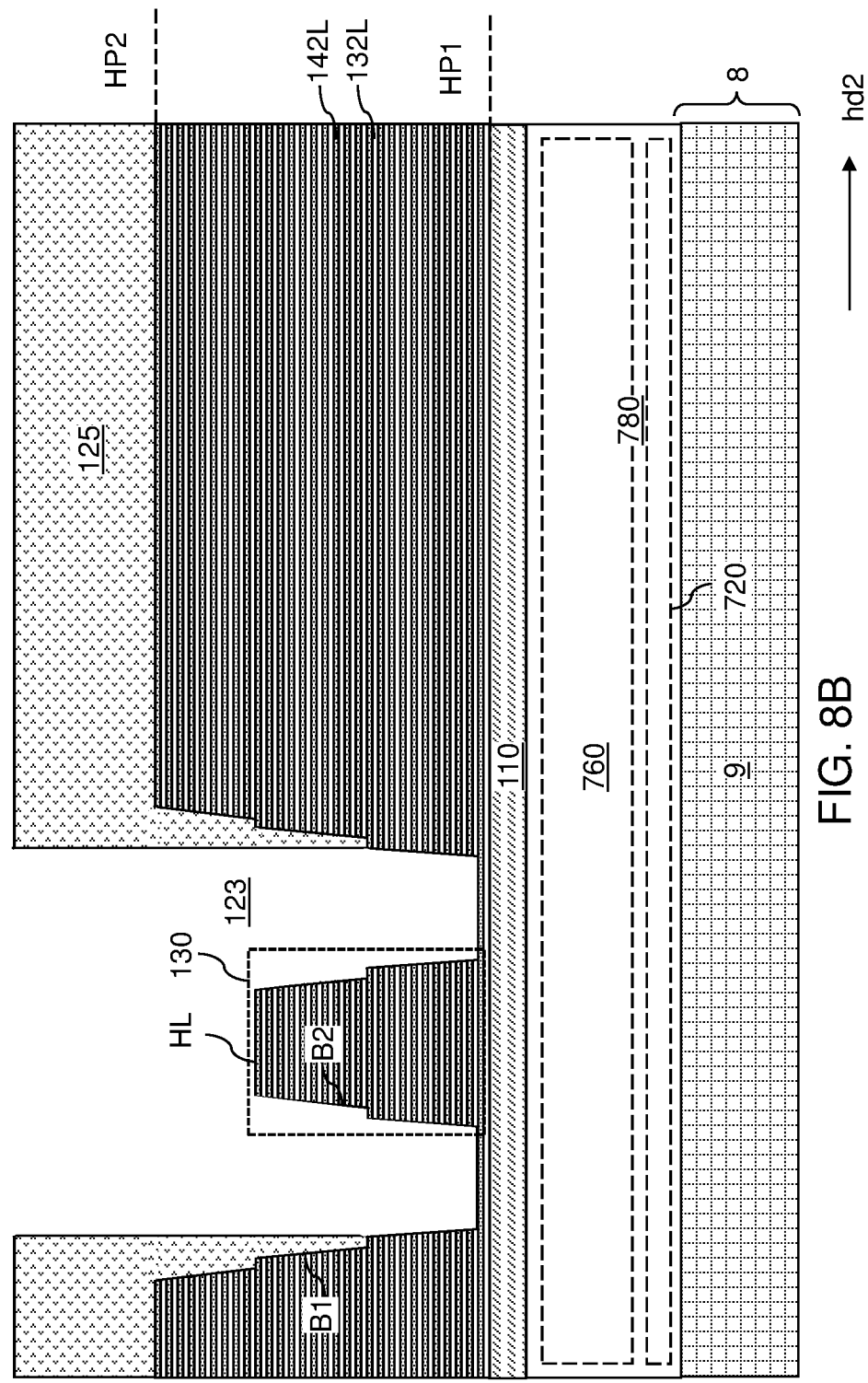
FIG. 8B is a vertical cross-sectional view of the exemplary structure along a vertical plane B-B' of FIG. 8A.
Figure 9A:
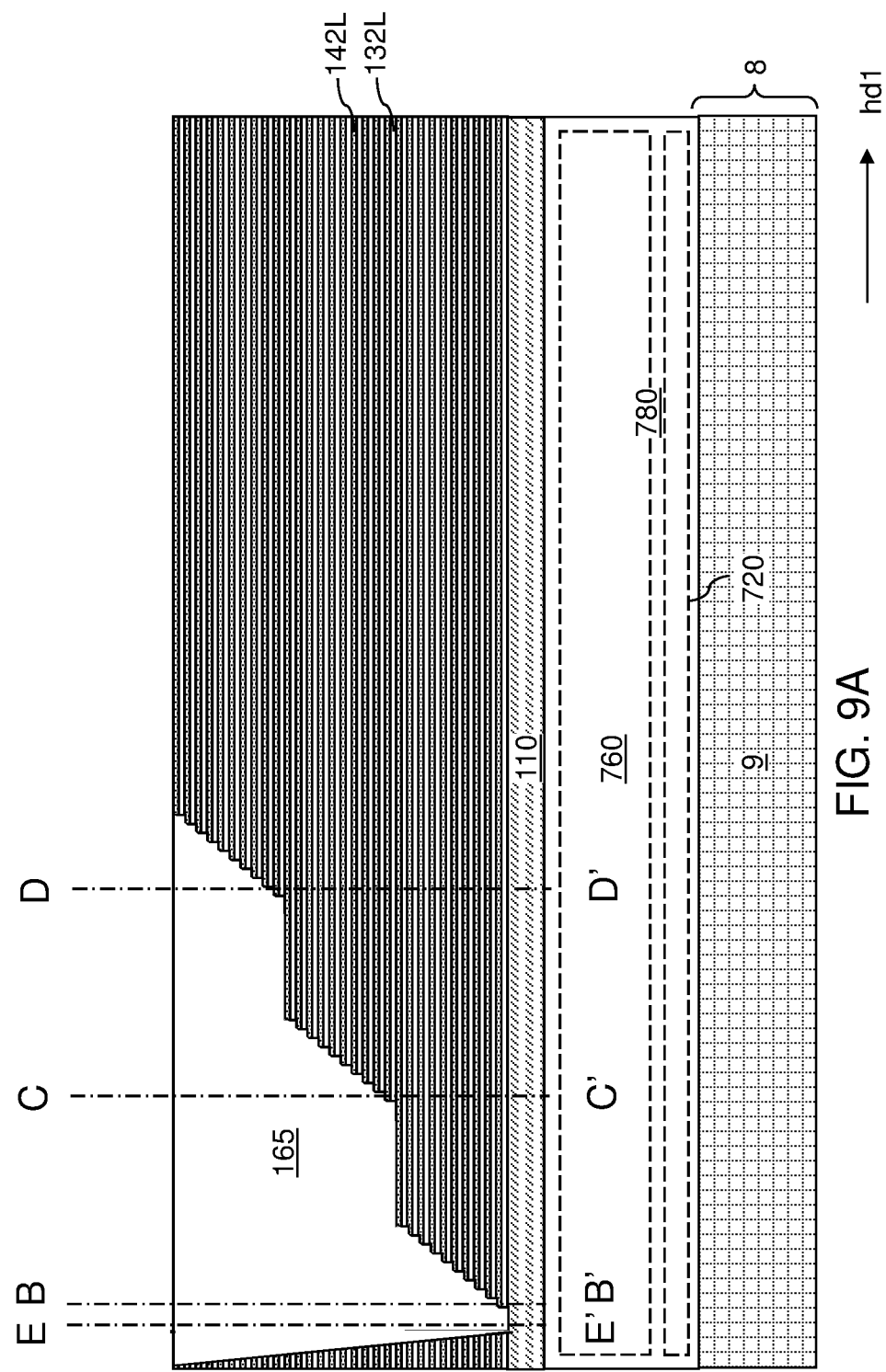
FIG. 9A is a vertical cross-sectional view of the exemplary structure along the first horizontal direction after formation of a first retro-stepped dielectric material portion according to an embodiment of the present disclosure.
Figure 9B:
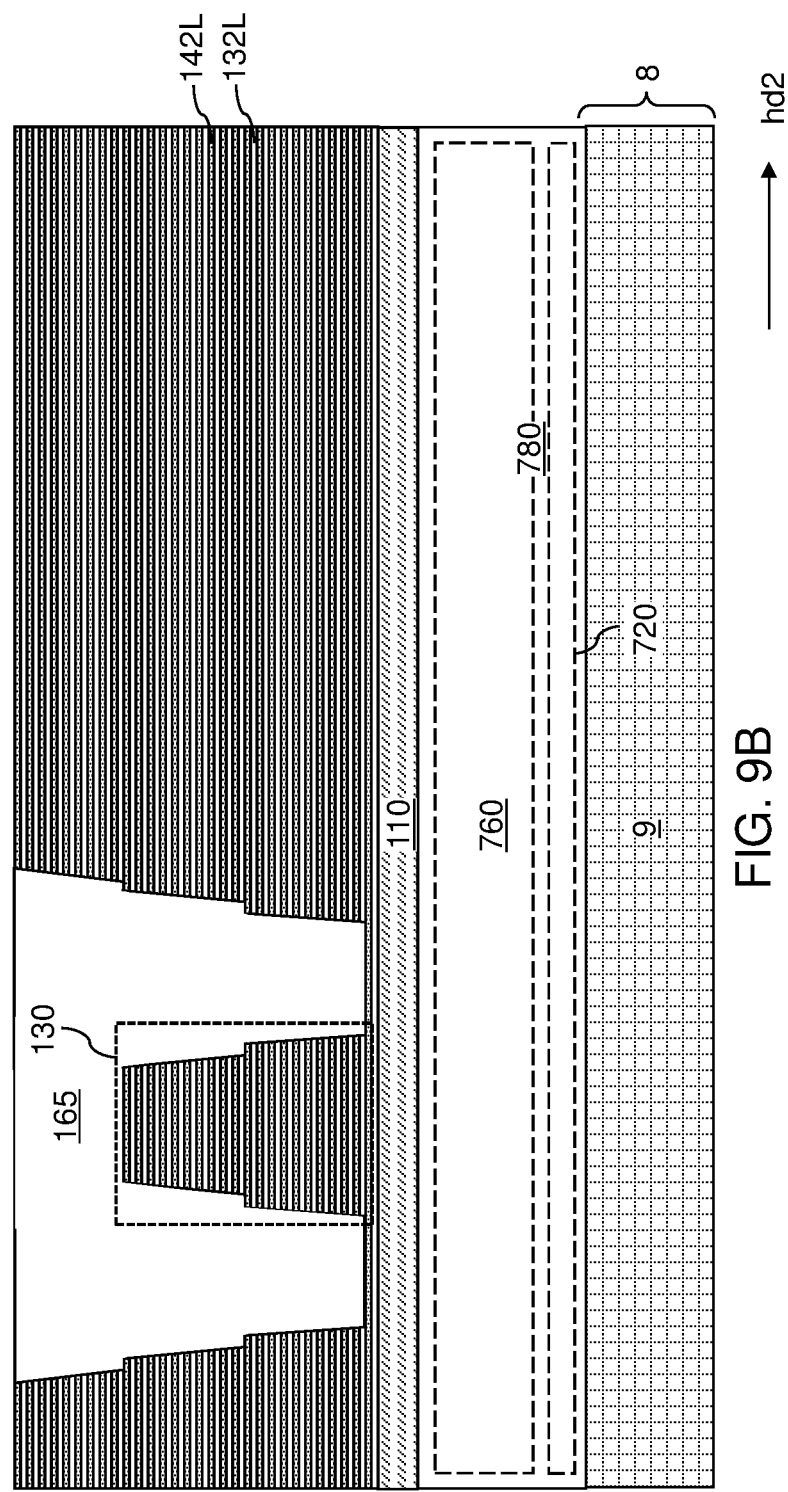
FIG. 9B is a vertical cross-sectional view of the exemplary structure along a vertical plane B-B' of FIG. 9A.
Figure 9C:
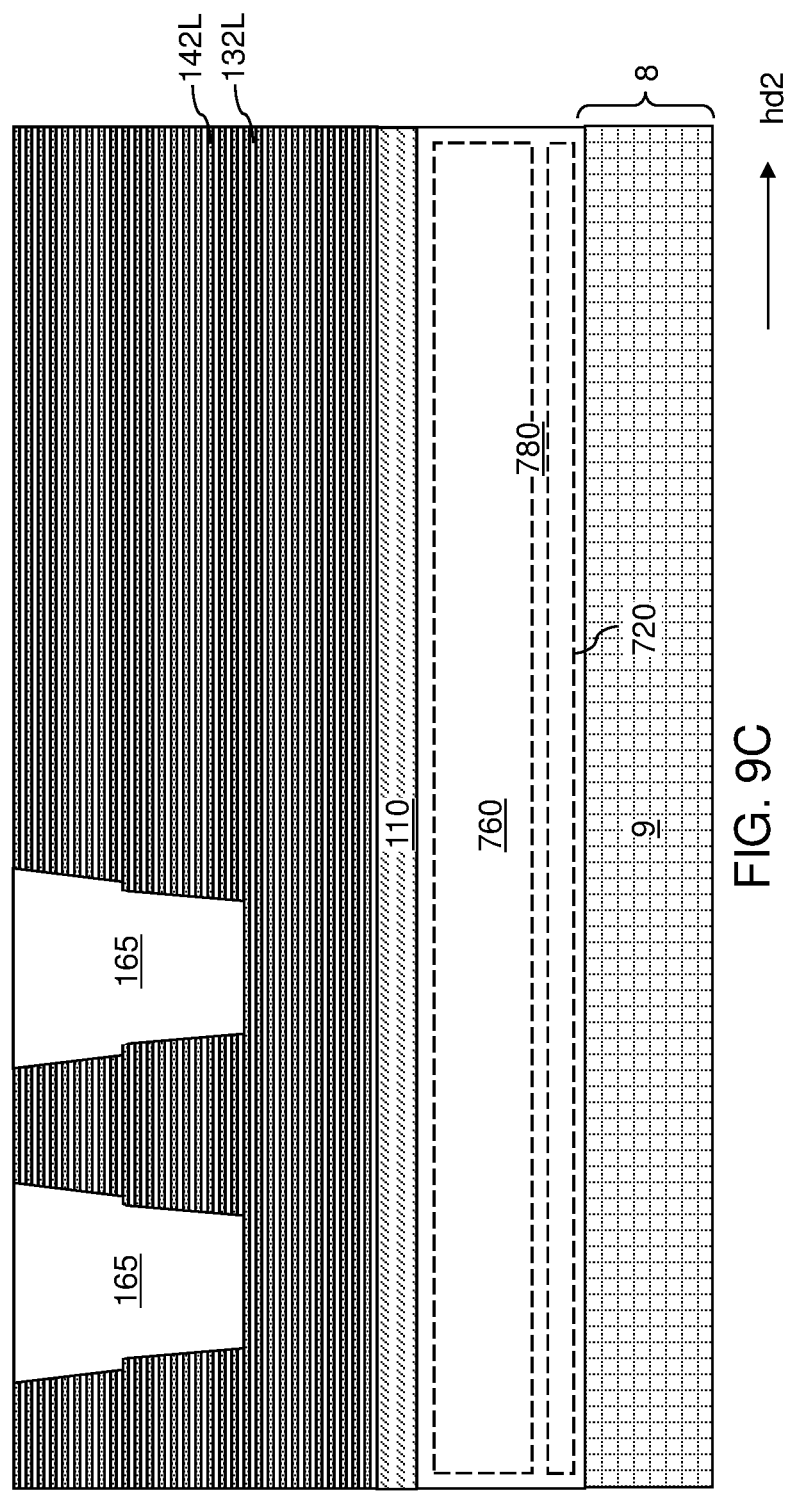
FIG. 9C is a vertical cross-sectional view of the exemplary structure along a vertical plane C-C' of FIG. 9A.
Figure 9D:
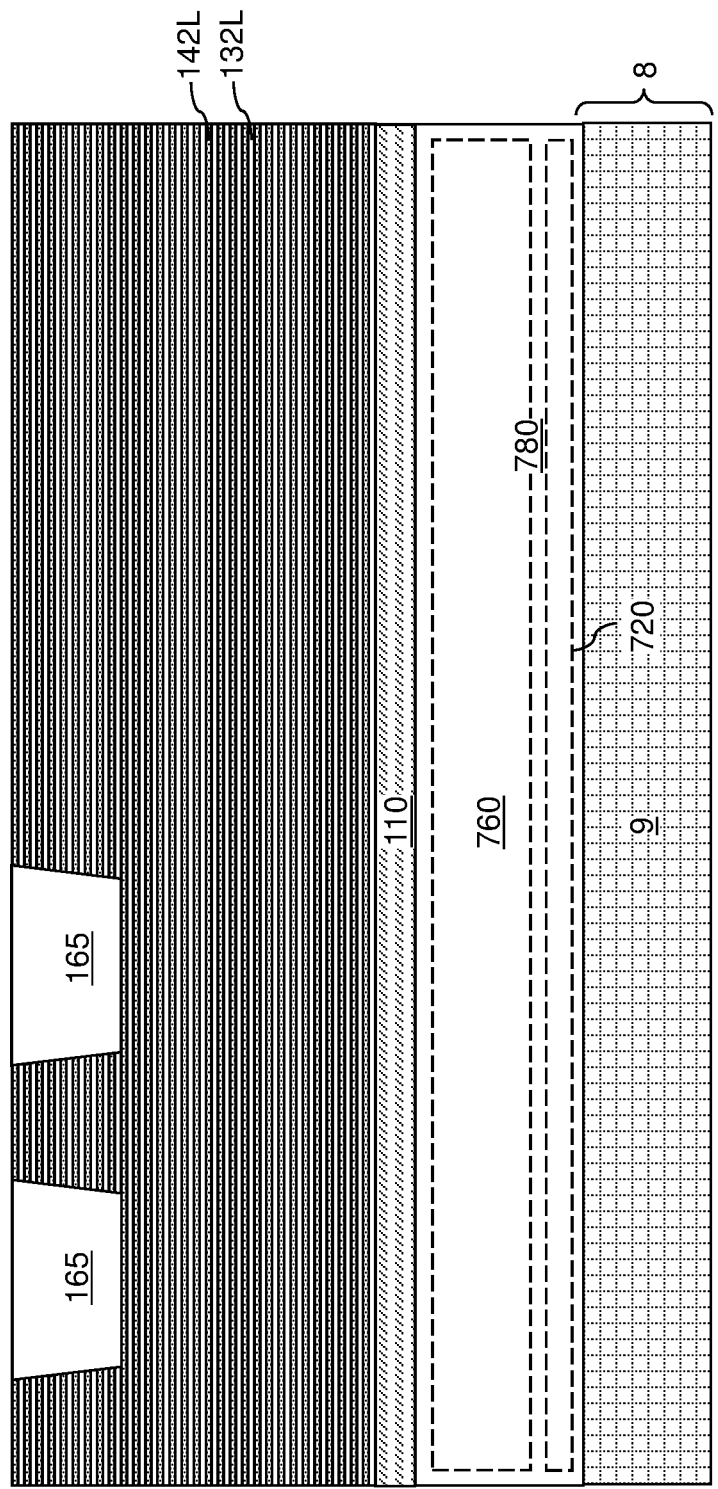
FIG. 9D is a vertical cross-sectional view of the exemplary structure along a vertical plane D-D' of FIG. 9A.

Referring to FIGS. 8A and 8B, a second area recess etch process can be performed to vertically shift the levels of the physically exposed first stepped surfaces by a second vertical recess distance. In one embodiment, the second vertical recess distance may be the same as, or may be substantially the same as, the maximum depth of each first stepped cavity 123 as formed at the processing steps of FIGS. 4A and 4B (as measured from the horizontal plane including the topmost surface of the first vertically alternating sequence (132L, 142L)). Thus, the levels of the physically exposed first stepped surfaces can shift downward by the second vertical recess distance within each area that is not masked by the second recess etch mask layer 127. In the illustrative example, the total number of times by which the set of layer patterning processing steps is repeated can be $M_1/3$, and the second vertical recess distance can be the same as the total thickness of $M_1/3$ unit layer stacks of a respective first continuous insulating layer 132L and a first continuous sacrificial material layer 142L. The total number of first continuous sacrificial material layers 142L having a respective first stepped surface can be $3 \times M_1$ at the end of this processing step. In this case, the bottommost layer within the first vertically alternating sequence (132L, 142L) can be patterned by the second area recess etch process. The second recess etch mask layer 127 can be subsequently removed, for example, by ashing.

Generally, at least one etch mask layer (125, 127), such as two or more recess etch mask layers (125, 127), can be employed according to an aspect of the present disclosure. According to an aspect of the present disclosure shown in FIG. 8B, at least one recess etch mask layer (125, 127) can include a single rectangular opening within each area of a 2×N array of first stepped surfaces such that a strip portion 130 of the first vertically alternating sequence (132L, 142L) between the two rows of N first stepped surfaces is etched during a subsequent area recess etch process. Additionally, at least another recess etch mask layer (125, 127) can include a pair of rectangular openings within each area of a 2×N array of first stepped surfaces such that a strip portion of the first vertically alternating sequence (132L, 142L) between the two rows of N first stepped surfaces is not etched during a subsequent area recess etch process. The set of processing steps of FIGS. 4A and 4B that forms the first stepped surfaces do not etch the strip portion of the first vertically alternating sequence (132L, 142L) between the two rows of N first stepped surfaces.

According to an aspect of the present disclosure, the combination of etch process is employed such that a first subset of the etch processes does not etch a strip portion of the first vertically alternating sequence (132L, 142L) between two rows of N first stepped surfaces within each 2×N array of first stepped surfaces, and a second subset of the etch processes etches the strip portion of the first vertically alternating sequence (132L, 142L). This combination results in a hybrid etch profile, in which the strip portion 130 of the first vertically alternating sequence (132L, 142L) between two rows of N first stepped surfaces within each 2×N array of first stepped surfaces is only partially etched to provide a recessed horizontal surface of the first vertically alternating sequence (132L, 142L) between the two rows of N first stepped surfaces within each 2×N array of first stepped surfaces.

Upon removal of the second recess etch mask layer 127, a continuous stepped cavity 123 can be formed within each area of the 2×N array of first stepped surfaces such that the continuous stepped cavity includes two pairs of staircase surfaces that are interconnected with a partly recessed volume (e.g., volume above the strip portion 130) between the two deepest portions of the two pairs of staircase surfaces. The resulting topographical profile is conducive to lithographic patterning of the recess etch mask layers (125, 127) because the height variation of the recess etch mask layers (125, 127) can be reduced and the possibility of photoresist pattern collapse into the cavity 123 can also be reduced by not fully etching the strip portion 130 of the first vertically alternating sequence (132L, 142L) between the two rows of N first stepped surfaces within each 2×N array of first stepped surfaces. Anomalous lithographically patterned shapes in the recess etch mask layers (125, 127) due to an excessive thickness of the recess etch mask layers (125, 127) can be avoided. Further, the resulting topographical profile is conducive to subsequent filling of the continuous stepped cavity with a dielectric fill material because narrow and deep cavity volumes can be avoided, which would have resulted if the strip portion 130 of the first vertically alternating sequence (132L, 142L) between the two rows of N first stepped surfaces within each 2×N array of first stepped surfaces were not etched at all. Thus, the topographical profile of embodiments of the present disclosure provides lithographic patterning of the recess etch mask layers (125, 127) with a sufficiently wide lithographic process window and filling of the continuous stepped cavities that are formed in the first vertically alternating sequence (132L, 142L) without gaps or while minimizing the size of gaps.

Referring collectively to the processing steps of FIGS. 3A-8B, a 2×N array of stepped surfaces (such as the first stepped surfaces) can be formed within an upper region of a vertically alternating sequence (such as the first vertically alternating sequence (132L, 142L)) by patterning a subset of the unit layer stacks (such as unit layer stacks of a first continuous insulating layer 132L and a first continuous sacrificial material layer 142L). N stepped surfaces can be arranged in each row extending along a first horizontal direction within the 2×N array, and two stepped surfaces are arranged in each column extending along a second horizontal direction hd1 within the 2×N array. N is an integer greater than 1, such as an integer between, and including, 2 and 10, and/or between, and including, 3 and 5.

Each column of stepped surfaces other than one column of stepped surfaces can be vertically extended by performing a set of processing sequences at least once. The set of processing sequences comprises forming a patterned etch mask layer (such as a first patterned etch mask layer 125 or a second patterned etch mask layer 127), and etching an unmasked subset of the 2×N array employing a respective anisotropic etch process (such as a first area recess etch process or a second area recess etch process). One or more patterned etch mask layer employed within the set of processing steps has a respective continuous opening including an entire area of a respective 2×M array of stepped surfaces (such as the second patterned etch mask layer 127 described above) that is a subset of the 2×N array of stepped surfaces. Each M is an integer less than N. Optionally, at least one additional patterned etch mask layer (such as the first patterned etch mask layer 125 described above) employed within the set of processing steps has a pair of disjoined openings within an area of a respective 1×Q array of stepped surfaces that is a subset of the 2×N array of stepped surfaces. Each Q is an integer less than N.

According to an aspect of the present disclosure, a first staircase region is formed within a continuous area including an entire area of a first 1×N array of stepped surfaces within the 2×N array of stepped surfaces, and a second staircase region is formed within a continuous area including an entire area of a second 1×N array of stepped surface within the 2×N array of stepped surfaces. In one embodiment, the first staircase region and the second staircase region are interconnected to each other along the second horizontal direction hd2 within an area of at least one column of stepped surfaces (such as a pair of the two deepest first stepped surfaces). In one embodiment, the first staircase region and the second staircase region are not interconnected to each other along the second horizontal direction hd2 within an area of at least another column of the stepped surfaces (such as a pair of the two shallowest first stepped surfaces).

In one embodiment, each first continuous sacrificial material layer 142L within the first vertically alternating sequence (132L, 142L) comprises a respective surface that is physically exposed to the first staircase region, and each first continuous sacrificial material layer 142L within the first vertically alternating sequence (132L, 142L) comprises a respective additional surface that is physically exposed to the second staircase region.

According to an aspect of the present disclosure, a first continuous retro-stepped cavity is formed in a continuous volume from which the material of the first vertically alternating sequence (132L, 142L) is removed within the area of the 2×N array of first stepped surfaces. The first continuous retro-stepped cavity overlies two staircase regions of the first vertically alternating sequence (132L, 142L). The first continuous retro-stepped cavity has a vertical cross-sectional profile within a vertical plane that is perpendicular to the first horizontal direction, in which a first boundary (e.g., sidewall) B1 of the first continuous retro-stepped cavity continuously extends from a first horizontal plane HP1 including a bottommost surface of the first continuous retro-stepped cavity to a second horizontal plane HP2 including topmost surfaces of the first vertically alternating sequence (132L, 142L), and a second boundary (e.g., sidewall) B2 of the first continuous retro-stepped cavity continuously extends from the first horizontal plane HP1 to a horizontal plane including a top surface of a recessed portion (i.e., the strip portion 130) of the first vertically alternating sequence (132L, 142L) that is located at a height between the first horizontal plane HP1 and the second horizontal plane HP2.

In one embodiment, the second boundary B2 in the vertical cross-sectional profile extends to a horizontal line HL (e.g., the top of the strip portion 130). In one embodiment, a vertical distance between the horizontal line HL and the first horizontal plane HP1 is in a range from 20% to 80% of a vertical distance between the first horizontal plane HP1 and the second horizontal plane HP2. In one embodiment, the second boundary B2 in the vertical cross-sectional profile comprises at least one tapered sidewall of the first vertically alternating sequence (132L, 142L).

In one embodiment, first boundary B1 comprises a plurality of tapered sidewalls that are interconnected to each other by at least one horizontal step. One of the at least one horizontal step is located at a same height as the horizontal line HL of the second boundary B2 in the vertical cross-sectional profile. In one embodiment, two disjoined portions of a top surface of a semiconductor material layer 110 within the substrate may be physically exposed to the first continuous retro-stepped cavity.

Referring to FIGS. 9A-9E, a first dielectric fill material (such as undoped silicate glass (i.e., silicon oxide) or a doped silicate glass) can be deposited in each first continuous retro-stepped cavity. The first dielectric fill material can be planarized to remove excess portions of the first dielectric fill material from above the horizontal plane including the topmost surface of the first vertically alternating sequence (132L, 142L). Each remaining portion of the first dielectric fill material that fills a respective first continuous retro-stepped cavity constitutes a first-tier retro-stepped dielectric material portion 165. In one embodiment, each first retro-stepped dielectric material portion 165 can be formed within volumes of the first staircase region and the second staircase region and an interconnecting volume located between the first staircase region and the second staircase region and overlying the strip portion 130 that has a top surface in a horizontal plane that includes the horizontal line HL illustrated in FIG. 8B.

Figure 10:
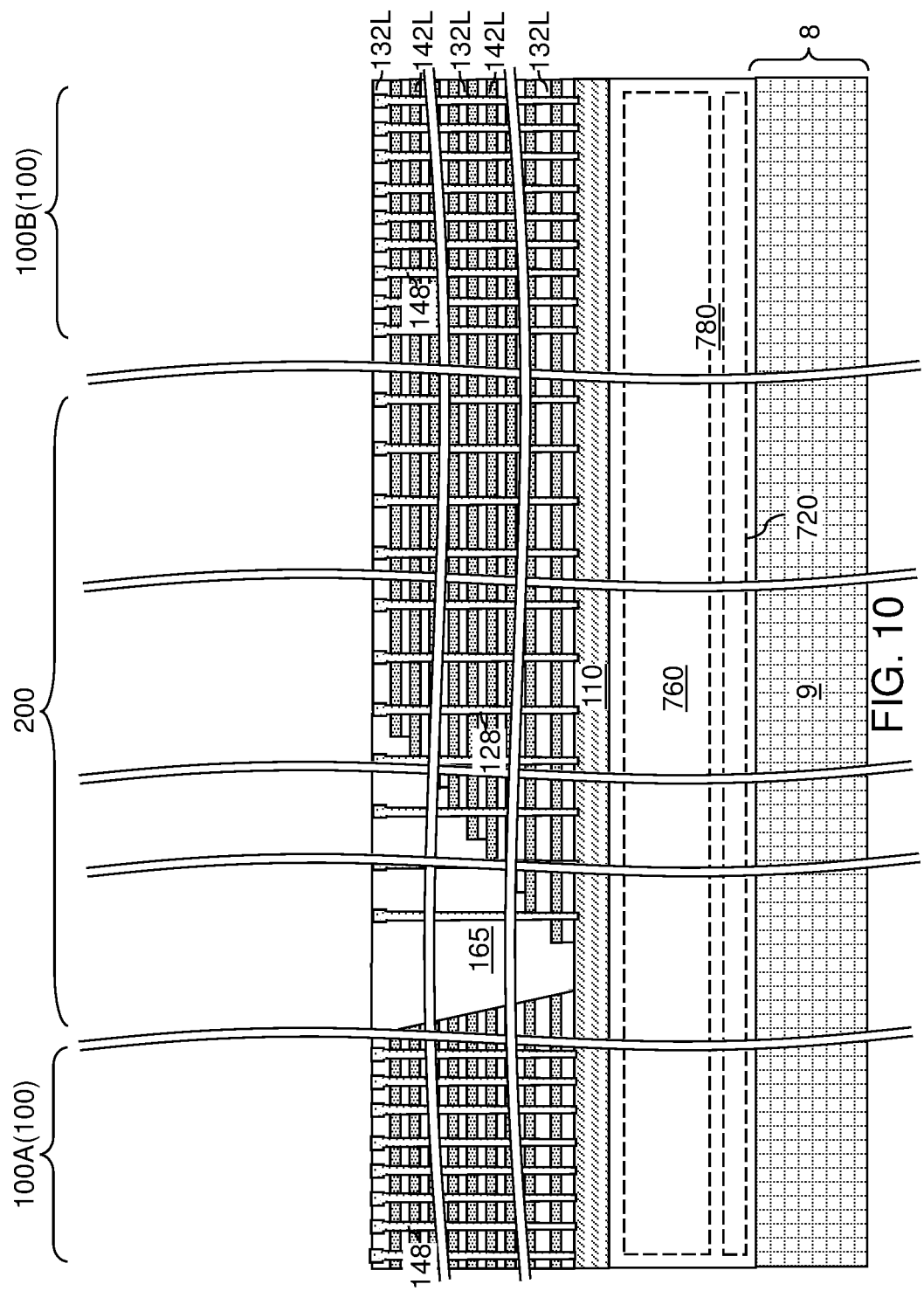
FIG. 10 is a vertical cross-sectional view of the exemplary structure after formation of first-tier openings and sacrificial first-tier opening fill portions according to an embodiment of the present disclosure.

Referring to FIG. 10, various first-tier openings may be formed through the first vertically alternating sequence (132L, 142L) and into the semiconductor material layer 110. A photoresist layer (not shown) may be applied over the first vertically alternating sequence (132L, 142L), and may be lithographically patterned to form various openings therethrough. The pattern of openings in the photoresist layer may be transferred through the first vertically alternating sequence (132L, 142L) and into the semiconductor material layer 110 by a first anisotropic etch process to form the various first-tier openings concurrently, i.e., during the first isotropic etch process. The various first-tier openings may include first-tier memory openings formed in the memory array regions 100 and first-tier support openings formed in the inter-array region 200. Each cluster of first-tier memory openings may be formed as a two-dimensional array of first-tier memory openings. The first-tier support openings are openings that are formed in the inter-array region 200, and are subsequently employed to form support pillar structures. A subset of the first-tier support openings may be formed through a respective horizontal surface of the first stepped surfaces.

Sacrificial first-tier opening fill portions (148, 128) may be formed in the various first-tier openings. For example, a sacrificial first-tier fill material is deposited concurrently deposited in each of the first-tier openings. The sacrificial first-tier fill material includes a material that may be subsequently removed selective to the materials of the first continuous insulating layers 132L and the first continuous sacrificial material layers 142L. In one embodiment, the sacrificial first-tier fill material may include a semiconductor material such as silicon (e.g., a-Si or poly silicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first continuous insulating layers 132L. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include carbon-containing material (such as amorphous carbon or diamond-like carbon) that may be subsequently removed by ashing, or a silicon-based polymer that may be subsequently removed selective to the materials of the first vertically alternating sequence (132L, 142L).

Portions of the deposited sacrificial material may be removed from above the topmost layer of the first vertically alternating sequence (132L, 142L), such as from above the topmost first continuous insulating layer 132L. For example, the sacrificial first-tier fill material may be recessed to a top surface of the topmost first continuous insulating layer 132L using a planarization process. The planarization process may include a recess etch, chemical mechanical planarization (CMP), or a combination thereof. The top surface of the topmost first continuous insulating layer 132L may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening constitutes a sacrificial first-tier memory opening fill portion 148. Each remaining portion of the sacrificial material in a first-tier support opening constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first vertically alternating sequence (132L, 142L) (such as from above the top surface of the topmost first continuous insulating layer 132L). The top surfaces of the sacrificial first-tier opening fill portions (148, 128) may be coplanar with the top surface of the topmost first continuous insulating layer 132L. Each of the sacrificial first-tier opening fill portions (148, 128) may, or may not, include cavities therein. The set of all structures located between the bottommost surface of the first vertically alternating sequence (132L, 142L) and the topmost surface of the first vertically alternating sequence (132L, 142L) or embedded within the first vertically alternating sequence (132L, 142L) constitutes a first-tier structure.

Figure 11:
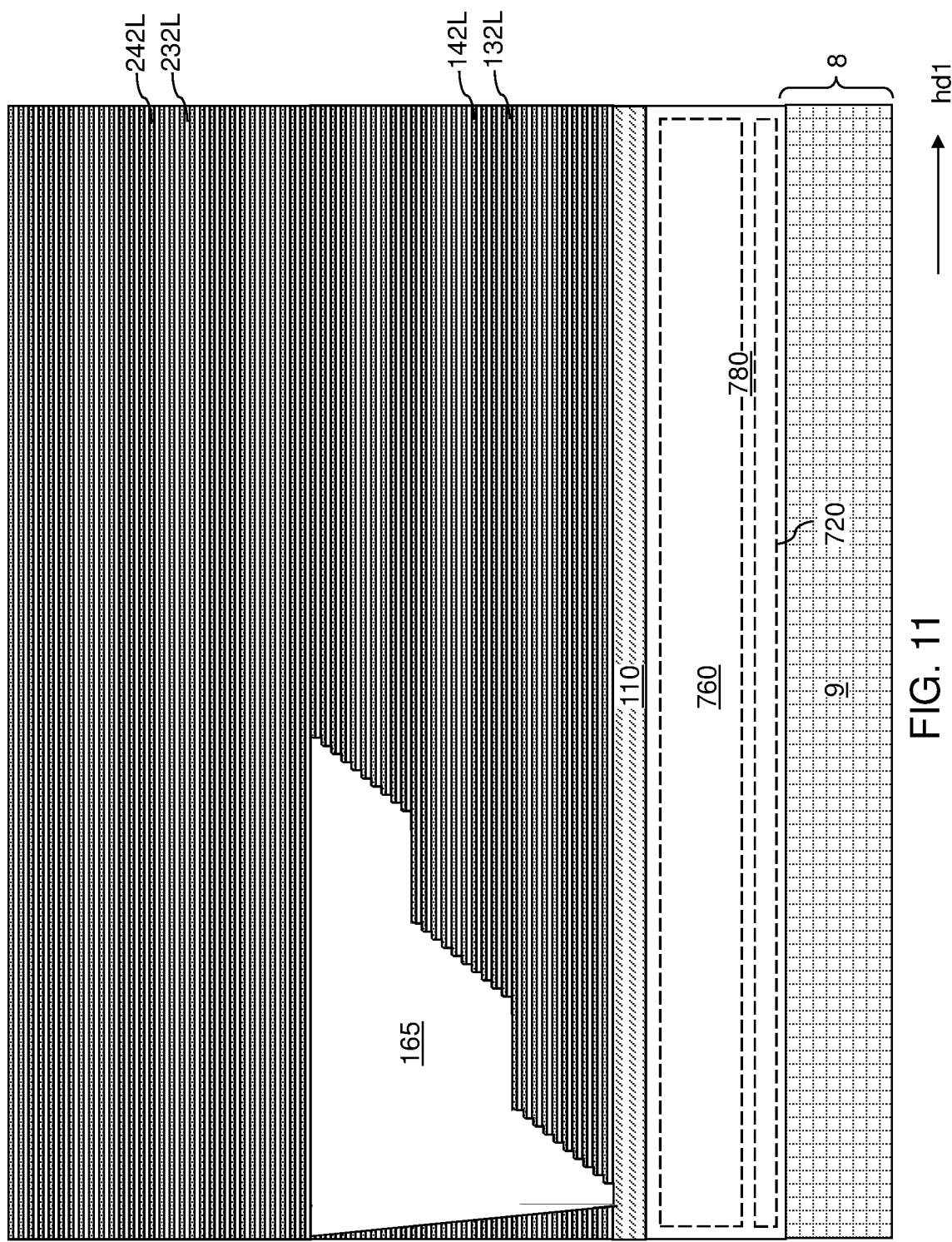
FIG. 11 is a vertical cross-sectional view of the exemplary structure after formation of a second vertically alternating sequence of second continuous insulating layers and second continuous sacrificial material layers according to an embodiment of the present disclosure.

Referring to FIG. 11, a second vertically alternating sequence of second continuous insulating layers 232L and second continuous sacrificial material layers 242L can be formed. Each of the second continuous insulating layers 232L is an insulating layer that continuously extends over the entire area of the substrate 8, and may have a uniform thickness throughout. Each of the second sacrificial material layers 242L includes is a sacrificial material layer that includes a dielectric material and continuously extends over the entire area of the substrate 8, and may have a uniform thickness throughout. The second continuous insulating layers 232L can have the same material composition and the same thickness as the first continuous insulating layers 132L. The second sacrificial material layers 242L can have the same material composition and the same thickness as the first continuous sacrificial material layers 142L.

Generally, at least one additional vertically alternating sequence of additional continuous insulating layers and additional continuous sacrificial material layers can be optionally formed over the first vertically alternating sequence (132L, 142L) and the first-tier retro-stepped dielectric material portions 165.

Figure 12A:
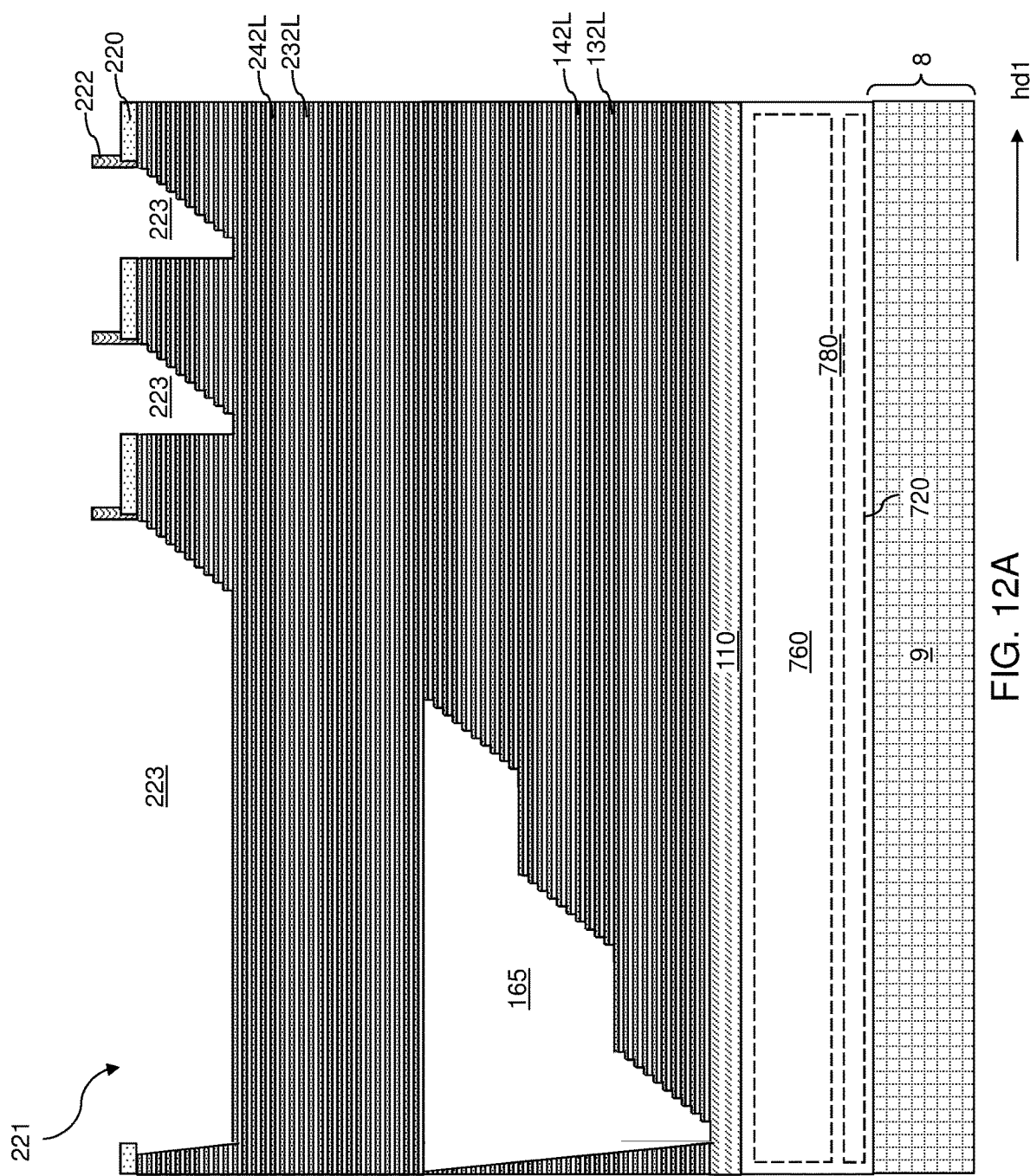
FIG. 12A is a vertical cross-sectional view of the exemplary structure along a second horizontal direction after formation of second stepped surfaces in the inter-array region according to an embodiment of the present disclosure.
Figure 12B:
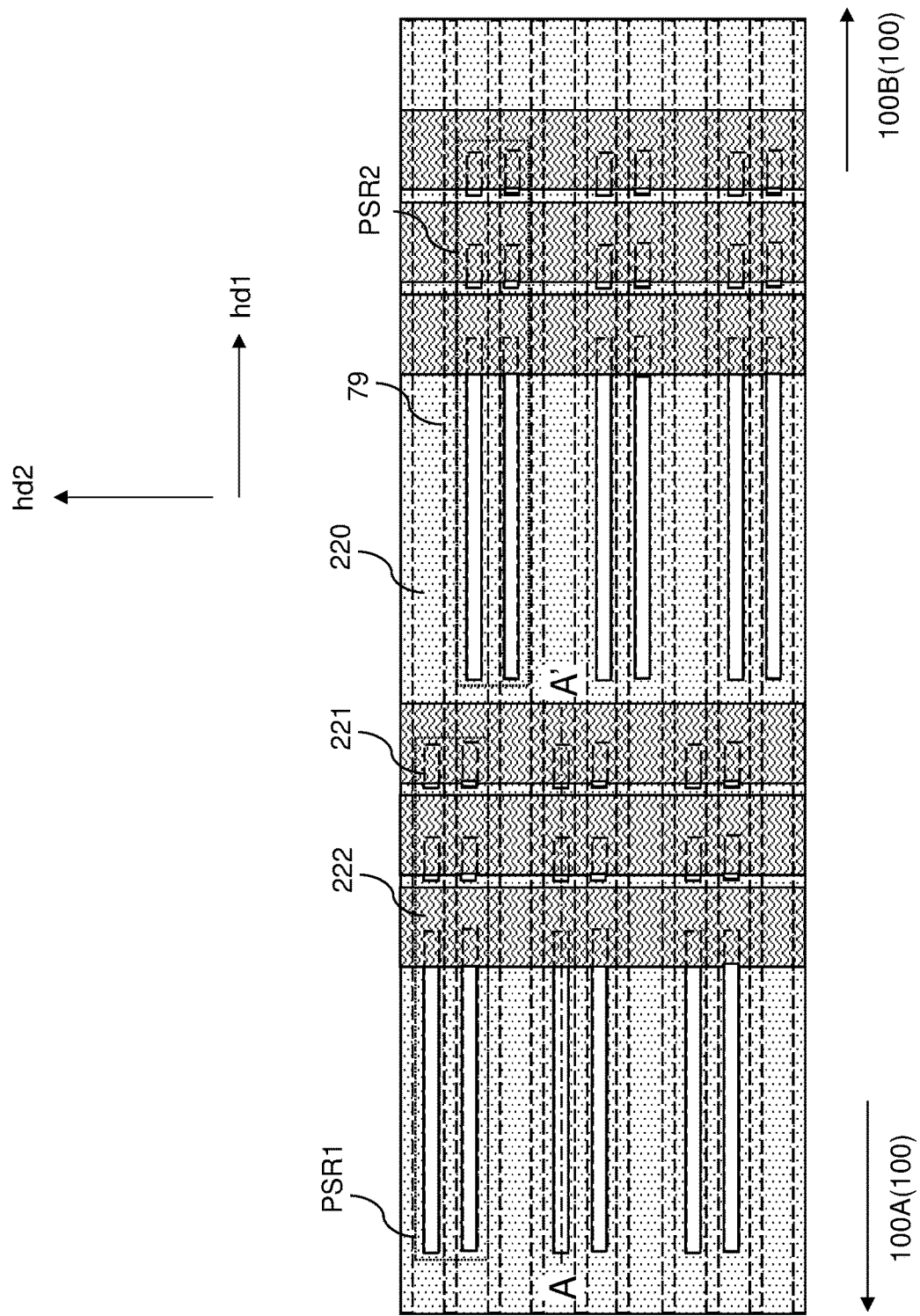
FIG. 12B is a top-down view of the exemplary structure of FIG. 12A. The vertical plane A-A' corresponds to the plane of the vertical cross-sectional view of FIG. 12A.

Referring to FIGS. 12A and 12B, a second hard mask layer 220 can be deposited over the second vertically alternating sequence of second continuous insulating layers 232L and second continuous sacrificial material layers 242L. The second hard mask layer 220 includes a hard mask material that is different from the materials of the second vertically alternating sequence of second continuous insulating layers 232L and second continuous sacrificial material layers 242L. For example, the second hard mask layer 220 may include a metallic material such as TiN, TaN, or WN, a dielectric metal oxide material such as amorphous aluminum oxide, a semiconductor material such as silicon, and/or a carbon-based material such as amorphous carbon or diamond-like carbon (DLC).

The second hard mask layer 220 can be patterned to define openings in areas that overlie the first retro-stepped dielectric material portions 165 and areas in which stepped surfaces are to be subsequently formed. Second openings 221 are formed through the second hard mask layer 220 within each area in which second stepped surfaces are to be subsequently formed. A row of P rectangular openings can be formed within each area located between areas of a neighboring pair of backside trenches 79 that are formed in a subsequent processing step. The areas of the backside trenched 79 can be the same as the areas of the trench fill structures 76 illustrated in FIGS. 2A-2E. The number P may be in a range from 2 to 20, such as from 3 to 6. The number P may, or may not, be the same as the number N.

According to an aspect of the present disclosure, a pair of rows of P second openings 221 can be arranged as a rectangular 2×P array of second openings 221 through the second hard mask layer 220. Each rectangular 2×P array of second openings 221 forms a cluster of 2P second openings 221. Clusters of 2P second openings 221 can be alternately laterally offset along the second horizontal direction hd1. In other words, upon sequentially numbering each cluster of 2P second openings with a positive integer beginning with 2 from one end of an inter-array region 200 to another end of the inter-array region along the second horizontal direction hd2, each odd-numbered cluster of 2P second openings 221 may be laterally offset toward a second memory array region 200A, and each even-numbered cluster of 2P second openings 221 may be laterally offset toward a second memory array region 200B.

Each second opening 221 through the second hard mask layer 220 may be rectangular, and may have a pair of sides that are parallel to the second horizontal direction hd1 and a pair of sides that are parallel to the second horizontal direction hd2. With each row of P second openings 221, (P−1) second openings may have a same size and may be laterally offset relative to a most proximal underlying first retro-stepped dielectric material portion 165 along the first horizontal direction. Within each row of P second openings 221, one second opening may overlie a row of N first stepped surfaces that are arranged along the first horizontal direction hd1, and may laterally extend further outside the areas of the row of N stepped surfaces for forming a set of second stepped surfaces. Thus, each row of P second openings 221 may include (P−1) second openings of approximately the same size, and a larger second opening 221 that overlie a respective underlying row of N first stepped surfaces.

Each row of P second openings 221 within each rectangular 2×P array of second openings 221 may be laterally spaced from the other row of P second openings 221 within the same rectangular 2×P array of second opening 221 along the second horizontal direction hd2 by the area of a respective backside trench 79 to be subsequently formed through the exemplary structure. Each 2×P array of second opening 221 may be laterally spaced from a neighboring 2×P array of second openings 221 by the area of a respective backside trench 79 to be subsequently formed through the exemplary structure.

According to an aspect of the present disclosure, a second trimmable etch mask layer 222 can be applied over the second hard mask layer 220, and can be lithographically patterned to form line-shaped patterned that laterally extend along the second horizontal direction hd2. The second trimmable etch mask layer 222 includes a trimmable etch mask material that can be isotropically recessed at a controlled recess rate, for example, employing an ashing process. For example, the second trimmable etch mask layer 222 may include an organic material. In one embodiment, each patterned portion of the second trimmable etch mask layer 222 can have a respective second lengthwise edge that overlies a peripheral region of a respective second opening in the second hard mask layer 220 and a respective second lengthwise edge that overlies the second hard mask layer 220. In one embodiment, a straight edge of each second opening 221 in the second hard mask layer 220 can underlie a respective patterned portion of the second trimmable etch mask layer 222, and can be located at about the same lateral distance from two straight lengthwise edges of the respective patterned portion of the second trimmable etch mask layer 222. The trimmable etch mask layer 222 does not cover the areas that overlie the first retro-stepped dielectric material portions.

Sets of second stepped surfaces can be formed within the areas of the second openings 221 in the second hard mask layer 220 by iteratively performing a set of layer patterning processing steps for a number of times that is less than the total number of second continuous sacrificial material layers 242L within the second vertically alternating sequence. A set of second stepped surfaces can be formed within each second opening 221 in the second hard mask layer 220. In one embodiment, the number of times by which the set of layer patterning processing steps is performed may be in a range from about 20% to 60% of the total number of the second continuous sacrificial material layers 242L (which may be the same as the total number of the second insulating layers 232 and/or the total number of a unit layer stack of a second insulating layer 232 and a second spacer material layer). If the total number of the second continuous sacrificial material layers 242L in the vertically alternating sequence (132L, 242L) is $M_2$, the total number of times (i.e., number of repetitions) by which the set of layer patterning processing steps is repeated may be in a range from 20% to 60%, such as from 25% to 50%, of the number $M_2$. In the illustrative example employed to describe the invention herein, the total number of times by which the set of layer patterning processing steps is repeated is $M_2/3$.

The set of layer patterning processing steps comprises an anisotropic etch process that etches unmasked portions of a pair of a second continuous insulating layer 232L and a second continuous sacrificial material layer 242L, and a mask trimming process in which the second trimmable etch mask layer 222 is isotropically trimmed to provide shifted sidewalls that are shifted by a respective trimming distance. FIGS. 12A and 12B illustrates the exemplary structure after a final anisotropic etch process, which is performed after the last mask trimming process.

A second stepped cavity 223 can be formed within each area of the rectangular opening in the second hard mask layer 220. Each second stepped cavity 223 can include a cliff region in which a tapered sidewall of the second vertically alternating sequence vertically extends from the bottommost patterned layer of the second vertically alternating sequence (232L, 242L) to the topmost layer of the second vertically alternating sequence (232L, 242L). Each second stepped cavity 223 has respective second stepped surfaces as stepped bottom surfaces. Each second stepped cavity 223 has a pair of stepped sidewalls that laterally extend along the first horizontal direction hd1. Each stepped sidewall of the second stepped cavity 223 adjoins the second stepped surfaces at the bottom edge, and extends to the top surface of the topmost layer of the second vertically alternating sequence (232L, 242L) to form a staircase region.

Pairs of staircase regions can be arranged along the second horizontal direction hd2 with an alternating lateral offsets along the first horizontal direction hd1 to provide a staggered configuration for the staircase regions. In other words, upon sequentially numerically labeling pairs of staircase regions with positive integers starting with 1 along the second horizontal direction hd2 (each pair being labeled with a same number), every odd-numbered pair of staircase regions (such as a first pair PSR1 of staircase regions) may be closer to the first memory array region 100A than to the second memory array region 100B, and every even-numbered pair of staircase regions (such as a second pair PSR2 of staircase regions) may be closer to the second memory array region 100B than to the first memory array region 100A.

Referring to FIGS. 13A-13H and 14, the processing steps of FIGS. 5A-9E can be performed second staircase regions including respective P sets of second stepped surfaces. For example, the second trimmable etch mask layer 222 can be removed after the final anisotropic etch process, for example, by ashing. The second hard mask layer 320 can be removed selective to the materials of the second vertically alternating sequence (232L, 242L), for example, by an isotropic etch process (such as a wet etch process).

A first second-tier recess etch mask layer (not shown) can be formed over the exemplary structure by applying and lithographically patterning an etch mask material. In one embodiment, the first second-tier recess etch mask layer may include a photoresist material that is applied over the exemplary structure, and is subsequently patterned by lithographic exposure and development. The first second-tier recess etch mask layer may cover a set of second stepped surfaces within each row of P sets of second stepped surfaces that are arranged along the first horizontal direction hd1, and may include a rectangular opening in which all other sets of second stepped surfaces among the row of P sets of second stepped surfaces are physically exposed. In an illustrative example, if three sets of second stepped surfaces underlying a respective second stepped cavity 223 is present within each cluster of second stepped surfaces (i.e., if P is 3), a first set of second stepped surfaces can be covered with the first second-tier recess etch mask layer while a second set and a third set of second stepped surfaces are physically exposed within an opening in the first second-tier recess etch mask layer. An opening in the first second-tier etch mask layer overlies each staircase region underlying the first retro-stepped dielectric material portions 165.

According to an aspect of the present disclosure, two disjoined rectangular openings may be formed through the first second-tier recess etch mask layer over each 2×P array of second stepped cavities 223. In this case, one second stepped cavity 223 per each row of P second stepped cavities may be covered by the first second-tier recess etch mask layer. A row of (P−1) second stepped cavities 223 may be physically exposed within a first opening in the first second-tier recess etch mask layer within the area of the 2×P array of second stepped cavities 223. Another row of (P−1) second stepped cavities 223 may be physically exposed within a second opening in the first second-tier recess etch mask layer within the area of the 2×P array of second stepped cavities 223. A strip of the first second-tier recess etch mask layer is present between the two openings (which may be rectangular openings) in the first second-tier recess etch mask layer that overlie a respective row of (P−1) second stepped cavities 223.

A first second-tier area recess etch process can be performed to vertically shift the levels of the physically exposed second stepped surfaces by a vertical recess distance. In one embodiment, the vertical recess distance may be the same as, or may be substantially the same as, the maximum depth of each second stepped cavity 223 as formed at the processing steps of FIGS. 12A and 12B (as measured from the horizontal plane including the topmost surface of the second vertically alternating sequence (232L, 242L). The first second-tier etch mask layer can be subsequently removed, for example, by ashing.

A second second-tier recess etch mask layer (not shown) can be formed over the exemplary structure by applying and lithographically patterning an etch mask material. In one embodiment, the second second-tier recess etch mask layer may include a photoresist material that is applied over the exemplary structure, and is subsequently patterned by lithographic exposure and development. According to an aspect of the present disclosure, the second second-tier recess etch mask layer may cover two sets of second stepped surfaces among the multiple sets of second stepped surfaces that are arranged along the first horizontal direction hd1 (such as a row of P sets of second stepped surfaces), and may include a rectangular opening in which all other sets of second stepped surfaces among the multiple sets of second stepped surfaces are physically exposed. In an illustrative example, if three sets of second stepped surfaces underlying a respective second stepped cavity 223 is present within each cluster of second stepped surfaces (i.e., if P is 3), a first set and a second set of second stepped surfaces can be covered with the second second-tier recess etch mask layer while a third set of second stepped surfaces is physically exposed within an opening in the second second-tier recess etch mask layer.

According to an aspect of the present disclosure, a single rectangular opening may be formed through the second second-tier recess etch mask layer over each 2×P array of second stepped cavities 223. In this case, two second stepped cavities 223 per each row of P second stepped cavities may be covered by the second second-tier recess etch mask layer. Two rows of (P−2) second stepped cavities 223 may be physically exposed within an opening in the second second-tier recess etch mask layer within the area of the 2×P array of second stepped cavities 223. Thus, a strip-shaped area between the two rows of (P−2) second stepped cavities 223 is physically exposed within the opening in the second second-tier recess etch mask layer within the area of the 2×P array of second stepped cavities 223.

A second second-tier area recess etch process can be performed to vertically shift the levels of the physically exposed second stepped surfaces by a vertical recess distance. In one embodiment, the vertical recess distance may be the same as, or may be substantially the same as, the maximum depth of each second stepped cavity 223 as formed at the processing steps of FIGS. 12A and 12B (as measured from the horizontal plane including the topmost surface of the second vertically alternating sequence (232L, 242L). The second second-tier recess etch mask layer can be subsequently removed, for example, by ashing.

Generally, the processing steps of FIGS. 3A-9D can be performed with any needed changes to form two interconnected staircase regions within each area of a 2×P array of sets of second stepped surfaces. According to an aspect of the present disclosure, at least one recess etch mask layer can include a single rectangular opening within each area of a 2×P array of second stepped surfaces such that a strip portion 230 of the second vertically alternating sequence (232L, 242L) between the two rows of P second stepped surfaces is etched during a subsequent area recess etch process. Additionally, at least another recess etch mask layer can include a pair of rectangular openings within each area of a 2×P array of second stepped surfaces such that a strip portion 230 of the second vertically alternating sequence (232L, 242L) between the two rows of P second stepped surfaces is not etched during a subsequent area recess etch process. The set of processing steps of FIGS. 12A and 12B that forms the second stepped surfaces do not etch the strip portion 230 of the second vertically alternating sequence (232L, 242L) between the two rows of P second stepped surfaces.

According to an aspect of the present disclosure, the combination of etch process is employed such that a first subset of the etch processes does not etch a strip portion 230 of the second vertically alternating sequence (232L, 242L) between two rows of P second stepped surfaces within each 2×P array of second stepped surfaces, and a second subset of the etch processes etches the strip portion 230 of the second vertically alternating sequence (232L, 242L). This combination results in a hybrid etch profile, in which the strip portion 230 of the second vertically alternating sequence (232L, 242L) between two rows of P second stepped surfaces within each 2×P array of second stepped surfaces is only partially etched to provide a recessed horizontal surface of the second vertically alternating sequence (232L, 242L) between the two rows of P second stepped surfaces within each 2×P array of second stepped surfaces.

A continuous stepped cavity can be formed within each area of the 2×P array of second stepped surfaces such that the continuous stepped cavity includes two pairs of staircase surfaces that are interconnected with a partly recessed volume between the two deepest portions of the two pairs of staircase surfaces. The resulting topographical profile is conducive to lithographic patterning of the recess etch mask layers because the height variation of the recess etch mask layers can be reduced by not fully etching the strip portion 230 of the second vertically alternating sequence (232L, 242L) between the two rows of P second stepped surfaces within each 2×P array of second stepped surfaces. Anomalous lithographically patterned shapes in the recess etch mask layers due to an excessive thickness of the recess etch mask layers can be avoided. Further, the resulting topographical profile is conducive to subsequent filling of the continuous stepped cavity with a dielectric fill material because narrow and deep cavity volumes can be avoided, which would have resulted if the strip portion of the second vertically alternating sequence (232L, 242L) between the two rows of P second stepped surfaces within each 2×P array of second stepped surfaces were not etched at all. Thus, the topographical profile of embodiments of the present disclosure provides lithographic patterning of the recess etch mask layers with a sufficiently wide lithographic process window and filling of the continuous stepped cavities that are formed in the second vertically alternating sequence (232L, 242L) without gaps or while minimizing the size of the gaps.

A second dielectric fill material (such as undoped silicate glass (i.e., silicon oxide) or a doped silicate glass) can be deposited in each second continuous retro-stepped cavity. The second dielectric fill material can be planarized to remove excess portions of the second dielectric fill material from above the horizontal plane including the topmost surface of the second vertically alternating sequence (232L, 242L). Each remaining portion of the second dielectric fill material that fills a respective second continuous retro-stepped cavity constitutes a second-tier retro-stepped dielectric material portion 265. In one embodiment, each second retro-stepped dielectric material portion 265 can be formed within volumes of a pair of staircase regions and an interconnecting volume located between the second staircase region and the second staircase region and overlying the horizontal plane that includes the horizontal surface of a recessed portion of the second vertically alternating sequence (232L, 242L).

Generally, a 2×P array of stepped surfaces (such as the second stepped surfaces) can be formed within an upper region of a vertically alternating sequence (such as the second vertically alternating sequence (132L, 242L) by patterning a subset of the unit layer stacks (such as unit layer stacks of a second continuous insulating layer 232L and a second continuous sacrificial material layer 242L). P stepped surfaces can be arranged in each row extending along a second horizontal direction hd2 within the 2×P array, and two stepped surfaces are arranged in each column extending along a second horizontal direction hd1 within the 2×P array. P is an integer greater than 2, such as an integer between, and including, 2 and 20, and/or between, and including, 3 and 5.

Each column of stepped surfaces other than one column of stepped surfaces can be vertically extending by performing a set of processing sequences at least once. The set of processing sequences comprises forming a patterned etch mask layer, and etching an unmasked subset of the 2×P array employing a respective anisotropic etch process. One or more patterned etch mask layer employed within the set of processing steps has a respective continuous opening including an entire area of a respective 2×R array of stepped surfaces that is a subset of the 2×P array of stepped surfaces. Each R is an integer less than P. Optionally, at least one additional patterned etch mask layer employed within the set of processing steps has a pair of disjoined openings within an area of a respective 2×S array of stepped surfaces that is a subset of the 2×P array of stepped surfaces. Each S is an integer less than P.

According to an aspect of the present disclosure, a first staircase region is formed within a continuous area including an entire area of a second 2×P array of stepped surfaces within the 2×P array of stepped surfaces, and a second staircase region is formed within a continuous area including an entire area of a second 2×P array of stepped surface within the 2×P array of stepped surfaces. In one embodiment, the first staircase region and the second staircase region are interconnected to each other along the second horizontal direction hd2 within an area of at least one column of stepped surfaces (such as a pair of the two deepest second stepped surfaces). In one embodiment, the first staircase region and the second staircase region are not interconnected to each other along the second horizontal direction hd2 within an area of at least another column of the stepped surfaces (such as a pair of the two shallowest second stepped surfaces).

In one embodiment, each second continuous sacrificial material layer 242L within the second vertically alternating sequence (232L, 242L) comprises a respective surface that is physically exposed to the first staircase region, and each second continuous sacrificial material layer 242L within the second vertically alternating sequence (232L, 242L) comprises a respective additional surface that is physically exposed to the second staircase region.

According to an aspect of the present disclosure, a second retro-stepped dielectric material portion 265 is formed in a continuous volume from which the material of the second vertically alternating sequence (232L, 242L) is removed within the area of the 2×P array of second stepped surfaces. The second retro-stepped dielectric material portion 265 overlies two staircase regions of the second vertically alternating sequence (132L, 242L). The second retro-stepped dielectric material portion 265 has a vertical cross-sectional profile within a vertical plane that is perpendicular to the second horizontal direction hd2, in which a first boundary B1' (illustrated in FIG. 13H) of the second retro-stepped dielectric material portion 265 continuously extends from the second horizontal plane HP2 including a bottommost surface of the second retro-stepped dielectric material portion 265 to a third horizontal plane HP3 including topmost surfaces of the second vertically alternating sequence (232L, 242L), and a second boundary B2' (illustrated in FIG. 13H) of the second retro-stepped dielectric material portion 265 continuously extends from the second horizontal plane HP2 to a horizontal plane including a top surface of a recessed portion (e.g., the strip portion 230) of the second vertically alternating sequence (232L, 242L) that is located a height located between the second horizontal plane HP2 and the third horizontal plane HP3.

Figure 13A:
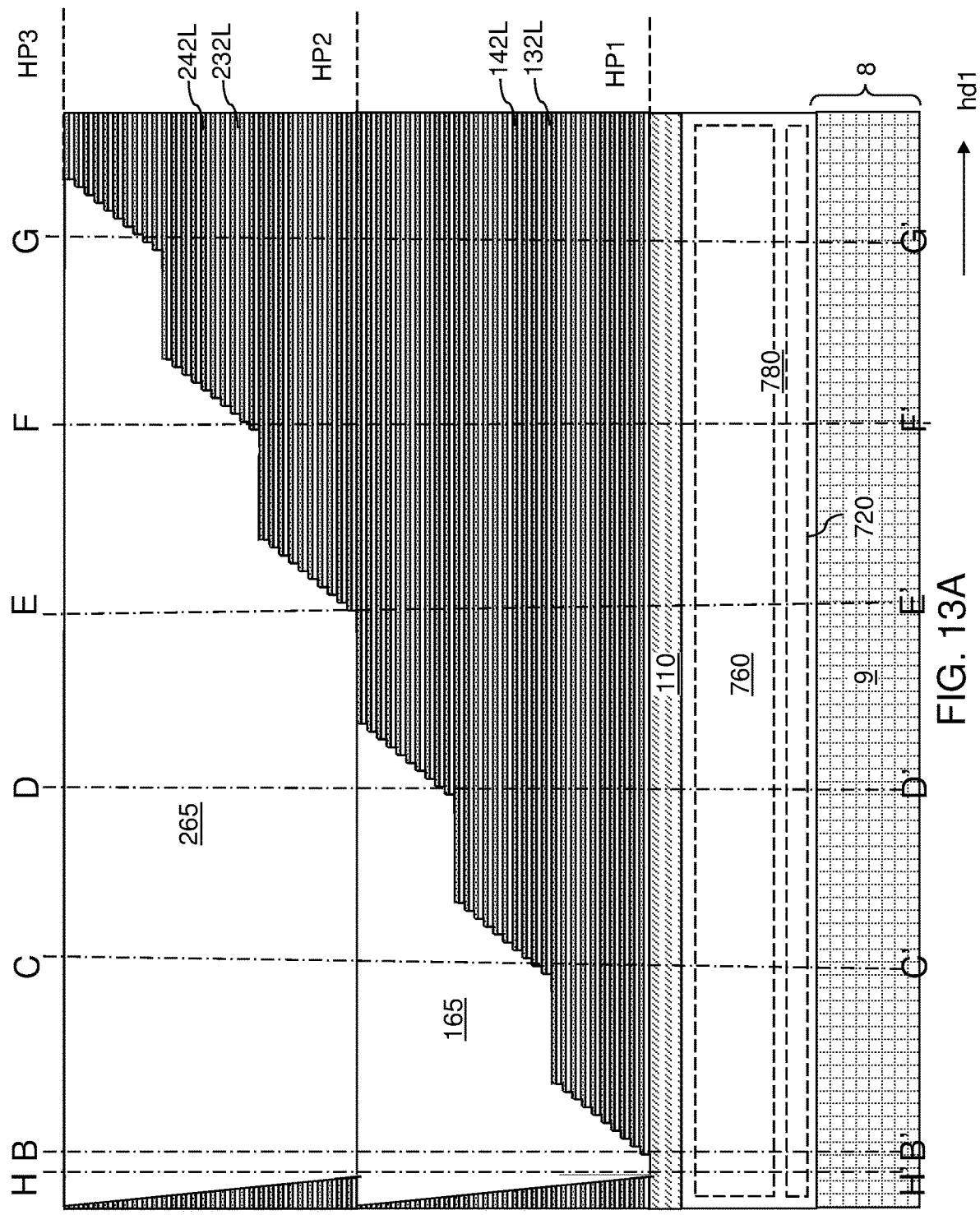
FIG. 13A is a vertical cross-sectional view of the exemplary structure along the first horizontal direction after formation of a second retro-stepped dielectric material portion according to an embodiment of the present disclosure.
Figure 13B:
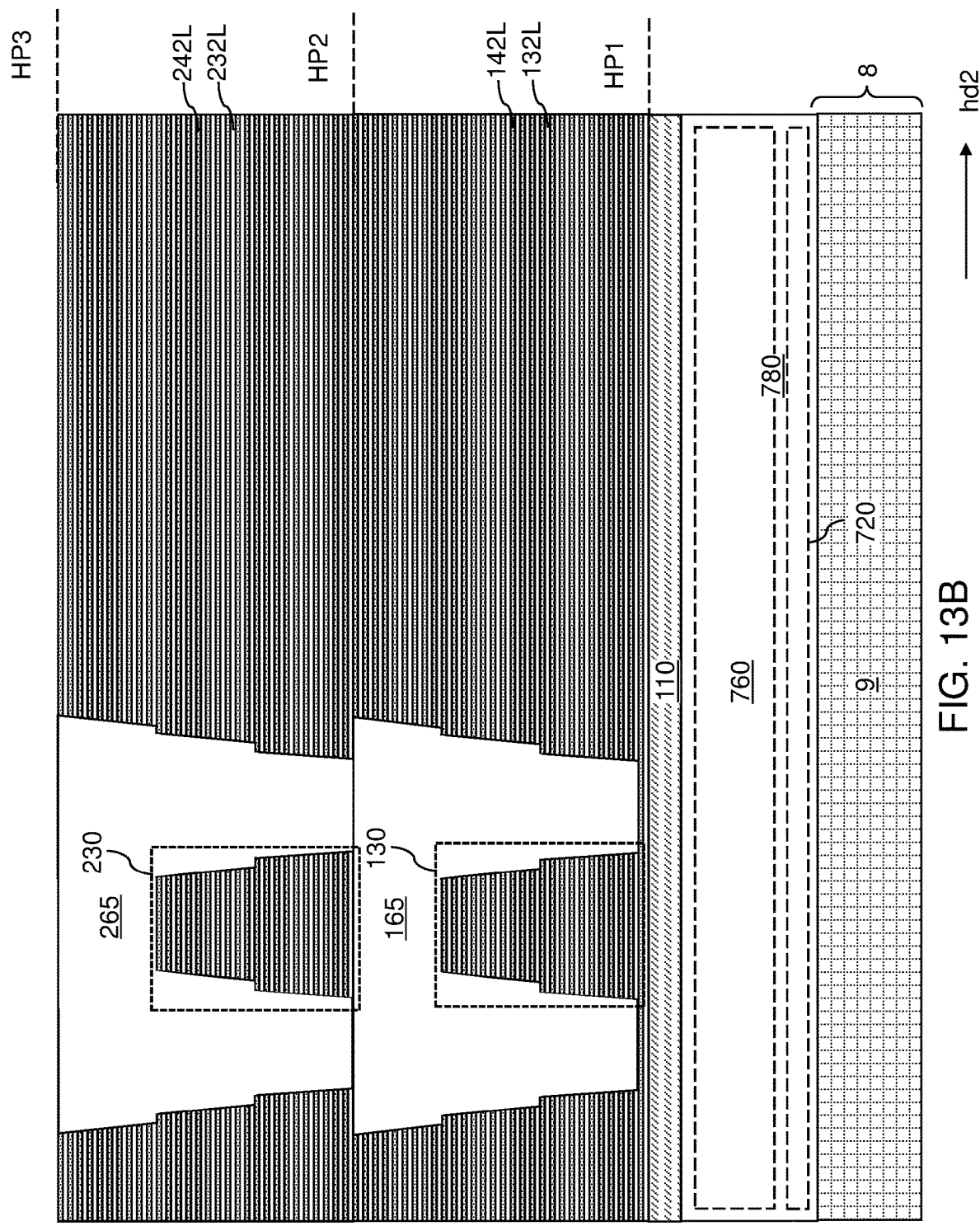
FIG. 13B is a vertical cross-sectional view of the exemplary structure along a vertical plane B-B' of FIG. 13A.
Figure 13C:
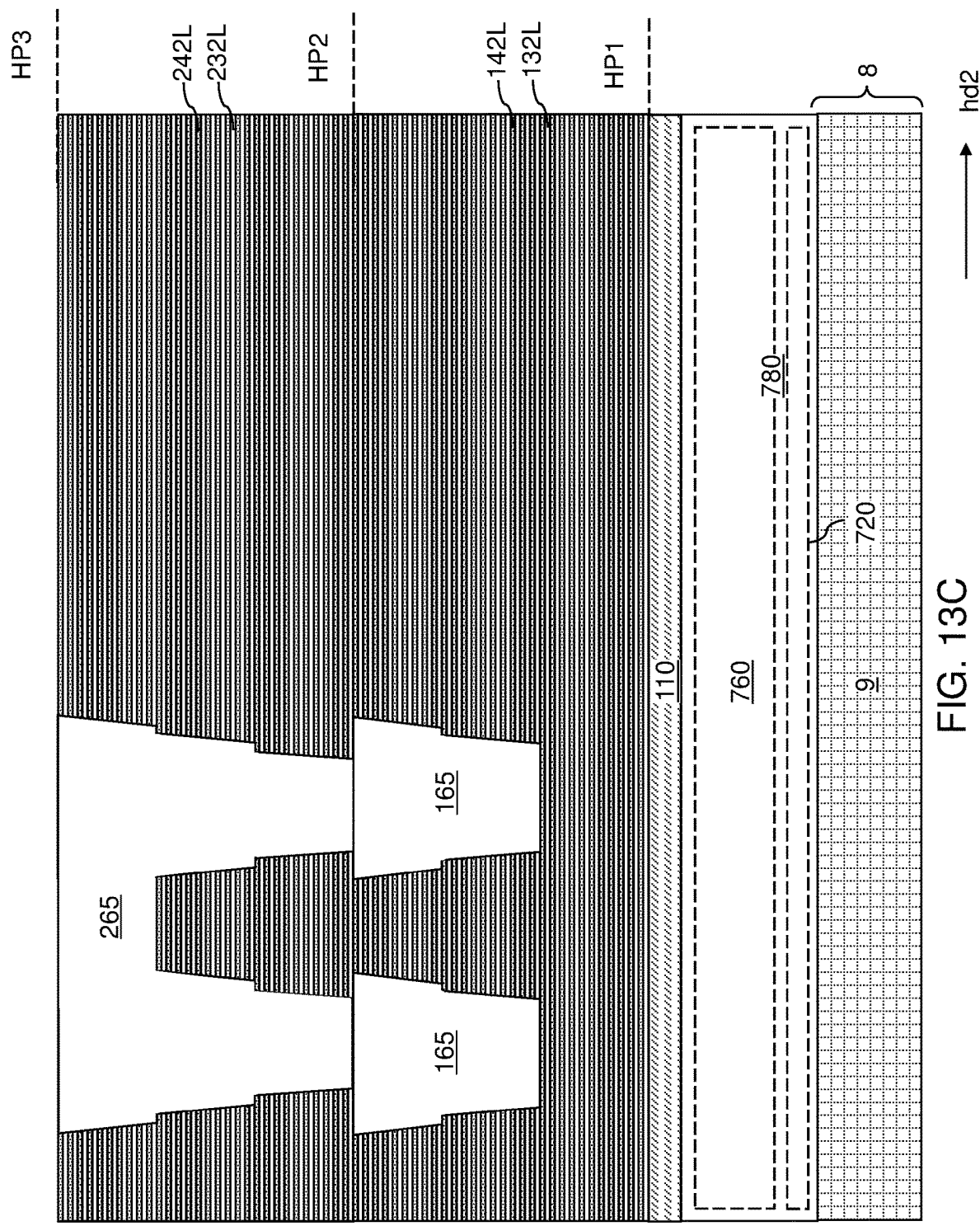
FIG. 13C is a vertical cross-sectional view of the exemplary structure along a vertical plane C-C' of FIG. 13A.
Figure 13D:
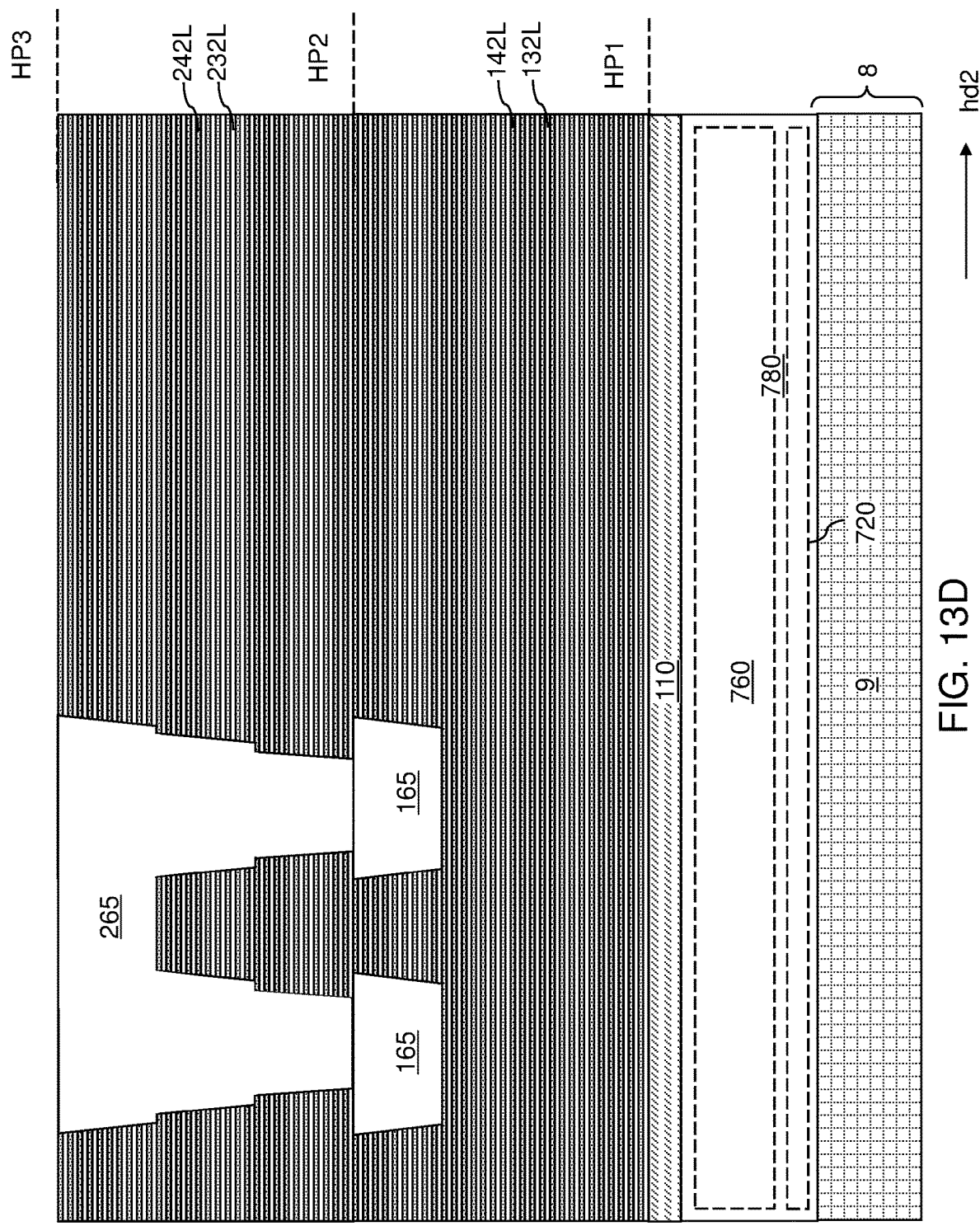
FIG. 13D is a vertical cross-sectional view of the exemplary structure along a vertical plane D-D' of FIG. 13A.
Figure 13E:
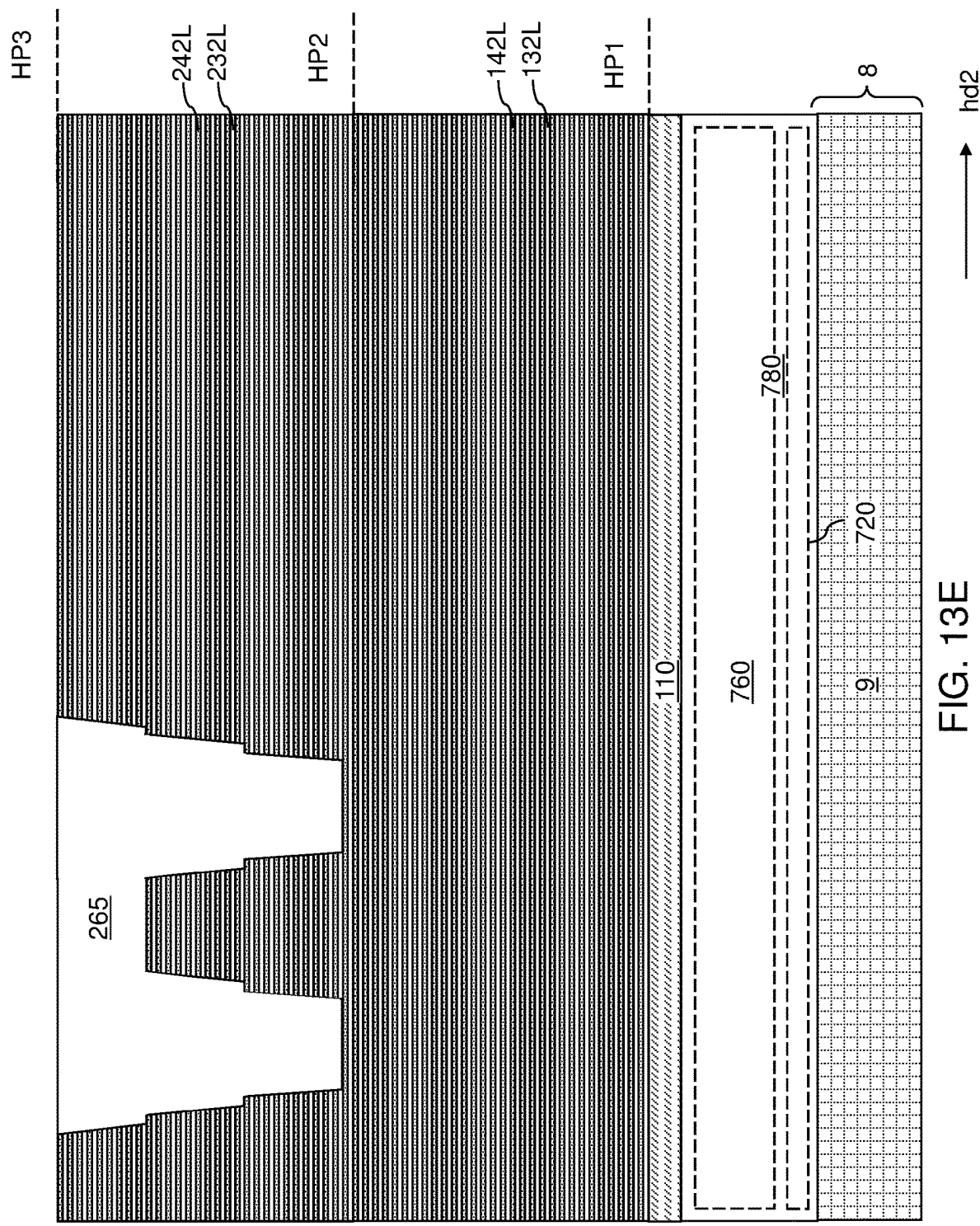
FIG. 13E is a vertical cross-sectional view of the exemplary structure along a vertical plane E-E' of FIG. 13A.
Figure 13F:
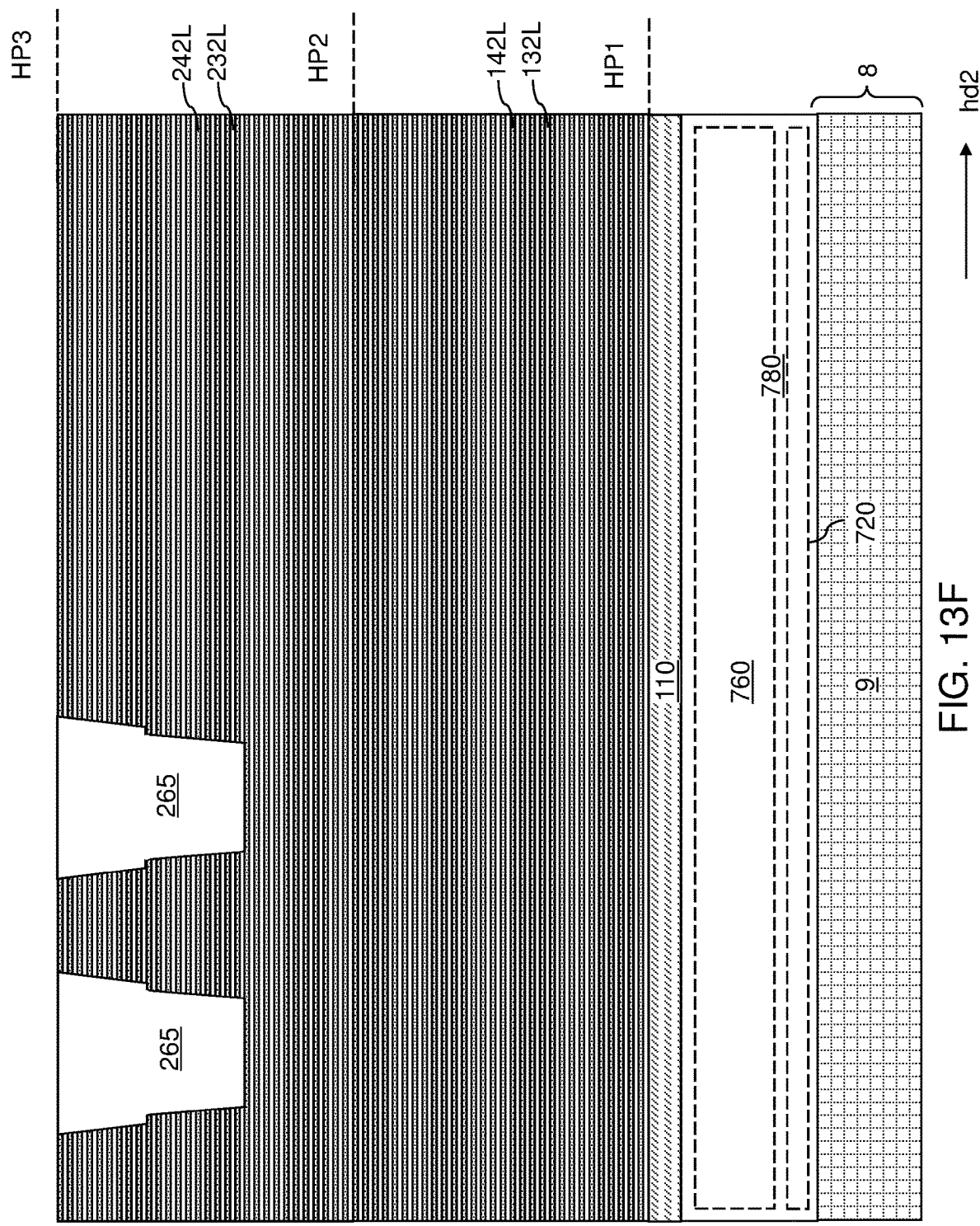
FIG. 13F is a vertical cross-sectional view of the exemplary structure along a vertical plane F-F' of FIG. 13A.
Figure 13G:
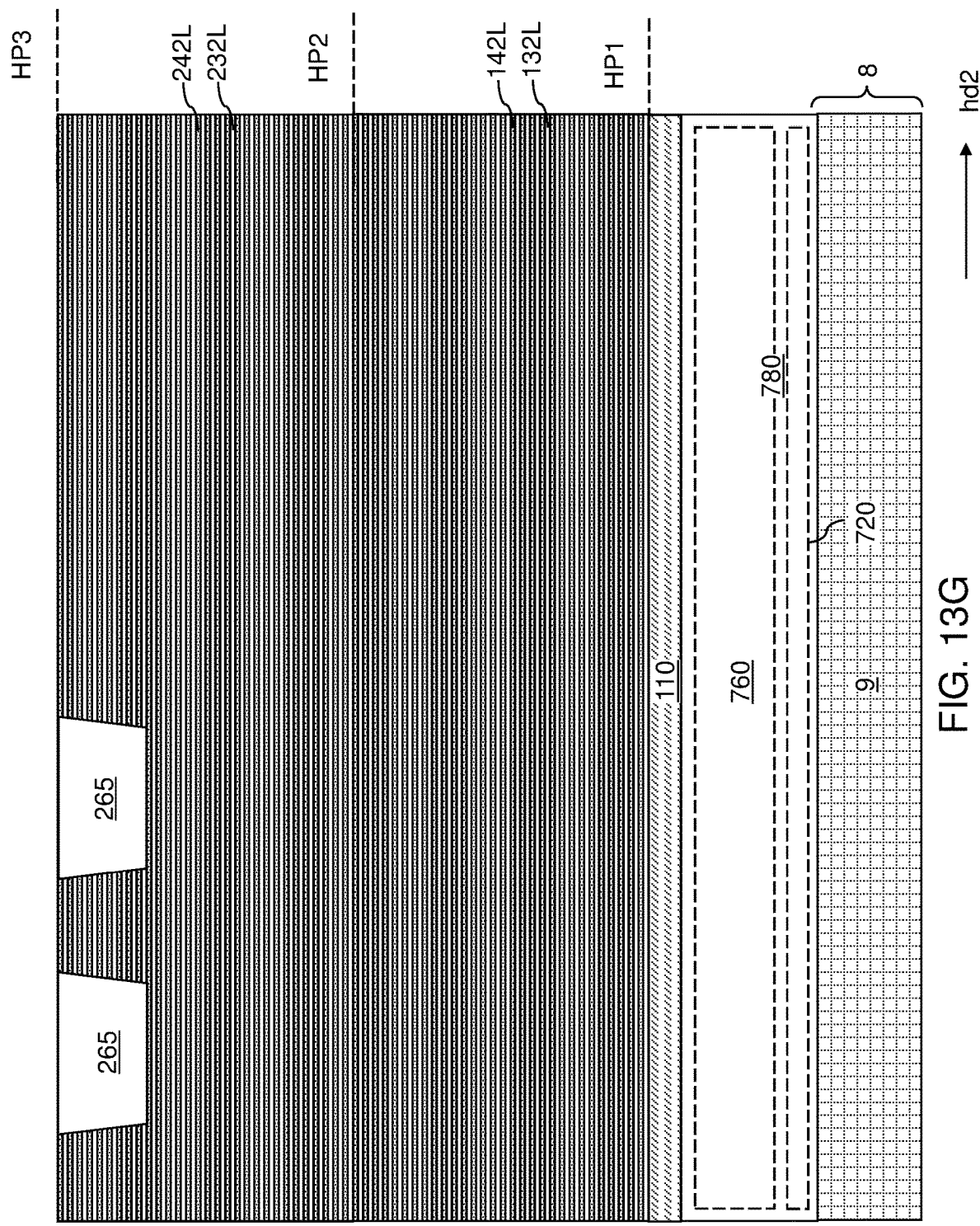
FIG. 13G is a vertical cross-sectional view of the exemplary structure along a vertical plane G-G' of FIG. 13A.
Figure 13H:
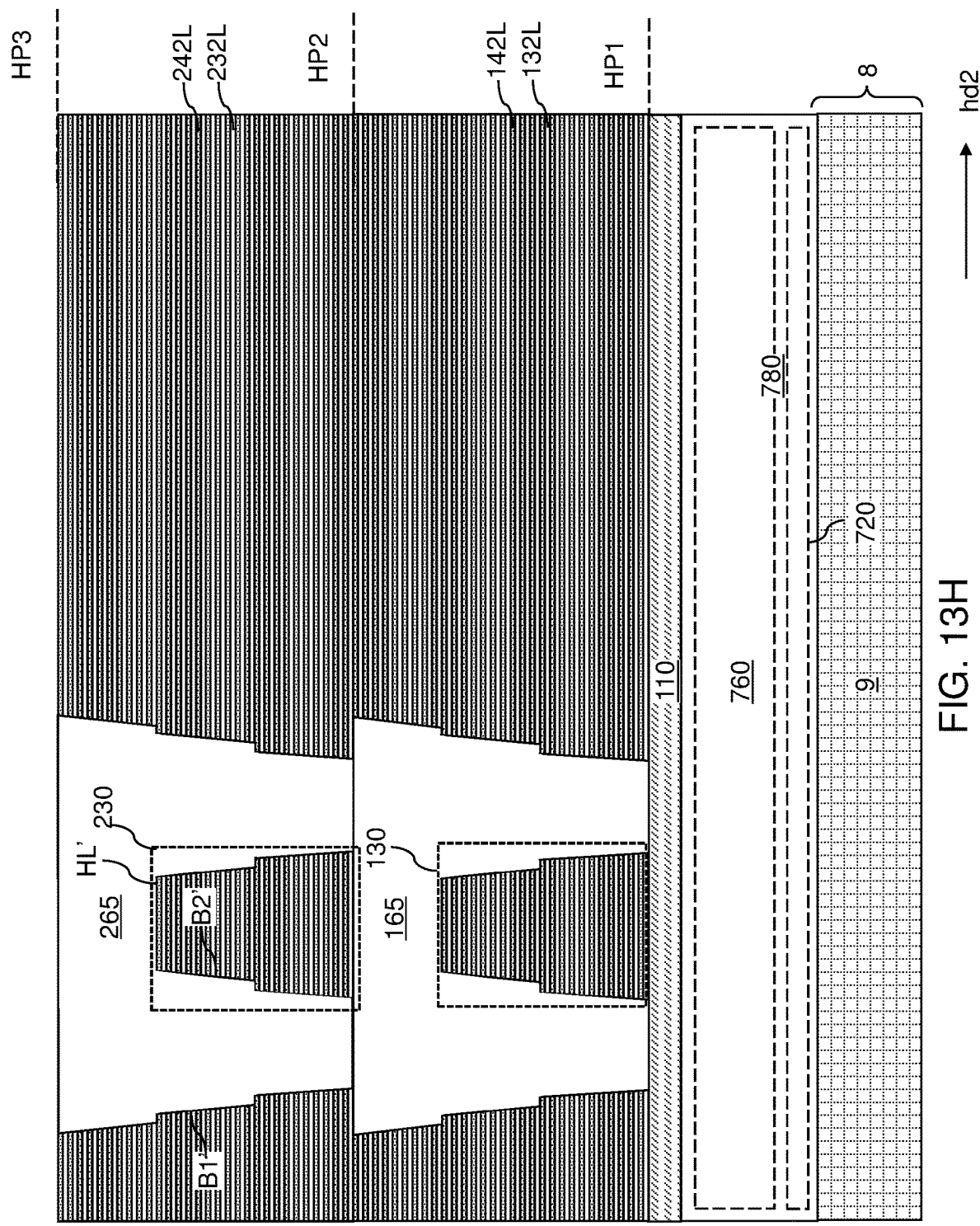
FIG. 13H is a vertical cross-sectional view of the exemplary structure along a vertical plane H-H' of FIG. 13A.
Figure 14:
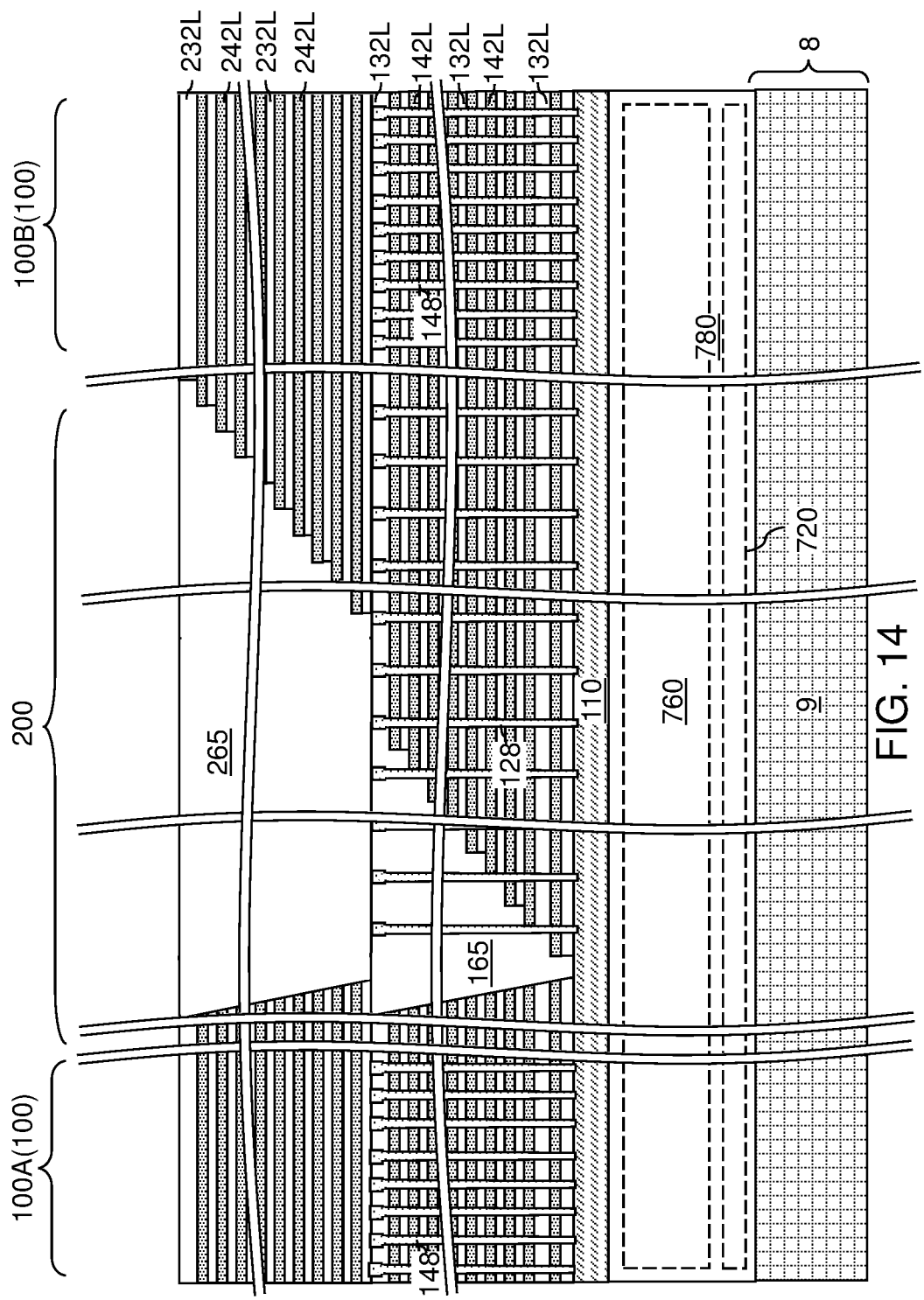
FIG. 14 is another vertical cross-sectional view of the exemplary structure at the processing steps of FIGS. 13A-13H.

In one embodiment, the second boundary B2' in the vertical cross-sectional profile extends to the horizontal plane which includes the horizontal line HL' (e.g., the top surface of the strip portion 230 illustrated in FIG. 13H). In one embodiment, a vertical distance between the horizontal line HL' and the second horizontal plane HP2 is in a range from 20% to 80% of a vertical distance between the second horizontal plane HP2 and the third horizontal plane HP3. In one embodiment, the second boundary B2' in the vertical cross-sectional profile comprises at least one tapered sidewall of the second vertically alternating sequence (132L, 242L).

In one embodiment, first boundary B1' comprises a plurality of tapered sidewalls that are interconnected to each other by at least one horizontal step. One of the at least one horizontal step is located at a same height as the horizontal line HL' of the second boundary B2' in the vertical cross-sectional profile.

Figure 15:
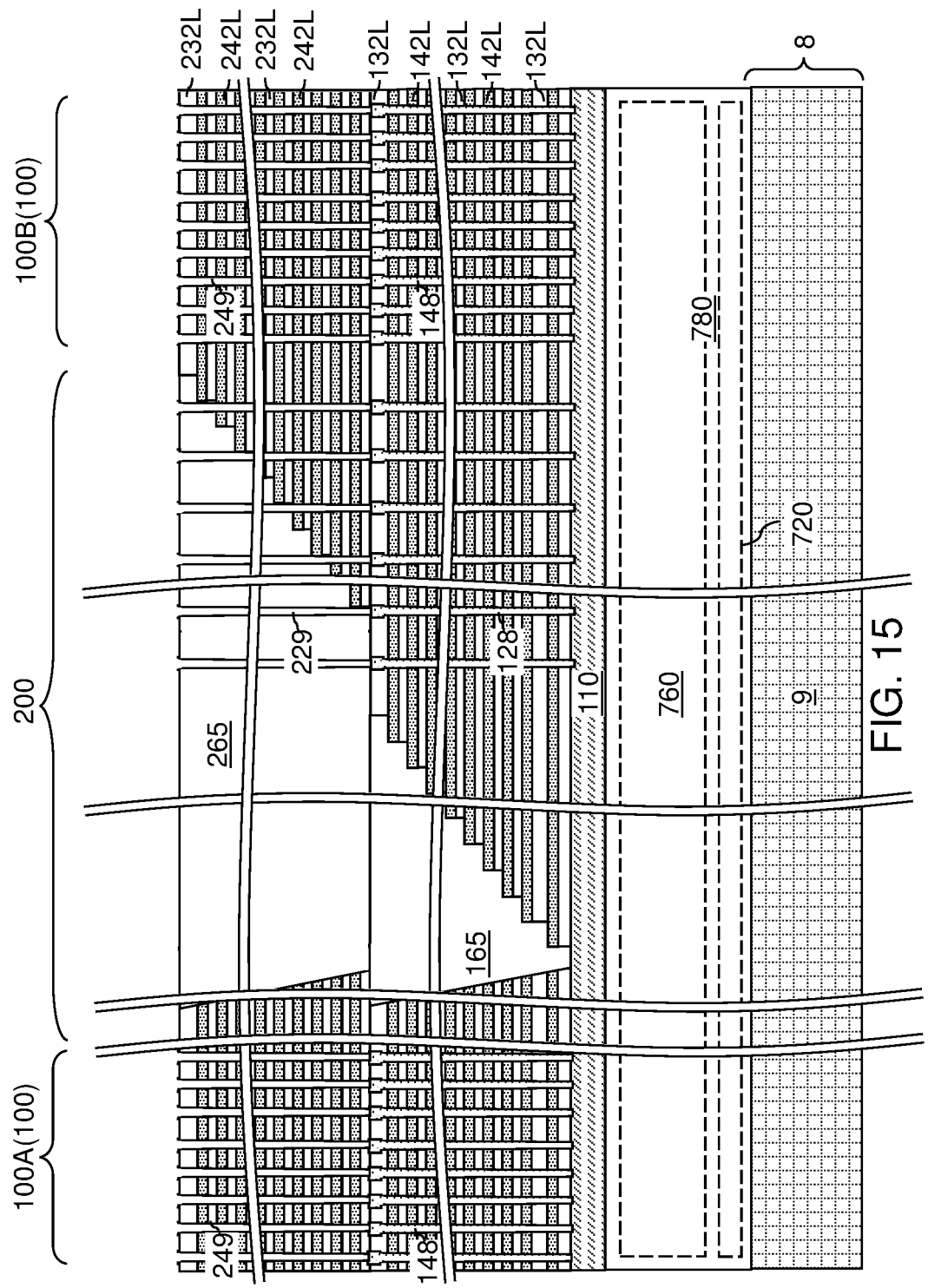
FIG. 15 is a vertical cross-sectional view of the exemplary structure after formation of second-tier openings through the second vertically alternating sequence according to an embodiment of the present disclosure.

Referring to FIG. 15, various second-tier openings (249, 229) may be formed through the second vertically alternating sequence (232L, 242L) and over the sacrificial first-tier opening fill portions (148, 128). A photoresist layer (not shown) may be applied over the second vertically alternating sequence (232L, 242L), and may be lithographically patterned to form various openings therethrough. The pattern of openings in the photoresist layer may be transferred through the second vertically alternating sequence (232L, 242L) to form the various second-tier openings (249, 229) concurrently, i.e., during the second isotropic etch process.

The various second-tier openings (249, 229) may include second-tier memory openings 249 formed in the memory array regions 100 and second-tier support openings 229 formed in the inter-array region 200. Each second-tier opening (249, 229) may be formed within the area of a respective one of the sacrificial first-tier opening fill portions (148, 128). Thus, a top surface of a sacrificial first-tier opening fill portion (148, 128) can be physically exposed at the bottom of each second-tier opening (249, 229). Specifically, each second-tier memory openings 249 can be formed directly over a respective sacrificial first-tier memory opening fill portion 148, and each second-tier support opening 229 can be formed directly over a respective sacrificial first-tier support opening fill portion 128. Each cluster of second-tier memory openings 249 may be formed as a two-dimensional array of second-tier memory openings 249. The second-tier support openings 229 are openings that are formed in the inter-array region 200, and are subsequently employed to form support pillar structures. A subset of the second-tier support openings may be formed through a respective horizontal surface of the second stepped surfaces.

Figure 16:
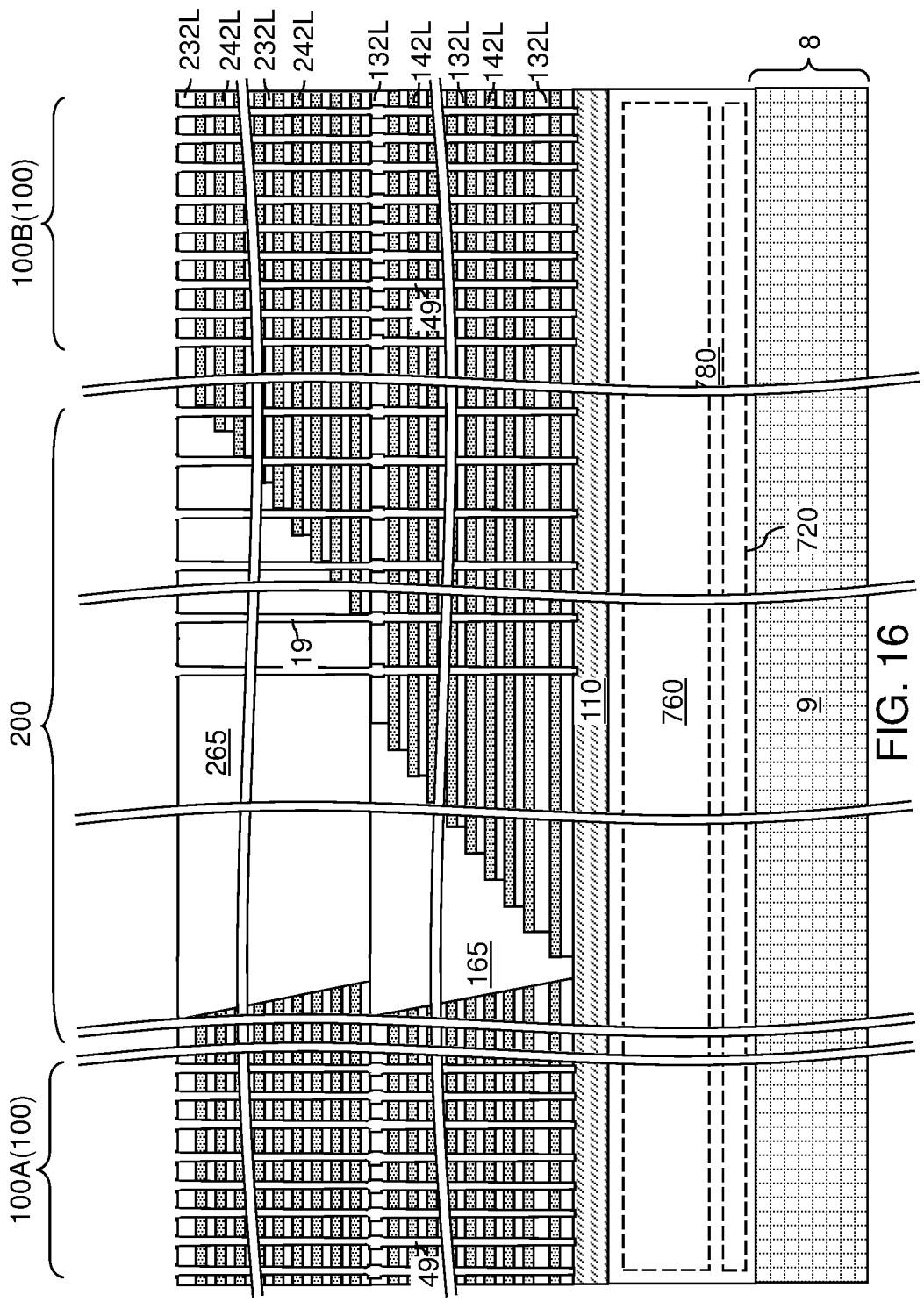
FIG. 16 is a vertical cross-sectional view of the exemplary structure after formation of inter-tier memory openings and inter-tier support openings according to an embodiment of the present disclosure.

Referring to FIGS. 16 and 17A, the sacrificial first-tier fill material of the sacrificial first-tier opening fill portions (148, 128) may be removed using an etch process that etches the sacrificial first-tier fill material selective to the materials of the first and second continuous insulating layers (132L, 232L) and the first and second continuous sacrificial material layers (142L, 242L). A memory opening, which is also referred to as an inter-tier memory opening 49, is formed in each combination of a second-tier memory openings and a volume from which a sacrificial first-tier memory opening fill portion 148 is removed. A support opening, which is also referred to as an inter-tier support opening 19, is formed in each combination of a second-tier support openings and a volume from which a sacrificial first-tier support opening fill portion 128 is removed. The inter-tier memory opening 49 extends through the first-tier structure and the second-tier structure. Generally, memory openings 49 can be formed within each memory array region 100, in which each layer of the first vertically alternating sequence (132L, 142L) and each layer within the second vertically alternating sequence (232L, 242L) are present.

Referring to FIG. 17B, a stack of layers including a blocking dielectric layer 52, a charge storage layer 54, a tunneling dielectric layer 56, and a semiconductor channel material layer 60L may be sequentially deposited in the inter-tier memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into continuous sacrificial material layers (142L, 242L). In one embodiment, the charge storage layer 54 includes a silicon nitride layer. In one embodiment, the continuous sacrificial material layers (142L, 242L) and the continuous insulating layers (132L, 232L) may have vertically coincident sidewalls, and the charge storage layer 54 may be formed as a single continuous layer. Alternatively, the continuous sacrificial material layers (142L, 242L) may be laterally recessed with respect to the sidewalls of the continuous insulating layers (132L, 232L), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may have a uniform doping. In one embodiment, the semiconductor channel material layer 60L has a p-type doping in which p-type dopants (such as boron atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each inter-tier memory opening 49 that is not filled with the deposited material layers (52, 54, 56, 60L).

Figure 17C:
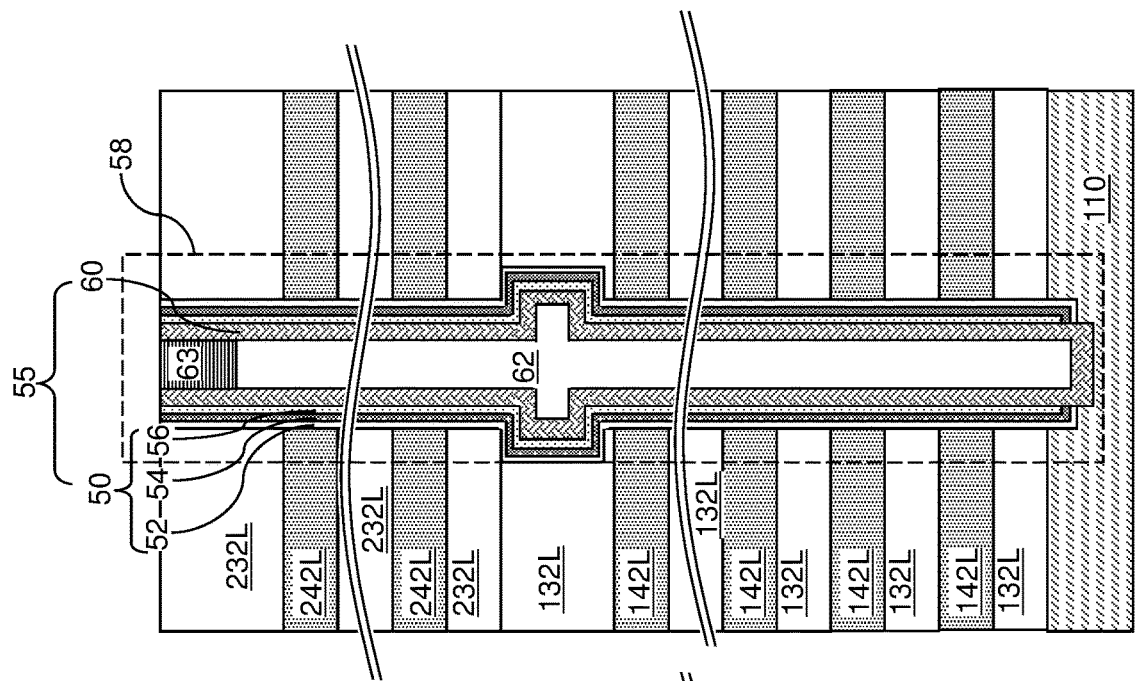

Referring to FIG. 17C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the top second continuous insulating layer 232L may be removed, for example, by a recess etch. The recess etch continues until top surfaces of the remaining portions of the dielectric core layer are recessed to a height between the top and bottom surfaces of the topmost second insulating layer 232L. Each remaining portion of the dielectric core layer constitutes a dielectric core 62.

Figure 17D:
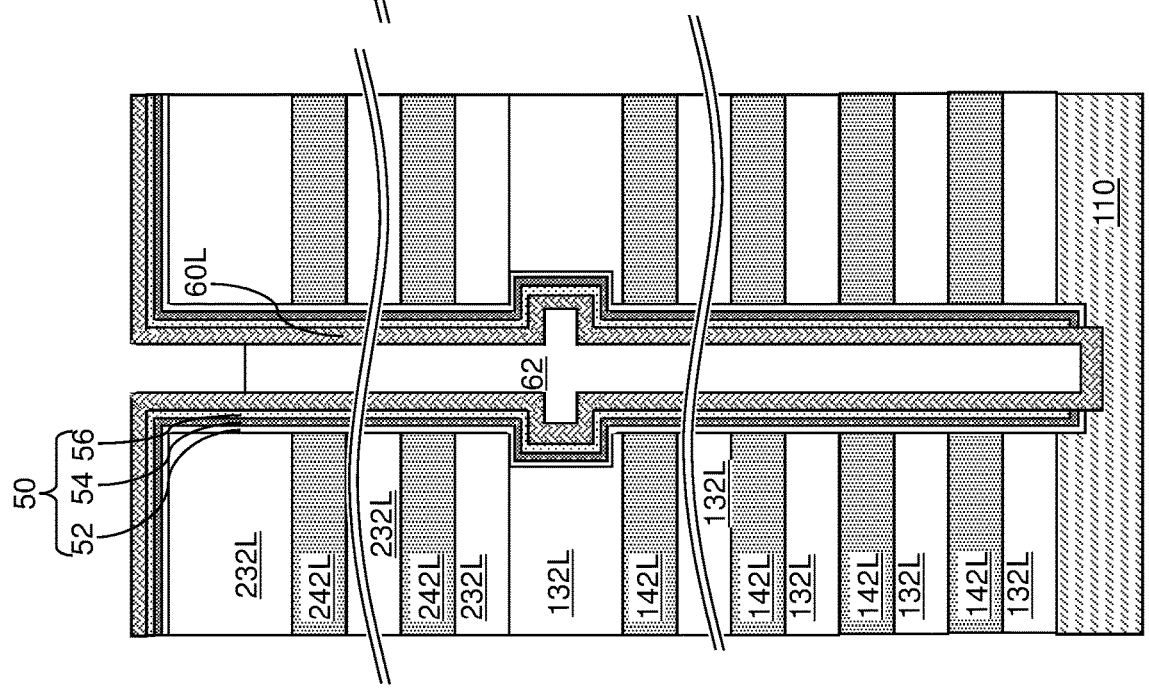

Referring to FIG. 17D, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the tunneling dielectric layer 56, the charge storage layer 54, and the blocking dielectric layer 52 that overlie the horizontal plane including the top surface of the topmost second continuous insulating layer 232L may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0 \times 10^{18}/cm^3$ to $2.0 \times 10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within an inter-tier memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. The memory stack structures 55 can be formed through memory array regions 100 of the first and second vertically alternating sequences in which all layers of the first and second vertically alternating sequences are present. Each combination of a memory stack structure 55, a dielectric core 62, and a drain region 63 within an inter-tier memory opening 49 constitutes a memory opening fill structure 58. Generally, memory opening fill structures 58 are formed within the memory openings 49. Each of the memory opening fill structures 58 comprises a respective memory film 50 and a respective vertical semiconductor channel 60.

In one embodiment, each of the memory stack structures 55 comprises vertical NAND string including the respective vertical stack of memory elements (as embodied as portions of a charge storage layer 54 located at levels of the continuous sacrificial material layers (142L, 242L) and a vertical semiconductor channel 60 that vertically extends through the continuous sacrificial material layers (142L, 242L) adjacent to the respective vertical stack of memory elements.

Figure 18:
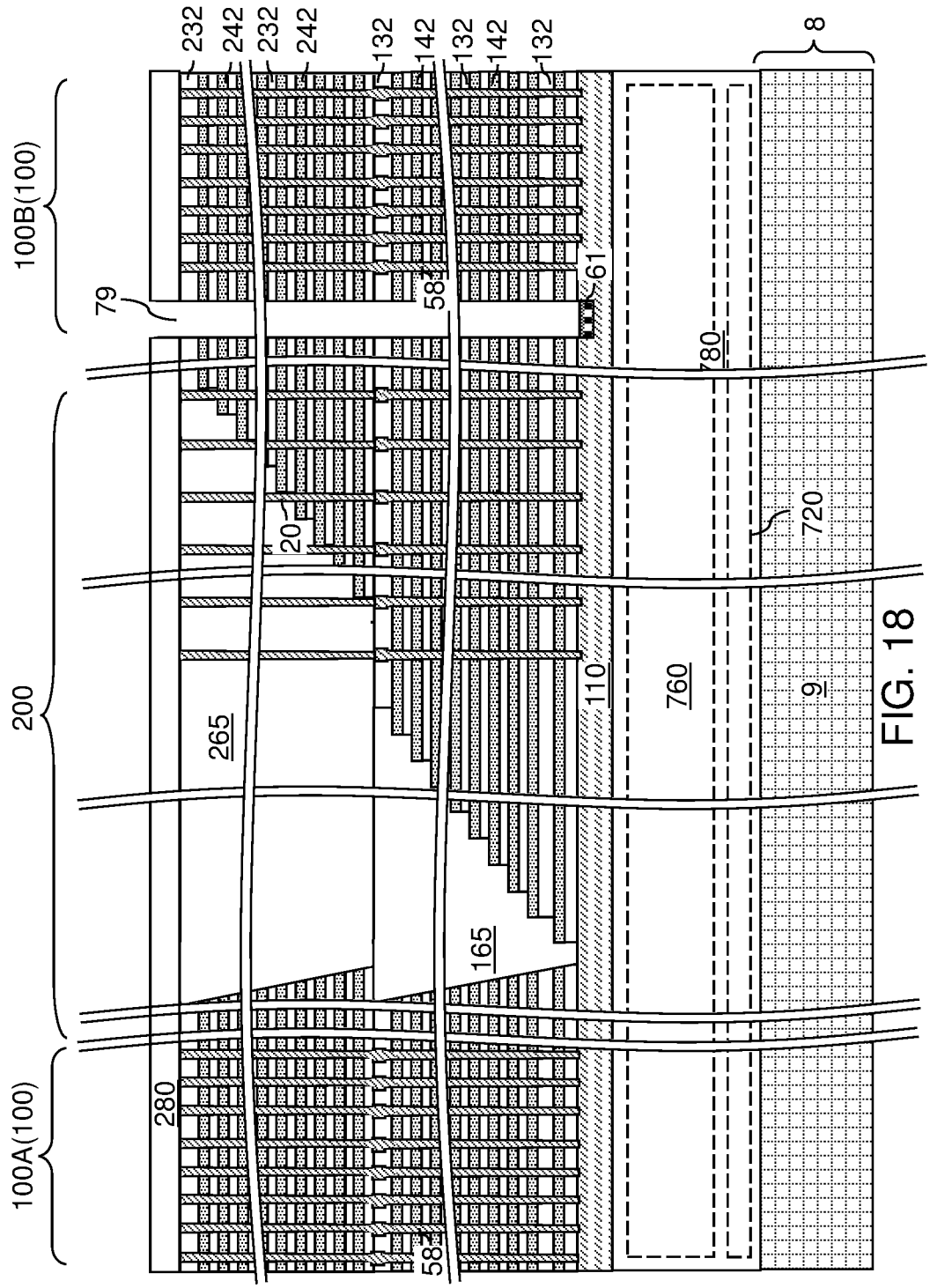
FIG. 18 is a schematic vertical cross-sectional view of the exemplary structure after formation of a contact-level dielectric layer, backside trenches, and source regions according to an embodiment of the present disclosure.
Figure 19A:
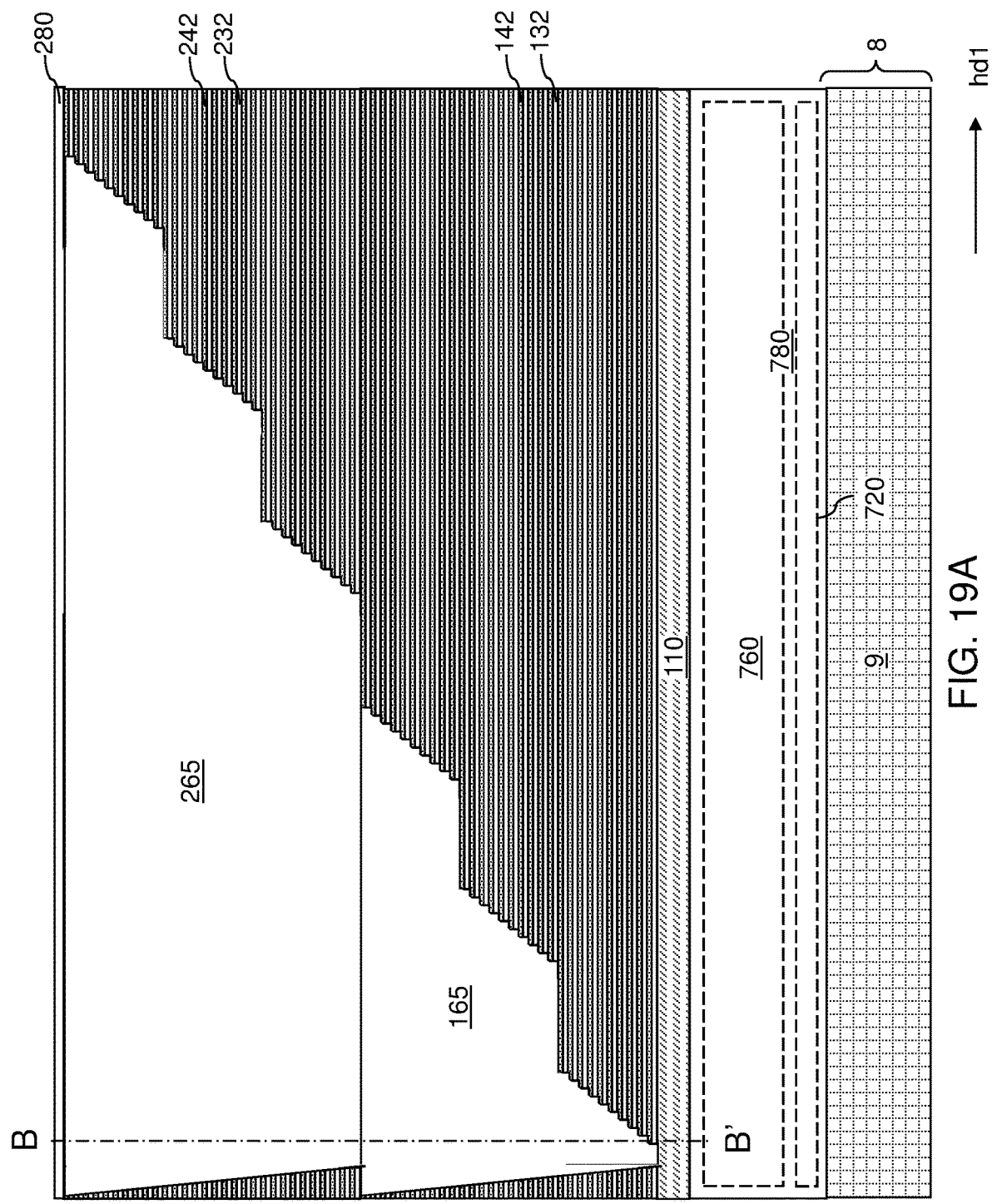
FIG. 19A is another vertical cross-sectional view of the exemplary structure of FIG. 18.
Figure 19B:
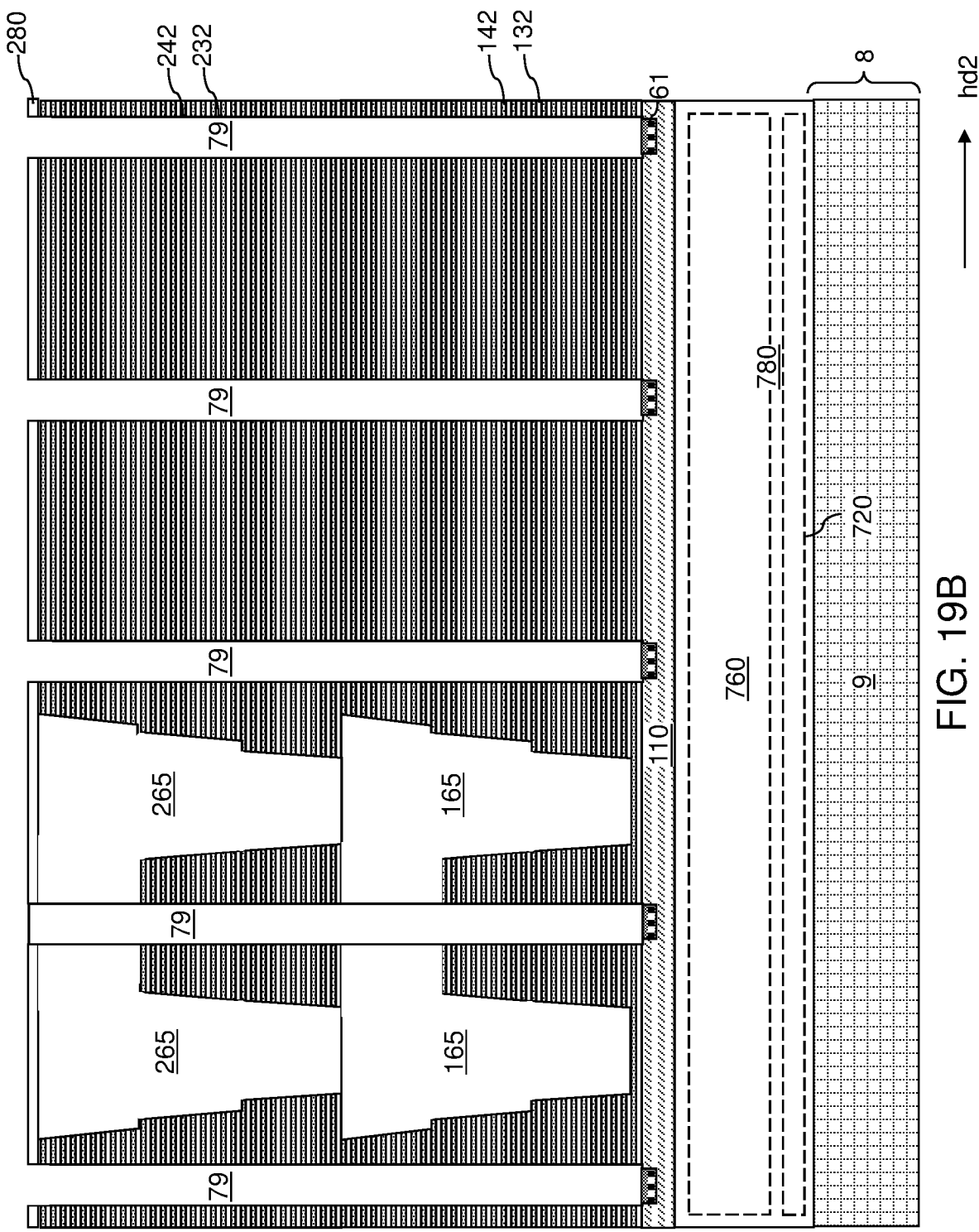
FIG. 19B is a vertical cross-sectional view of the exemplary structure along a vertical plane B-B' of FIG. 19A.

Referring to FIGS. 18, 19A, and 19B, each inter-tier support opening can be filled with a respective set of material portions having the same material composition as a corresponding component in a memory opening fill structure 58 during the processing steps of FIGS. 17B-17D. Each set of material portions filling an inter-tier support opening is herein referred to as a support pillar structure 20. It is noted that the support pillar structures 20 are not illustrated in FIGS. 1A-1E for the purpose of clarity. The semiconductor material layer 110, the first-tier structure (132L, 142L, 165), the second-tier structure (232L, 242L, 265), the memory opening fill structures 58, and the support pillar structures 20 collectively constitute a memory-level assembly.

Generally, the support pillar structures 20 are formed in the inter-array region 200. The support pillar structures 20 include first support pillar structures 20 that vertically extend through the second vertically alternating sequence (232L, 242L), a first-tier retro-stepped dielectric material portion 165, and a portion of the first vertically alternating sequence (132L, 142L) that underlies the first-tier retro-stepped dielectric material portion 165. The support pillar structures 20 further include second support pillar structures 20 that vertically extend through a second-tier retro-stepped dielectric material portion 265, a portion of the second vertically alternating sequence (232L, 242L) that underlies the second-tier retro-stepped dielectric material portion 265, and each layer within the first vertically alternating sequence (132L, 142L).

A contact-level dielectric layer 280 may be formed over the second vertically alternating sequence (232L, 242L). The contact-level dielectric layer 280 includes a dielectric material such as silicon oxide, and may be formed by a conformal or non-conformal deposition process. For example, the contact-level dielectric layer 280 may include undoped silicate glass and may have a thickness in a range from 100 nm to 600 nm, although lesser and greater thicknesses may also be used.

A photoresist layer (not shown) may be applied over the contact-level dielectric layer 280, and may be lithographically patterned to form linear openings laterally extending along the first horizontal direction hd1 and laterally spaced apart along the second horizontal direction hd2. The pattern of the linear openings in the photoresist layer can be identical to the pattern of the trench fill structures 76 illustrated in FIGS. 1B-1E. The linear openings in the photoresist layer can be formed within areas in which memory opening fill structures 58 or the support pillar structures 20 are not present.

Backside trenches 79 be formed by transferring the pattern in the photoresist layer (not shown) through the contact-level dielectric layer 280, the second-tier structure (232L, 242L, 265), and the first-tier structure (132L, 142L, 165), and into the semiconductor material layer 110. The pattern of the backside trenches 79 can be identical to the pattern of the trench fill structures 76 illustrated in FIGS. 1B-1E. Portions of the contact-level dielectric layer 280, the second-tier structure (232L, 242L, 265), the first-tier structure (132L, 142L, 165), and the semiconductor material layer 110 that underlie the linear openings in the photoresist layer may be removed by an anisotropic etch process to form the backside trenches 79. In one embodiment, the backside trenches 79 may be formed between clusters of memory stack structures 55. The clusters of the memory stack structures 55 may be laterally spaced apart along the second horizontal direction hd2 by the backside trenches 79.

The backside trenches 79 can be formed as a periodic one-dimensional array with a periodicity along the second horizontal direction hd2. The backside trenches 79 can be sequentially numerically numbered with positive integers from one side to another along the second horizontal direction hd2. In one embodiment, every odd-numbered backside trench 79 can extend through the second vertically alternating sequence (232L, 242L) and the first vertically alternating sequence (132L, 142L) without etching through the first-tier retro-stepped dielectric material portions 165 or the second-tier retro-stepped dielectric material portions 265. Every even-numbered backside trench 79 can extend through the second vertically alternating sequence (232L, 242L) and the first vertically alternating sequence (132L, 142L) and cut through a respective first-tier retro-stepped dielectric material portion 165 and a respective second-tier retro-stepped dielectric material portion 265 and through the respective strip portions (130, 230) of the first and second alternating sequences.

Each vertically alternating sequence {(132L, 142L), (232L, 242L)} is divided into a plurality of alternating stacks of insulating layers (132 or 232) and sacrificial material layers (142, 242) (which correspond to volumes of memory blocks) by the backside trenches 79. Each backside trench 79 can laterally extend along the first horizontal direction hd1 through the inter-array region 200 and a pair of memory array regions 100 that are adjoined to inter-array region 200. Further, each backside trench 79 can vertically extend through an entire thickness of the vertically alternating sequences {(132L, 142L), (232L, 242L)}. Each patterned portion of the first vertically alternating sequence (132L, 142L) located between a neighboring pair of backside trenches 79 constitutes a first-tier alternating stack of first insulating layers 132 and first sacrificial material layers 142. Each patterned portion of the second vertically alternating sequence located between a neighboring pair of backside trenches 79 constitutes a second-tier alternating stack of second insulating layers 232L and second sacrificial material layers 242. A plurality of alternating stacks of insulating layers (132 or 232) and sacrificial material layers (which may be first sacrificial material layers 142 or second sacrificial material layers 242) can be formed.

Each first-tier retro-stepped dielectric material portion 165 may be divided into two disjoined first-tier retro-stepped dielectric material portions 165 by a backside trench 79. Each second-tier retro-stepped dielectric material portion 265 may be divided into two disjoined second-tier retro-stepped dielectric material portions 265 by a backside trench 79. Each contiguous combination of a first-tier alternating stack (132, 142) and a second-tier alternating stack (232, 242) can be laterally bounded by a neighboring pair of backside trenches 79. One of the neighboring pair of backside trenches 79 can divide a first-tier retro-stepped dielectric material portion 165 into two discrete dielectric material portions, such as a first portion of the first-tier retro-stepped dielectric material portion 165 and a second portion of the first-tier retro-stepped dielectric material portion 165. Further, one of the neighboring pair of backside trenches 79 can divide a second-tier retro-stepped dielectric material portion 265 into two discrete dielectric material portions, such as a first portion of the second-tier retro-stepped dielectric material portion 265 and a second portion of the second-tier retro-stepped dielectric material portion 265. Furthermore, every other backside trench 79 can divide the strip portions (130, 230) along the first horizontal direction hd1 into two separate portions which are spaced apart along the second horizontal direction hd2.

In one embodiment, the semiconductor material layer 110 can have a doping of the same conductivity type as the vertical semiconductor channels 60, i.e., a first conductivity type, and a source region 61 having a doping of a second conductivity type (which is the same conductivity type as the doping of the drain regions 63) can be formed underneath each backside trench 79 by implantation of dopants of the second conductivity type.

Figure 20:
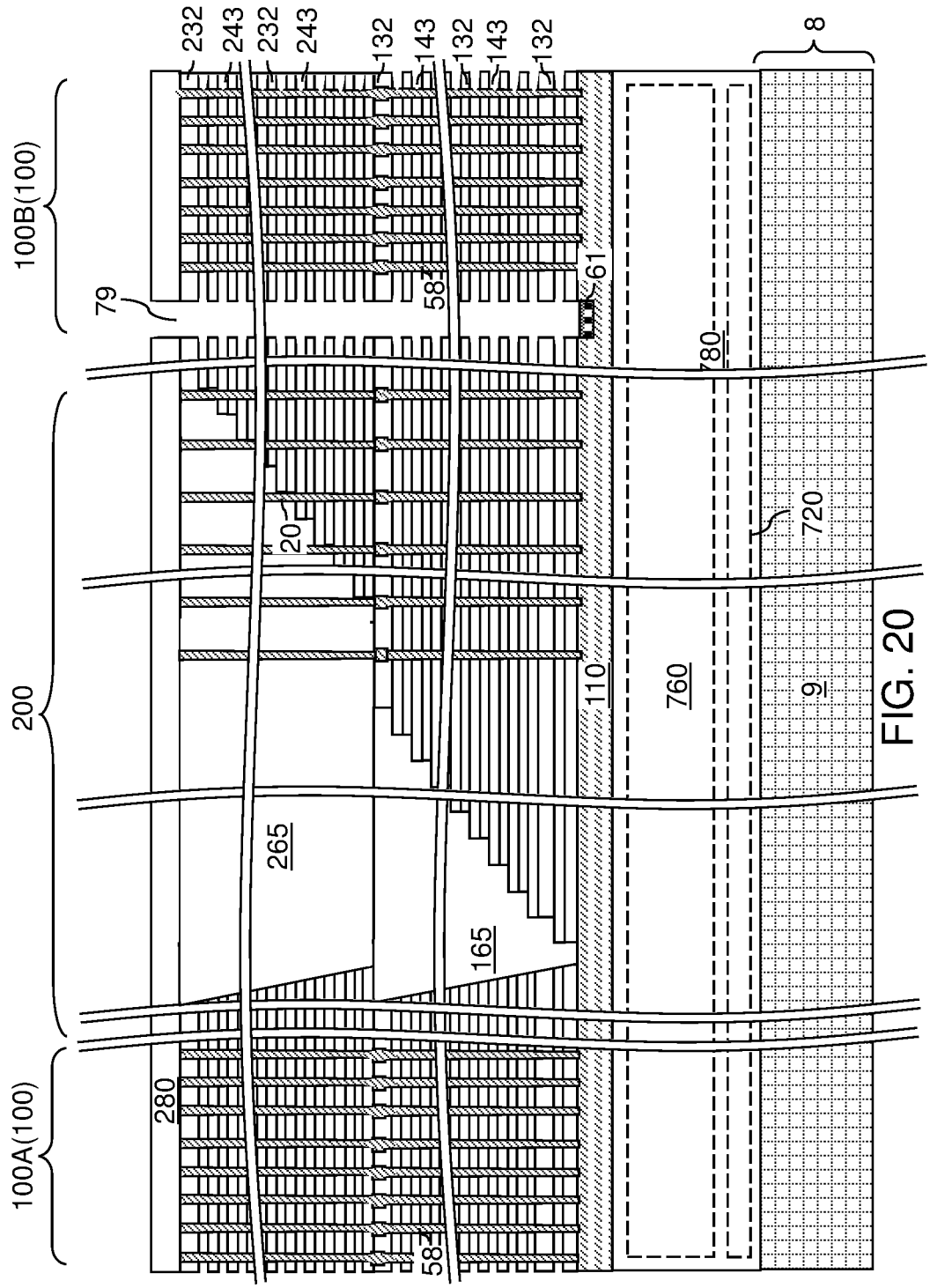
FIG. 20 is a schematic vertical cross-sectional view of the exemplary structure after formation of backside recesses according to an embodiment of the present disclosure.

Referring to FIG. 20, the sacrificial material layers (142, 242) are removed selective to the insulating layers (132, 232), the contact-level dielectric layer 280, and the semiconductor material layer 110. For example, an etchant that selectively etches the materials of the sacrificial material layers (142, 242) with respect to the materials of the insulating layers (132, 232), the retro-stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess. A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Generally, the backside recesses (143, 243) can be formed by removing the patterned portions of the first continuous sacrificial material layers 142L and the second sacrificial material layers 242L selective to patterned portions of the first continuous insulating layers 132L and the second continuous insulating layers 232L after formation of the backside trenches 79. The backside recesses (143, 243) can be formed by performing an isotropic etch process that supplies an isotropic etchant that etches the patterned portions of the first continuous sacrificial material layers 142L and the second continuous sacrificial material layers 242L selective to patterned portions of the first continuous insulating layers 132L and the second continuous insulating layers 232L.

Figure 21:
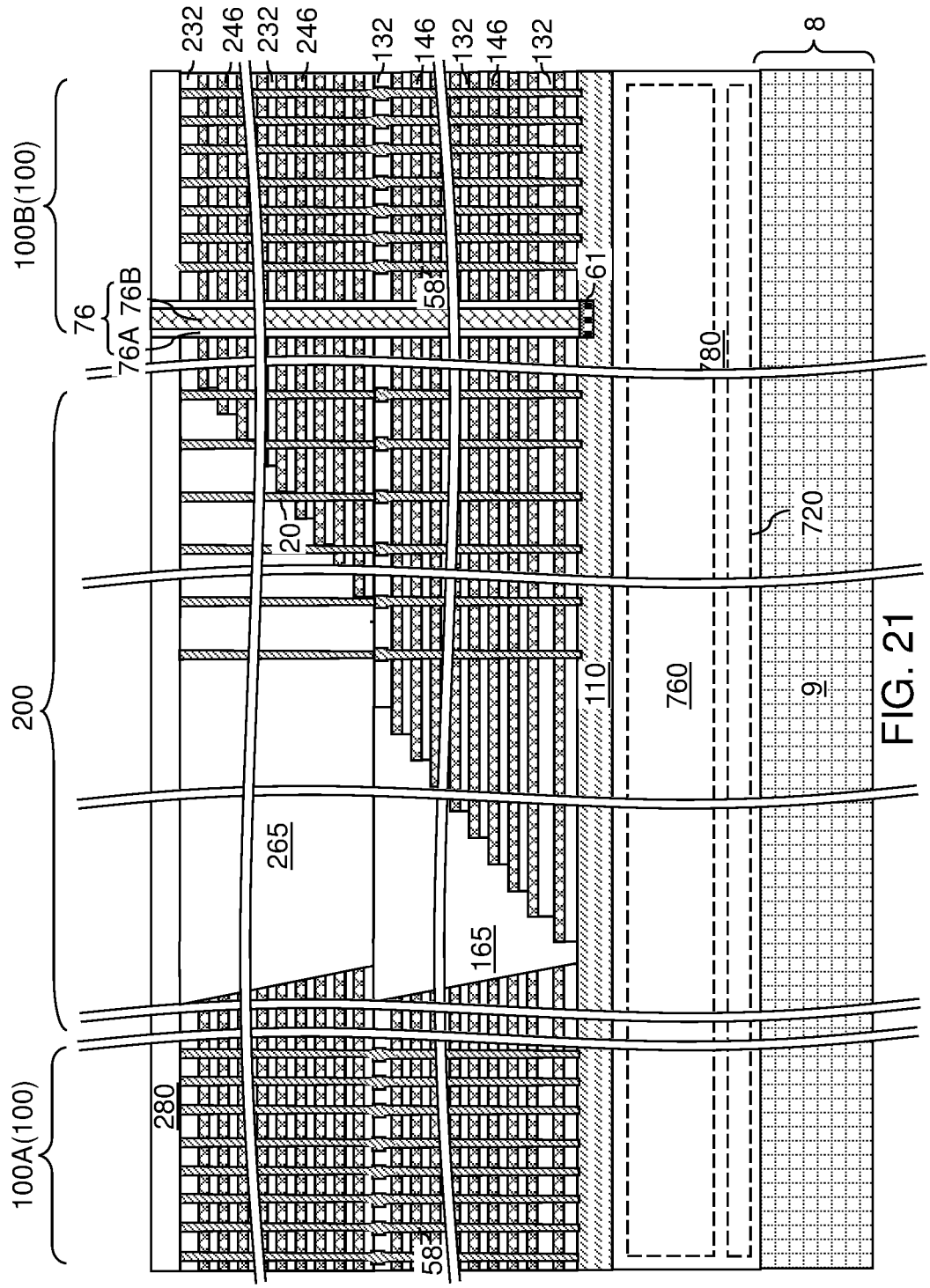
FIG. 21 is a schematic vertical cross-sectional view of the exemplary structure after formation of electrically conductive layers and trench fill structures according to an embodiment of the present disclosure.
Figure 22:
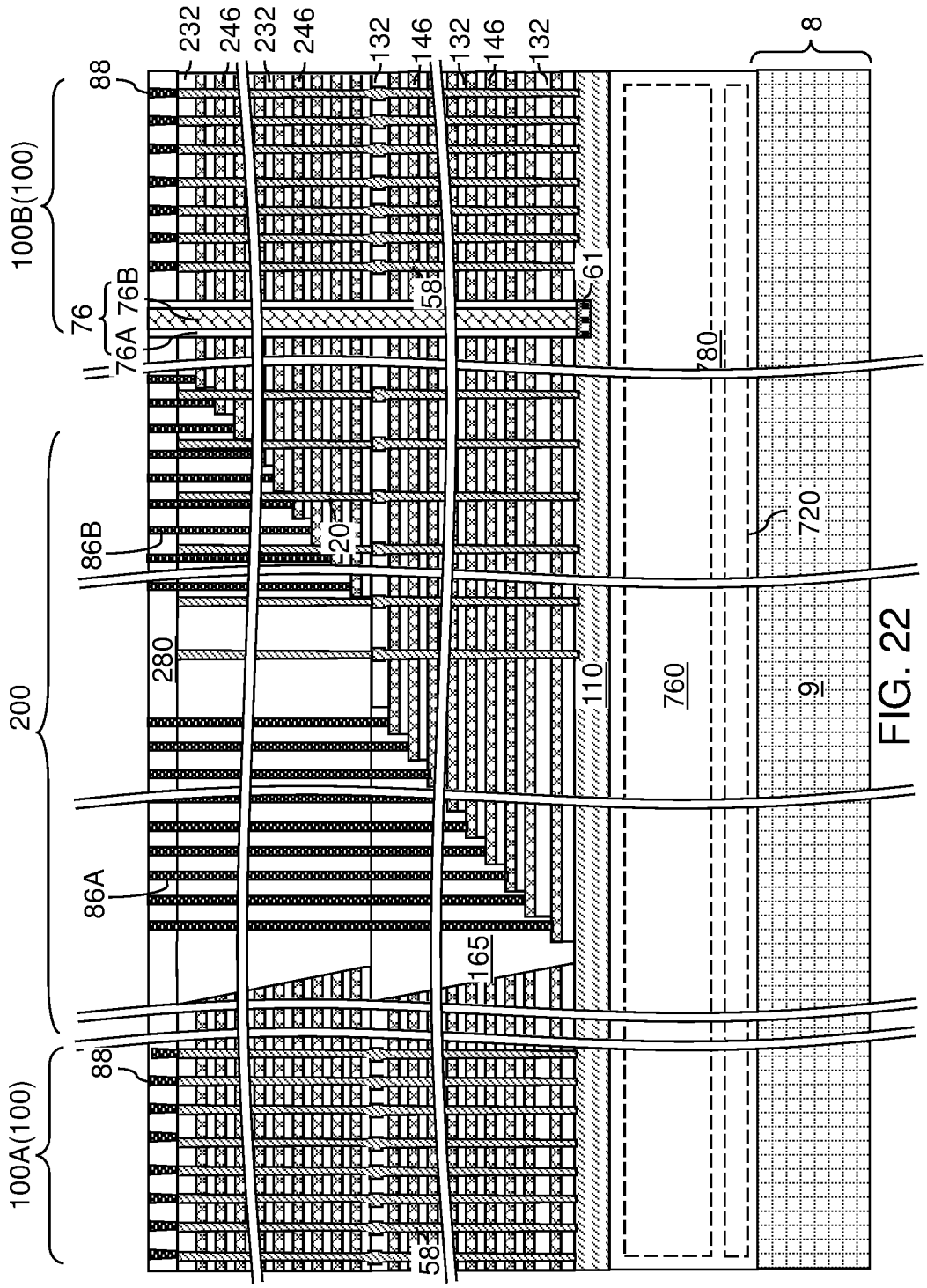
FIG. 22 is a schematic vertical cross-sectional view of the exemplary structure after formation of layer contact via structures according to an embodiment of the present disclosure.

Referring to FIG. 21, an optional backside blocking dielectric layer (not shown) may be optionally deposited in the backside recesses (143, 243) and the backside trenches 79 and over the contact-level dielectric layer 280. The backside blocking dielectric layer includes a dielectric material such as a dielectric metal oxide (e.g., aluminum oxide), silicon oxide, or a combination thereof.

At least one conductive material may be deposited in the plurality of backside recesses (143, 243), on the sidewalls of the backside trenches 79, and over the contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive layers 146 and the second electrically conductive layers 246 may be physically exposed to a respective backside trench 79. The backside trenches 79 may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20.

A subset of the electrically conductive layers (146, 246) may comprise word lines for the memory elements. The semiconductor devices in the underlying semiconductor devices 720 may comprise word line switch devices configured to control a bias voltage to respective word lines, and/or bit line driver devices, such as sense amplifiers. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246). Each of the memory stack structures 55 comprises a vertical stack of memory elements located at each level of the electrically conductive layers (146, 246).

Generally, the patterned portions of the first continuous sacrificial material layers 142L and the second continuous sacrificial material layers 242L are replaced with the electrically conductive layers (146, 246). A first-tier alternating stack of first insulating layers 132 and first electrically conductive layers 146 can be formed between each neighboring pair of backside trenches 79. The first insulating layers 132 comprise patterned portions of the first continuous insulating layers 132L, and the first electrically conductive layers 146 comprise the first subset of the electrically conductive layers (146, 246) and are interlaced with the first insulating layers 132. A second-tier alternating stack of second insulating layers 232 and second electrically conductive layers 246 is formed between the neighboring pair of backside trenches 79. The second insulating layers 232 comprise patterned portions of the second continuous insulating layers 232L, and the second electrically conductive layers 246 comprise a second subset of the electrically conductive layers (146, 246) that is interlaced with the second insulating layers 246.

A trench fill structure 76 can be formed in each backside trench 79. In one embodiment, an insulating liner layer including a dielectric material (such as silicon oxide) can be conformally deposited at a periphery of each backside trench 79, and can be anisotropically etched to form an insulating spacer 76A within each backside trench 79. At least one conductive material can be deposited in remaining volumes of the backside trenches 79, and excess portions of the at least one conductive material can be removed from above the top surface of the contact-level dielectric layer 280 by a planarization process. Each remaining portion of the at least one conductive material contacting a source region 61 and laterally surrounded by a respective insulating spacer 76A constitutes a backside contact via structure 76B, which laterally extends along the first horizontal direction hd1. Each contiguous combination of an insulating spacer 76A and a backside contact via structure 76B that fills a backside trench 79 constitutes a trench fill structure 76.

Alternatively, at least one dielectric material, such as silicon oxide, may be conformally deposited in the backside trenches 79 by a conformal deposition process. Each portion of the deposited dielectric material that fills a backside trench 79 constitutes a trench fill structure 76. In this case, each trench fill structure may fill the entire volume of a backside trench 79 and may consist essentially of at least one dielectric material. In this alternative embodiment, the source region 61 may be omitted, and a horizontal source line (e.g., a direct strap contact layer) may contact a side of the lower portion of the semiconductor channel 60.

The trench fill structures 76 can be arranged in a configuration illustrated in FIGS. 1B-1E. In one embodiment, each first-tier retro-stepped dielectric material portion 165 and each second-tier retro-stepped dielectric material portion 265 can be located between a neighboring pair of the trench fill structures 76.

Referring to FIGS. 22 and 23A-23H, various contact via structures (88, 86A, 86B) can be formed through the contact-level dielectric layer 280 and optionally through underlying material portions onto a respective underlying conductive structure. The various contact via structures (88, 86A, 86B) can include drain contact via structures (e.g., drain electrodes) 88 that are formed in the memory array regions 100 through the contact-level dielectric layer 280 on a top surface of a respective drain region 63. The various contact via structures (88, 86A, 86B) can include layer contact via structures (86A, 86B) that are formed in the inter-array region 200. The layer contact via structures (86A, 86B) can include first contact via structures 86A that contact a respective first electrically conductive layer 146 and second contact via structures 86B that contact a respective second electrically conductive layer 246.

For example, a photoresist layer (not shown) can be applied over the second-tier alternating stacks (232, 246), and can be lithographically patterned to form openings within areas of the memory opening fill structures 58, and the second-tier retro-stepped dielectric material portion 265 which is located over the horizontal surfaces of the second stepped surfaces of the second-tier alternating stacks (232, 246). An anisotropic etch process can be performed to transfer the pattern of the openings in the photoresist layer through the contact-level dielectric layer 280, the first-tier retro-stepped dielectric material portions 165, and the second-tier retro-stepped dielectric material portions 265.

Drain contact via cavities can be formed over each memory opening fill structure 58. Top portions of the memory opening fill structures 58, such as the drain regions 63, may be employed as etch stop structures during the anisotropic etch process. In one embodiment, the drain contact via cavities may be formed concurrently with formation of the first contact via cavities and the second contact via cavities. Alternatively, the drain contact via cavities may be formed prior to, or after, formation of the first contact via cavities and the second contact via cavities employing an additional lithographic patterning process and an additional anisotropic etch process.

At least one conductive material can be deposited in each of the first contact via cavities, the second contact via cavities, and the drain contact via cavities. The at least one conductive material can include, for example, a metallic barrier material (such as TiN, TaN, and/or WN) and a metallic fill material (such as W, Cu, Mo, Co, Ru, etc.). Excess portions of the at least one conductive material can be removed from above the horizontal plane including the top surface of the contact-level dielectric layer employing a planarization process (such as a chemical mechanical planarization process). Each remaining portion of the at least one conductive material filling the first contact via cavities comprises a first contact via structure 86A. Each remaining portion of the at least one conductive material filling the second contact via cavities comprise a second contact via structure 86B. Each remaining portion of the at least one conductive material filling the drain contact via cavities comprises drain contact via structures 88.

The first contact via structures 86A can be formed through a respective second retro-stepped dielectric material portion 265 and through a respective first-tier retro-stepped dielectric material portion 165 and directly on a first subset of the electrically conductive layers, i.e., the first electrically conductive layers 146. The second contact via structures 86B can be formed through a respective second-tier retro-stepped dielectric material portion 265 and directly on a second subset of the electrically conductive layers (i.e., the second electrically conductive layers 246) that is located over a horizontal plane including top surfaces of the first-tier retro-stepped dielectric material portions 165.

Bit lines (not shown) are then formed in a manner that provides electrical contact with the drain contact via structures 88. The bit lines may directly contact top surfaces of a respective subset of the drain contact via structures 88, or intermediate contact via structures (not shown) may be employed between the drain contact via structures 88 and the bit lines. This completes the exemplary structure of the first embodiment of the present disclosure.

Figure 24A:
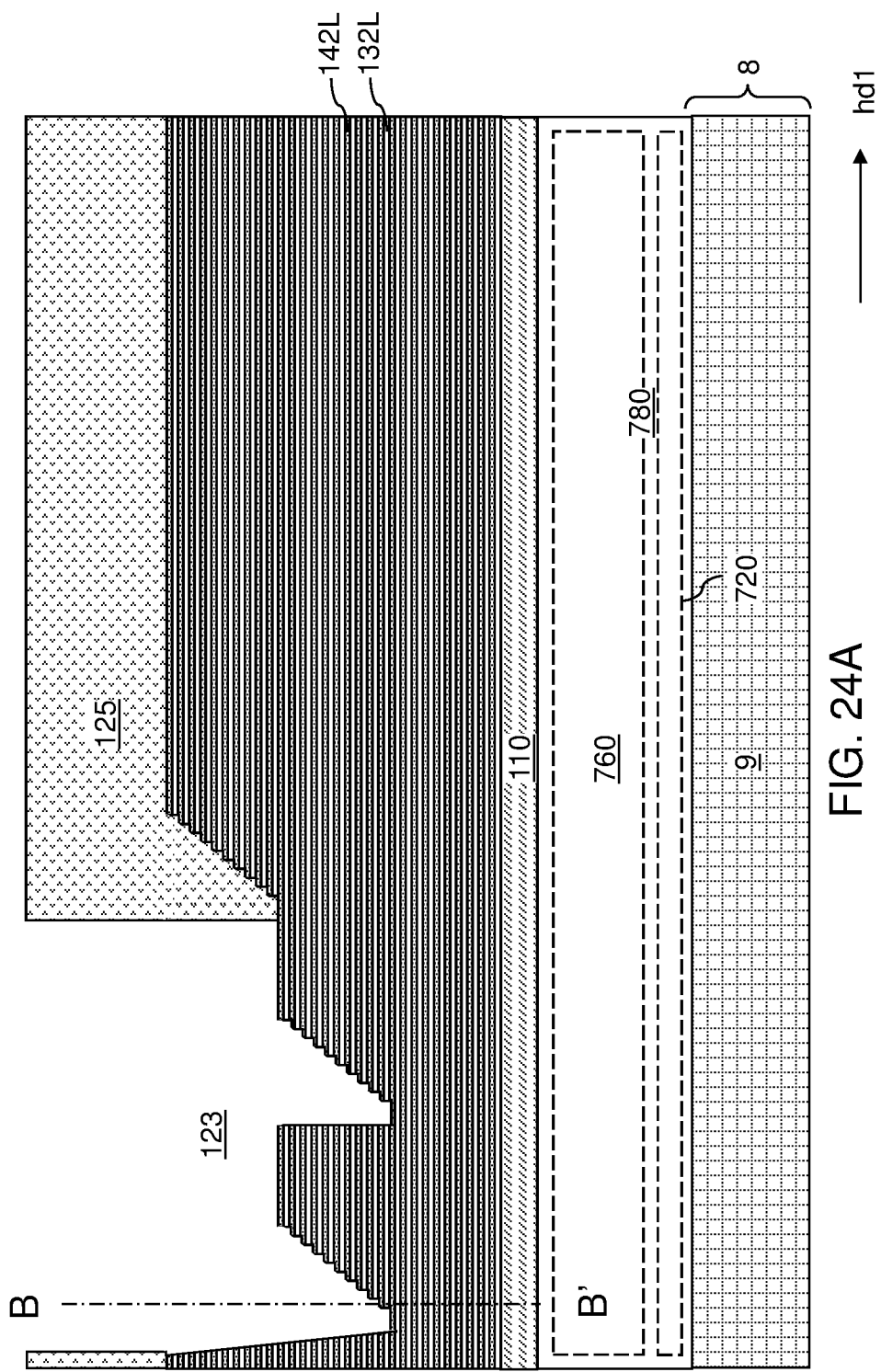
FIG. 24A is a vertical cross-sectional view of an alternative configuration of the exemplary structure along a first horizontal direction after a first area recess etch process according to a second embodiment of the present disclosure.
Figure 24B:
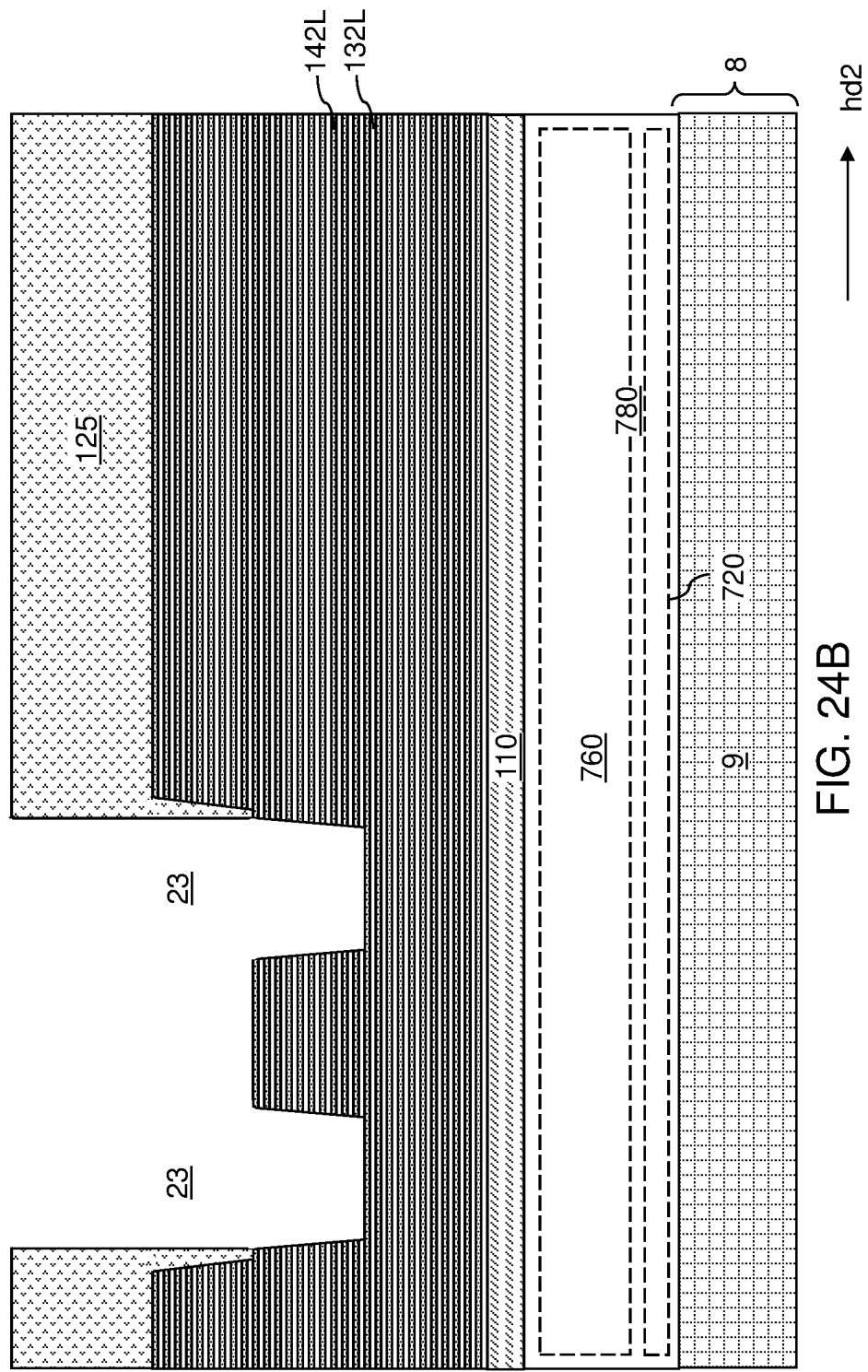
FIG. 24B is a vertical cross-sectional view of the exemplary structure along a vertical plane B-B' of FIG. 24A.

Referring to FIGS. 24A and 24B, an alternative configuration of the exemplary structure according to the second embodiment is illustrated at the processing steps of FIGS. 6A and 6B. The alternative configuration of the exemplary structure can be derived from the exemplary structure of FIGS. 5A and 5B by modifying the pattern of the first recess etch mask layer 125 such that each neighboring pair of rectangular openings in the first recess etch mask layer 125 that overlie a 2×N array of sets of first stepped surfaces (i.e., 2N sets of first stepped surfaces arranged as a 2×N rectangular array) is merged to provide a single rectangular opening in which a 2×(N−1) array of sets of first stepped surfaces (i.e., 2(N−1) sets of first stepped surfaces arranged as a 2×(N−1) rectangular array) are physically exposed. Thus, a strip portion of the first vertically alternating sequence (132L, 142L) that laterally extends along the first horizontal direction hd1 is physically exposed within the rectangular opening in the first recess etch mask layer 125, and is subsequently vertically recessed during the a area recess etch process, which can be the same as the first area recess etch process of FIGS. 6A and 6B.

Figure 25A:
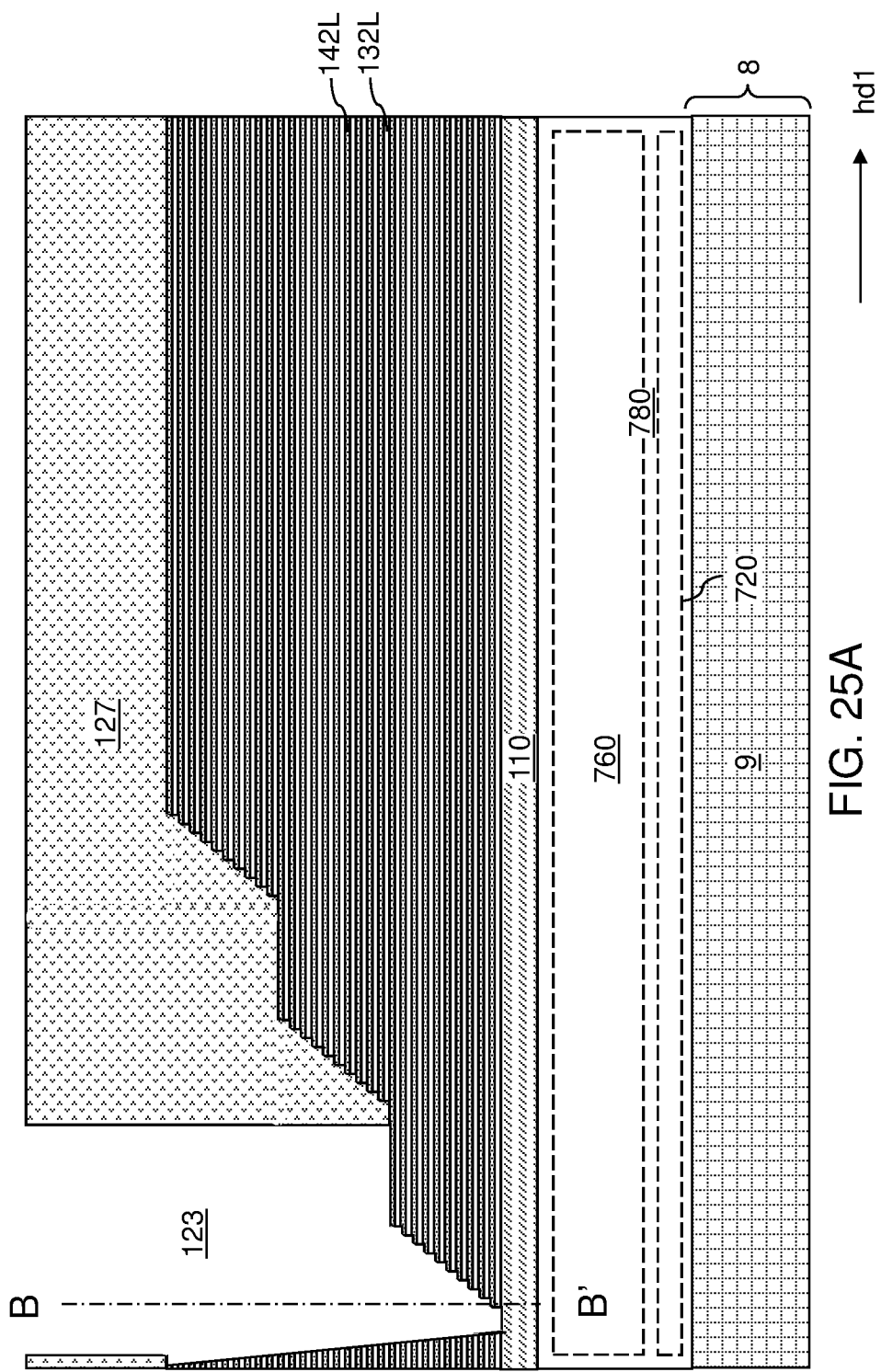
FIG. 25A is a vertical cross-sectional view of the alternative configuration of the exemplary structure along the first horizontal direction after a second area recess etch process according to the second embodiment of the present disclosure.
Figure 25B:
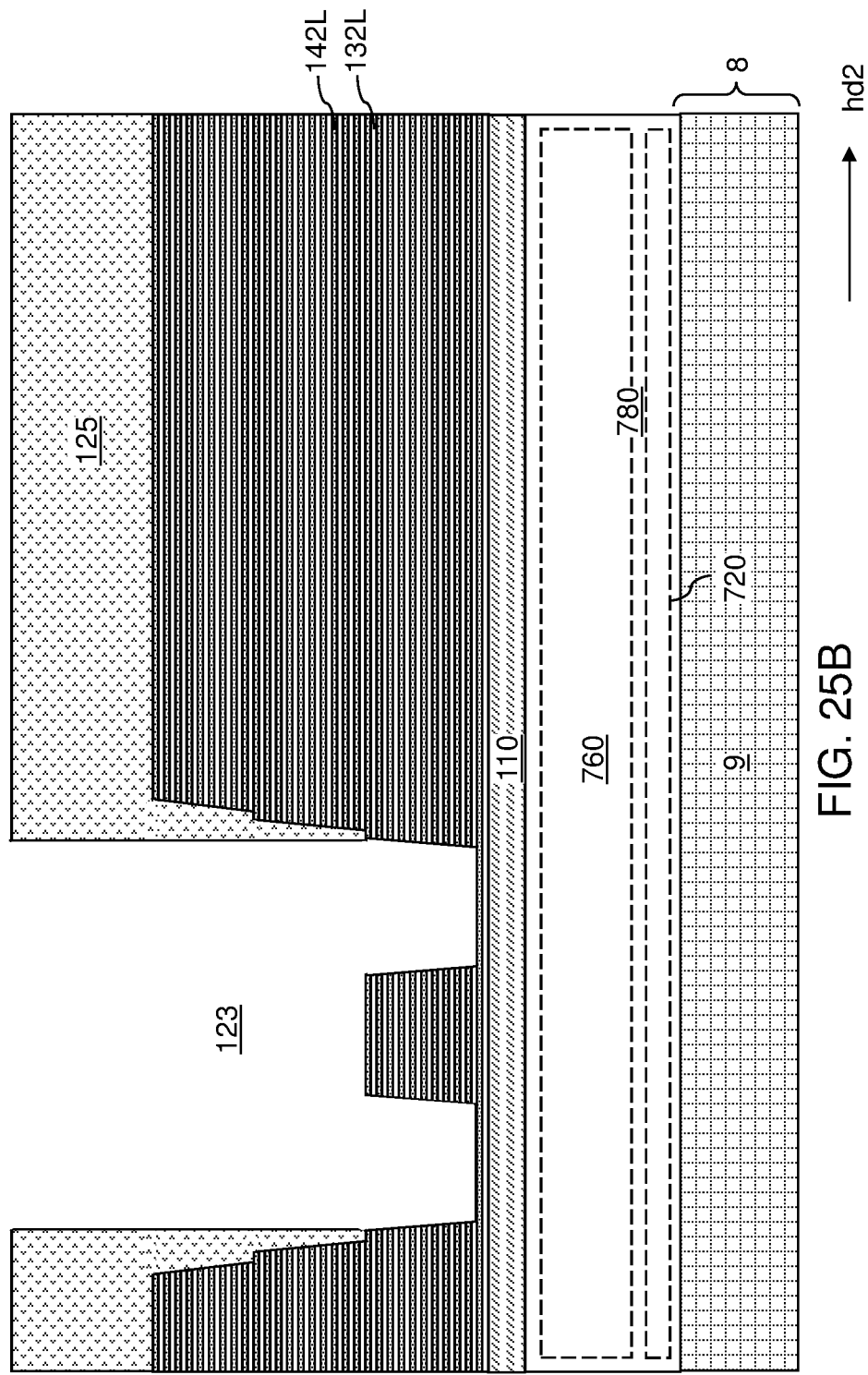
FIG. 25B is a vertical cross-sectional view of the exemplary structure along a vertical plane B-B' of FIG. 25A.

Referring to FIGS. 25A and 25B, the processing steps of FIGS. 7A and 7B and the processing steps of FIGS. 8A and 8B can be subsequently formed.

Figure 23A:
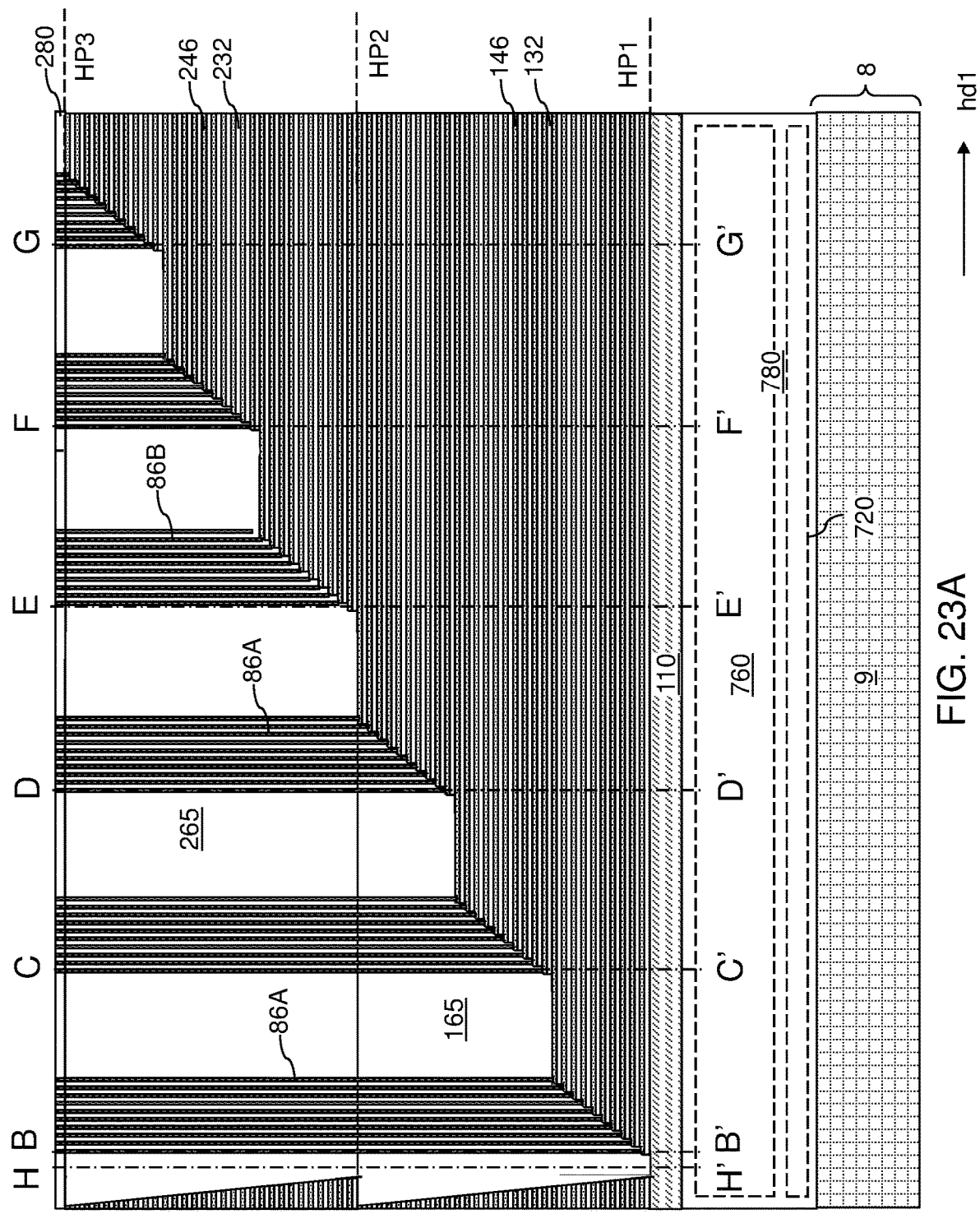
FIG. 23A is a vertical cross-sectional view of the exemplary structure of FIG. 22 according to an embodiment of the present disclosure.
Figure 23B:
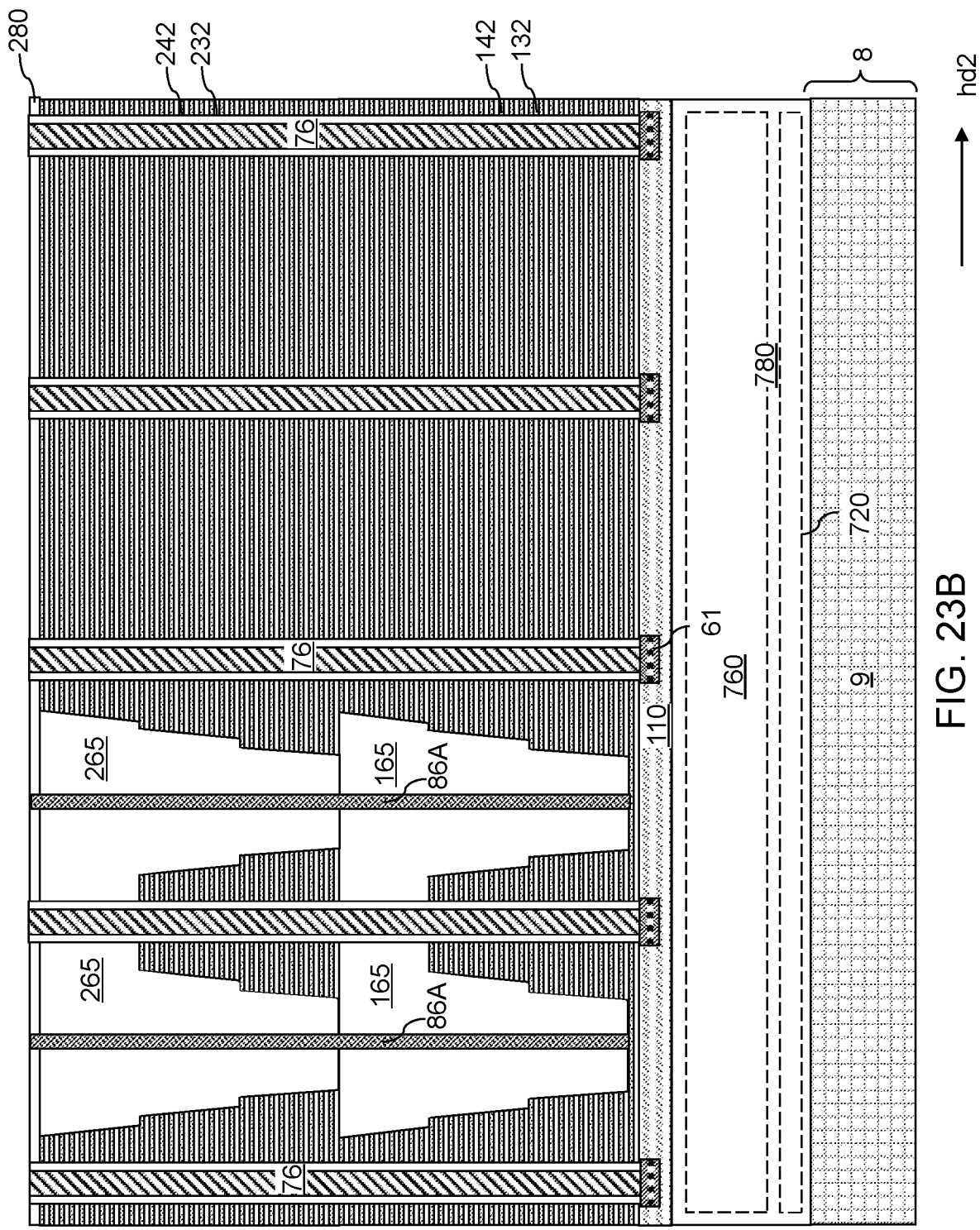
FIG. 23B is a vertical cross-sectional view of the exemplary structure along a vertical plane B-B' of FIG. 23A.
Figure 23C:
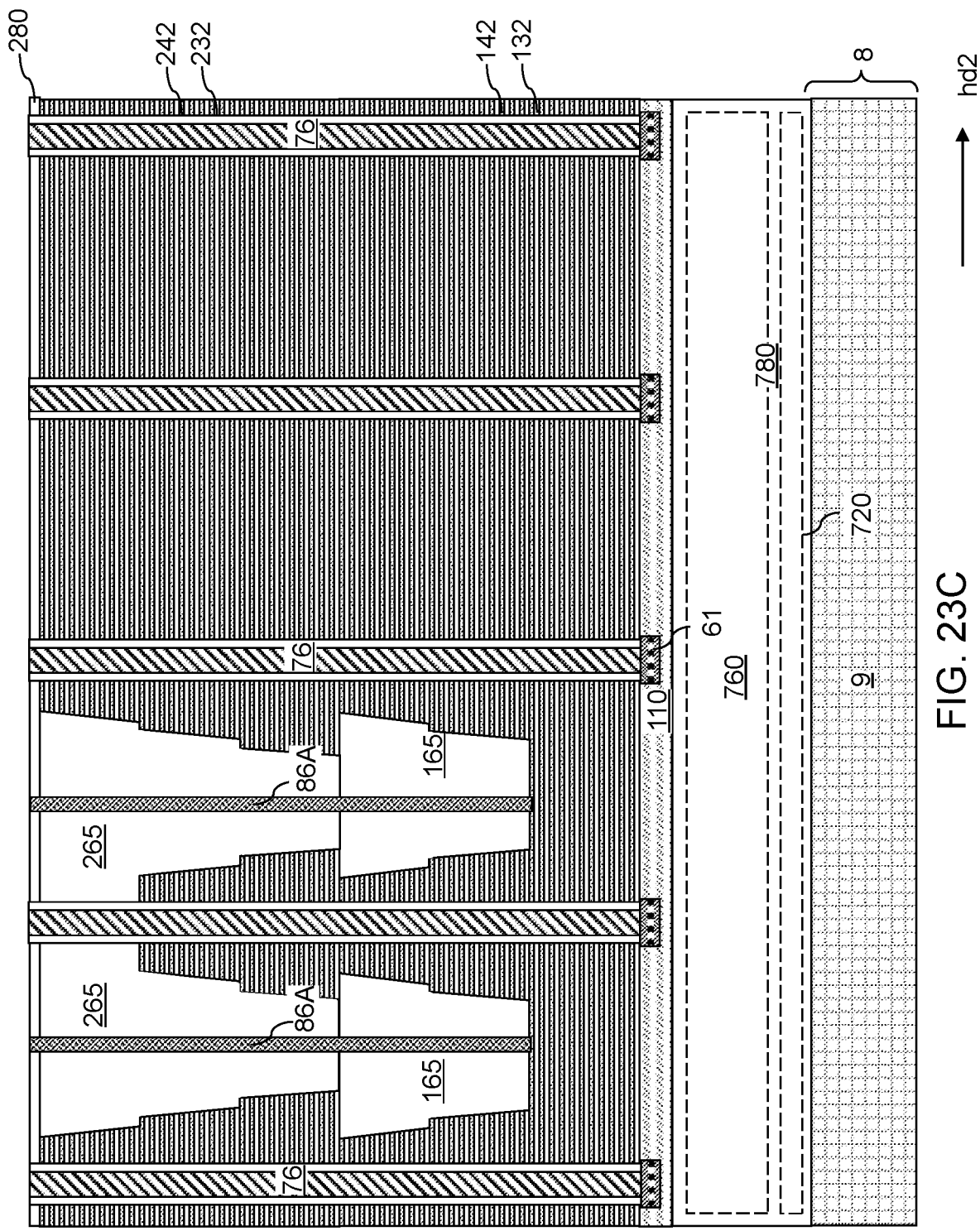
FIG. 23C is a vertical cross-sectional view of the exemplary structure along a vertical plane C-C' of FIG. 23A.
Figure 23D:
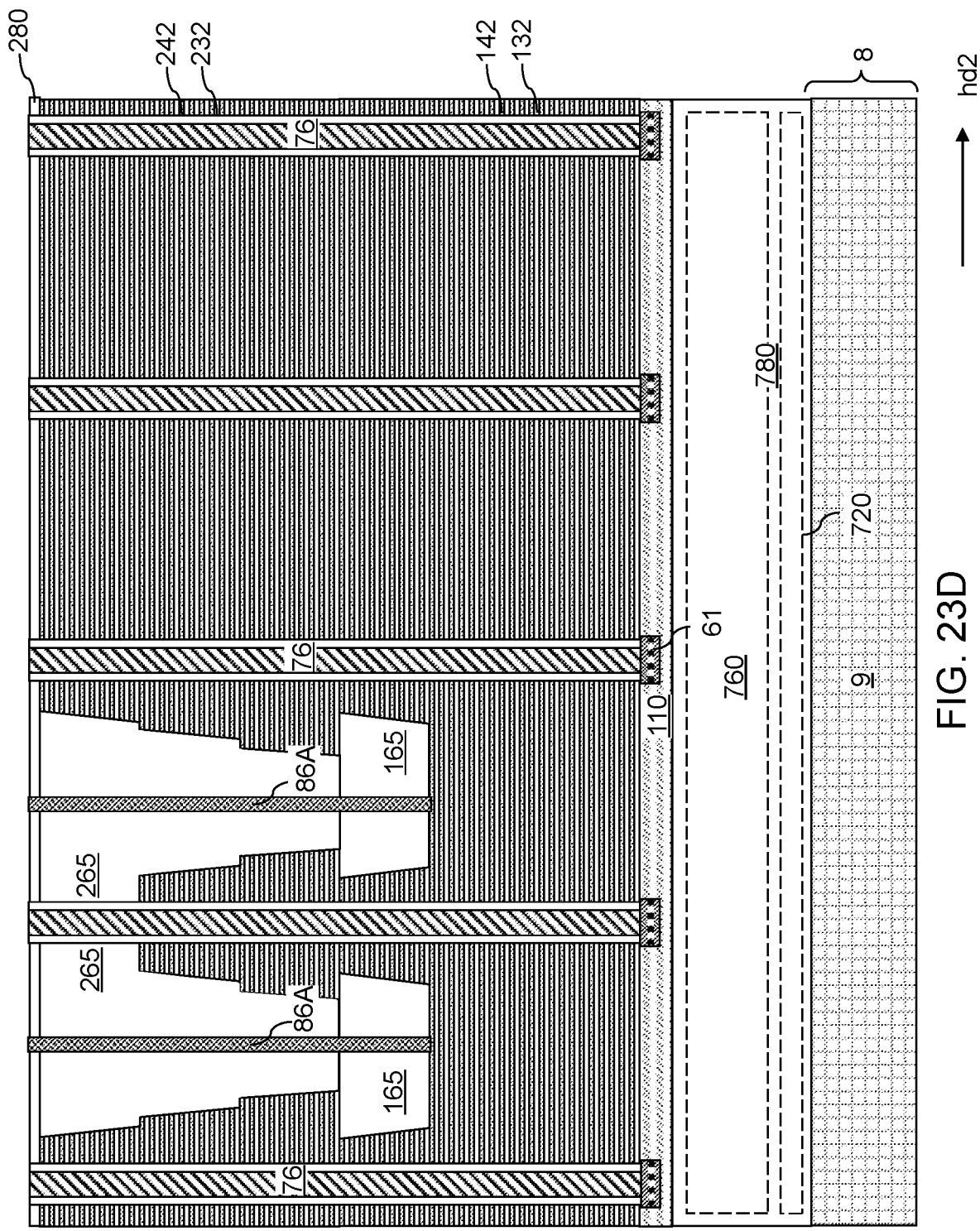
FIG. 23D is a vertical cross-sectional view of the exemplary structure along a vertical plane D-D' of FIG. 23A.
Figure 23E:
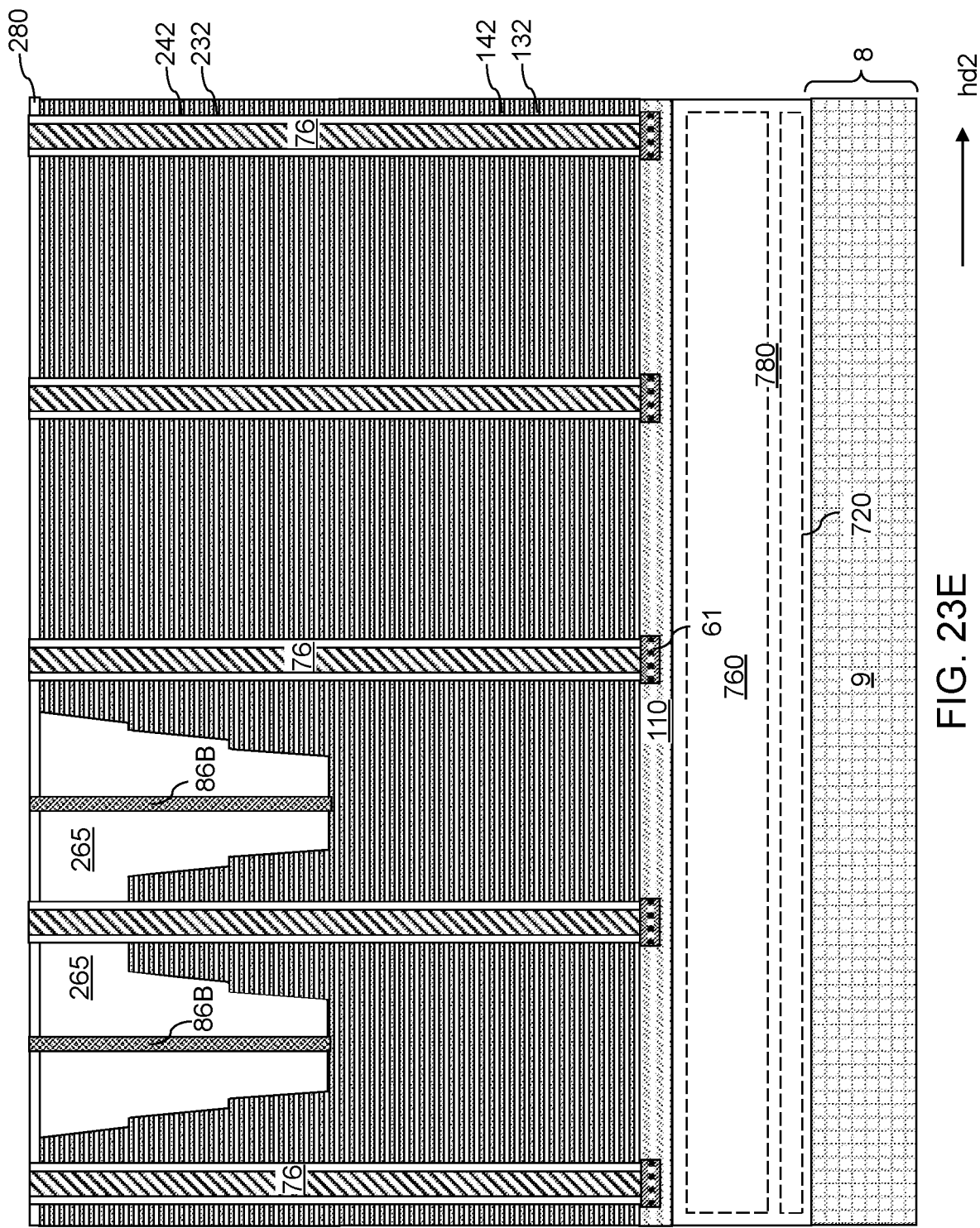
FIG. 23E is a vertical cross-sectional view of the exemplary structure along a vertical plane E-E' of FIG. 23A.
Figure 23F:
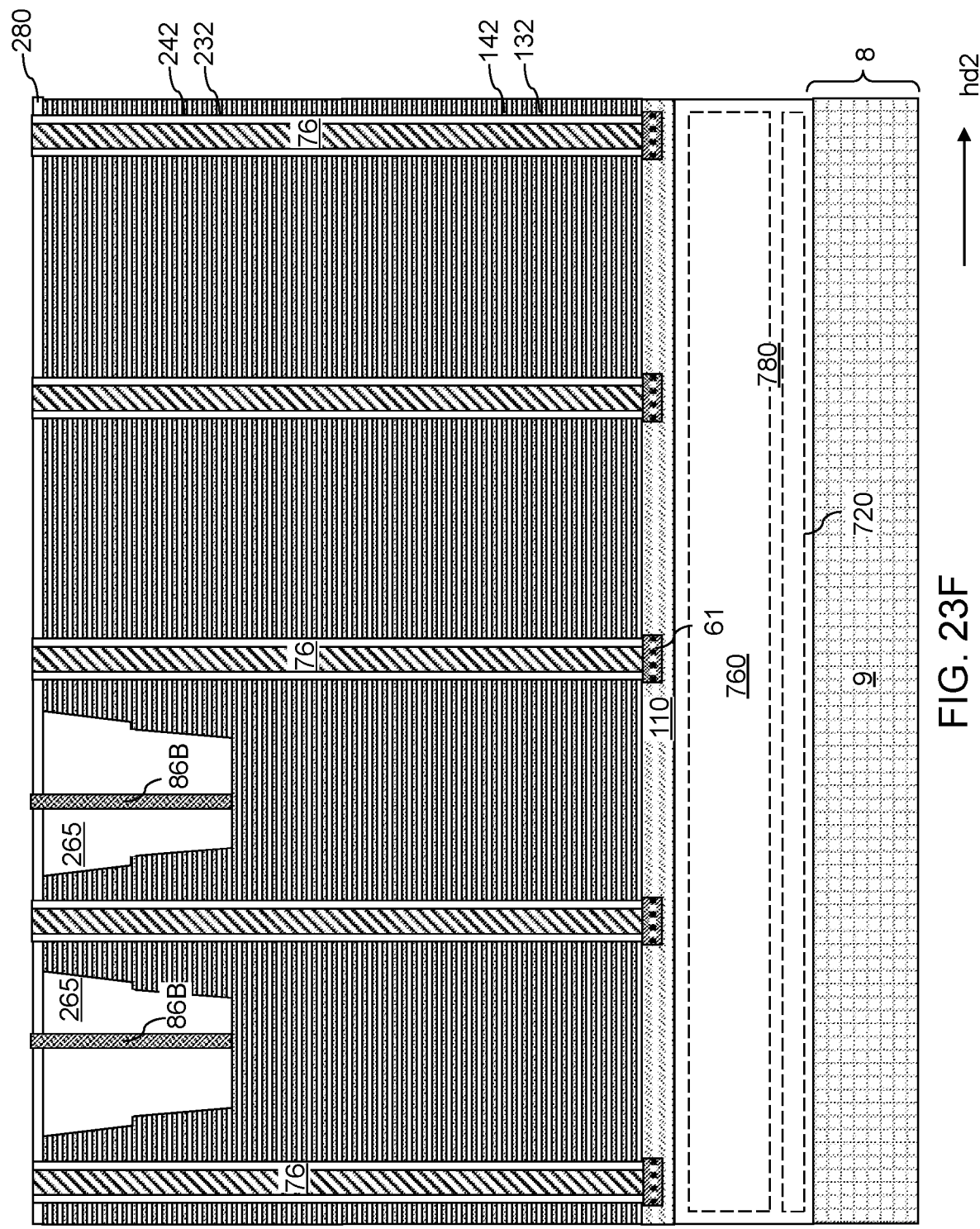
FIG. 23F is a vertical cross-sectional view of the exemplary structure along a vertical plane F-F' of FIG. 23A.
Figure 23G:
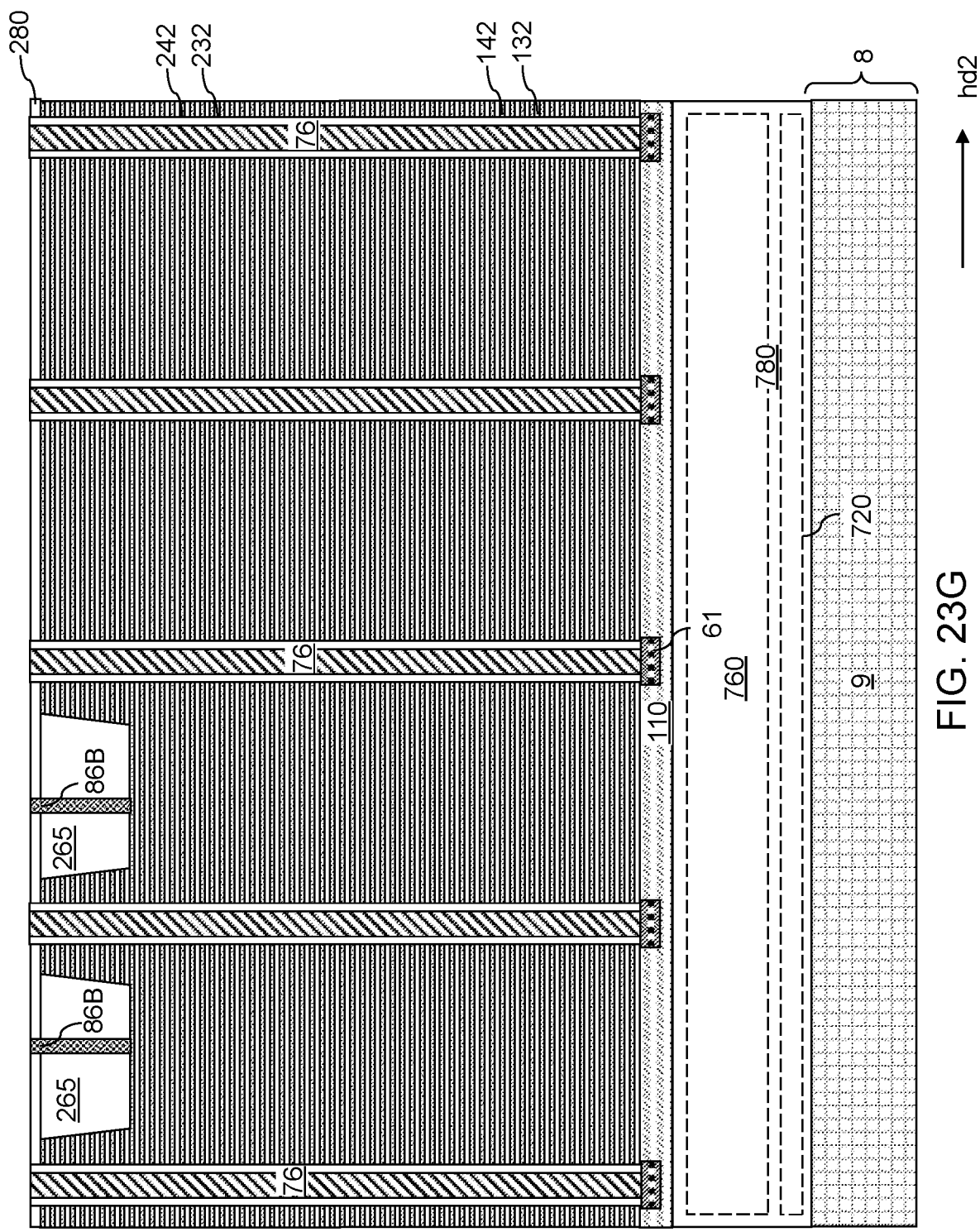
FIG. 23G is a vertical cross-sectional view of the exemplary structure along a vertical plane G-G' of FIG. 23A.
Figure 23H:
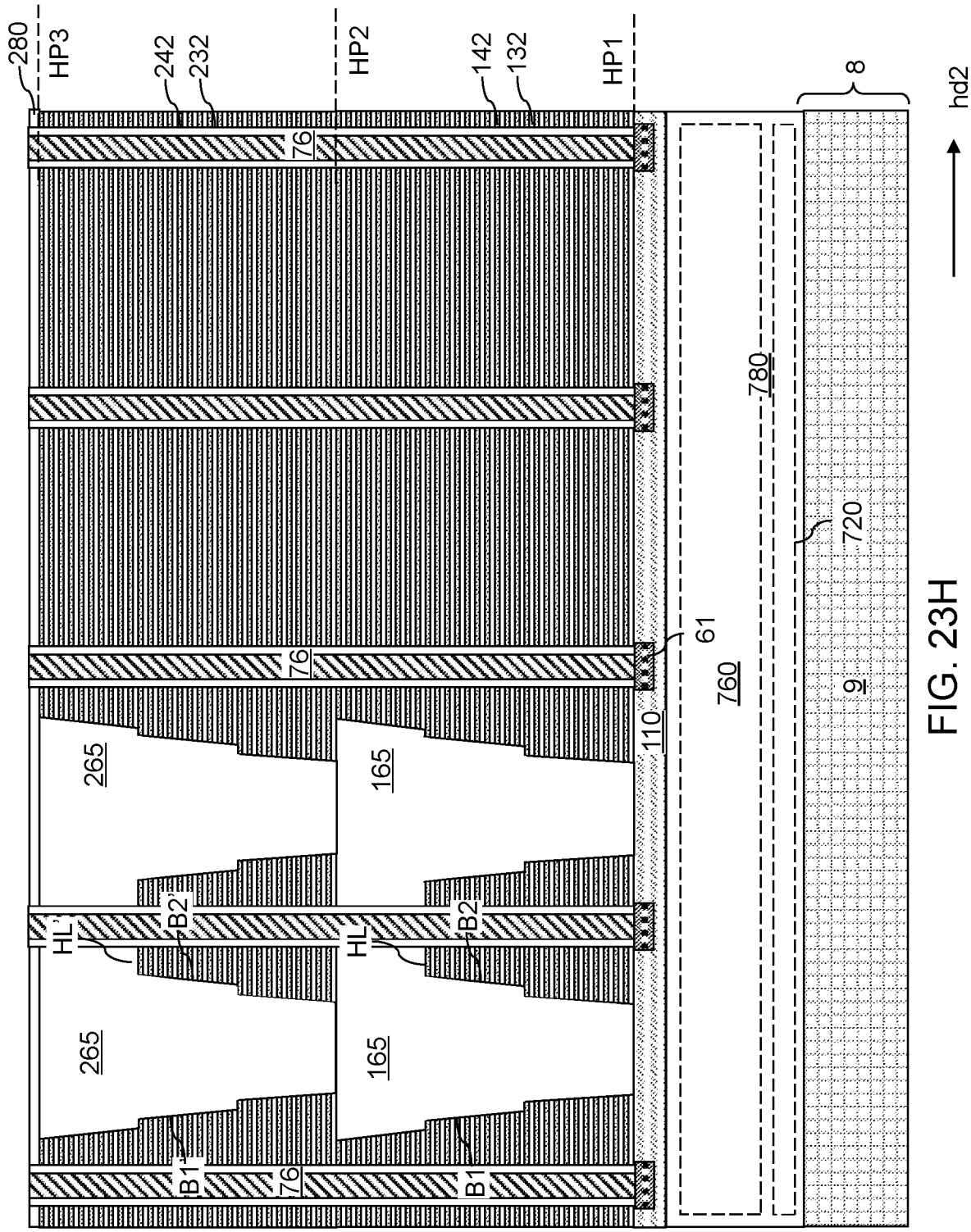
FIG. 23H is a vertical cross-sectional view of the exemplary structure along a vertical plane H-H' of FIG. 23A.
Figure 26A:
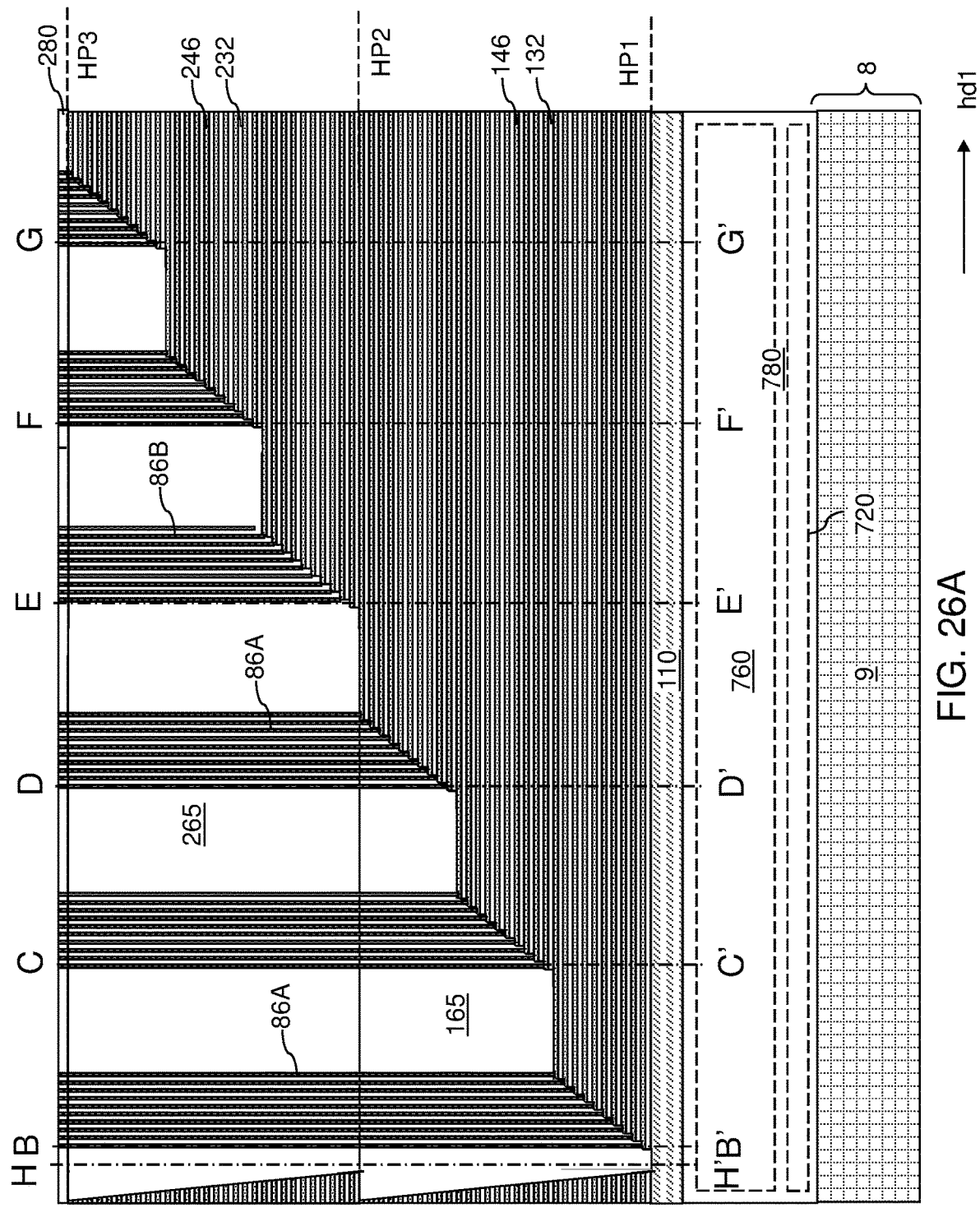
FIG. 26A is a vertical cross-sectional view of the alternative configuration of the exemplary structure of after formation of layer contact via structures according to the second embodiment of the present disclosure.
Figure 26B:
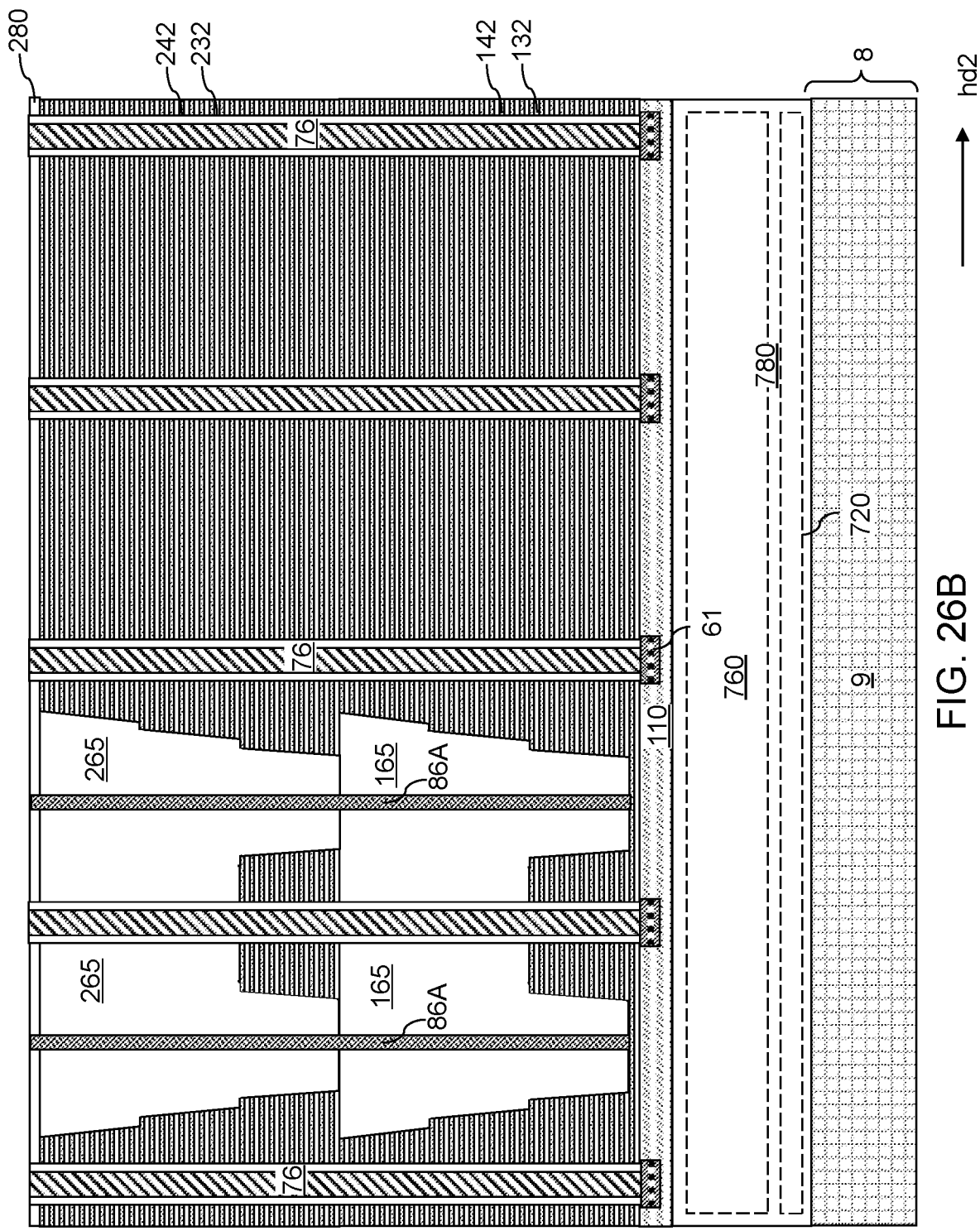
FIG. 26B is a vertical cross-sectional view of the exemplary structure along a vertical plane B-B' of FIG. 26A.
Figure 26C:
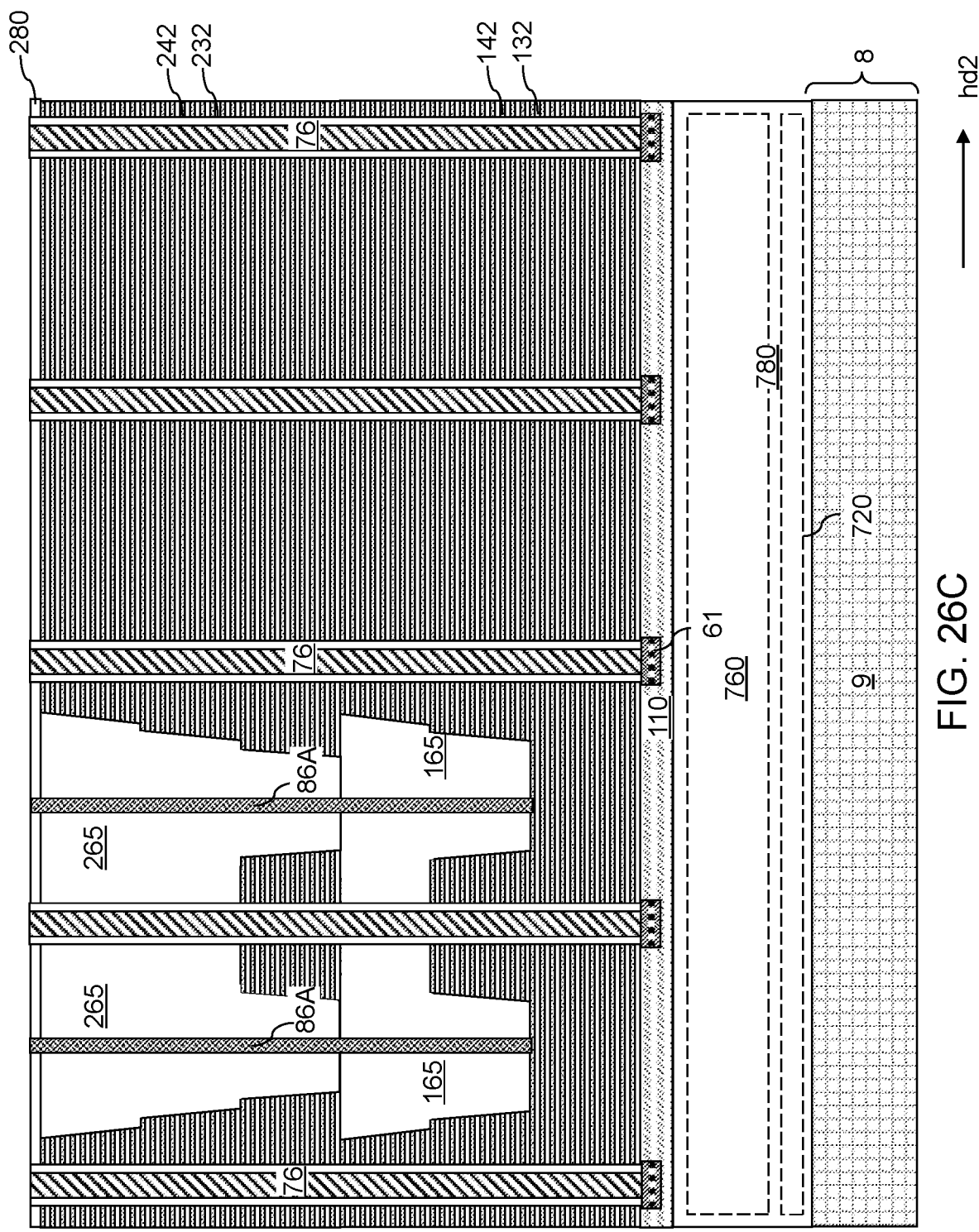
FIG. 26C is a vertical cross-sectional view of the exemplary structure along a vertical plane C-C' of FIG. 26A.
Figure 26D:
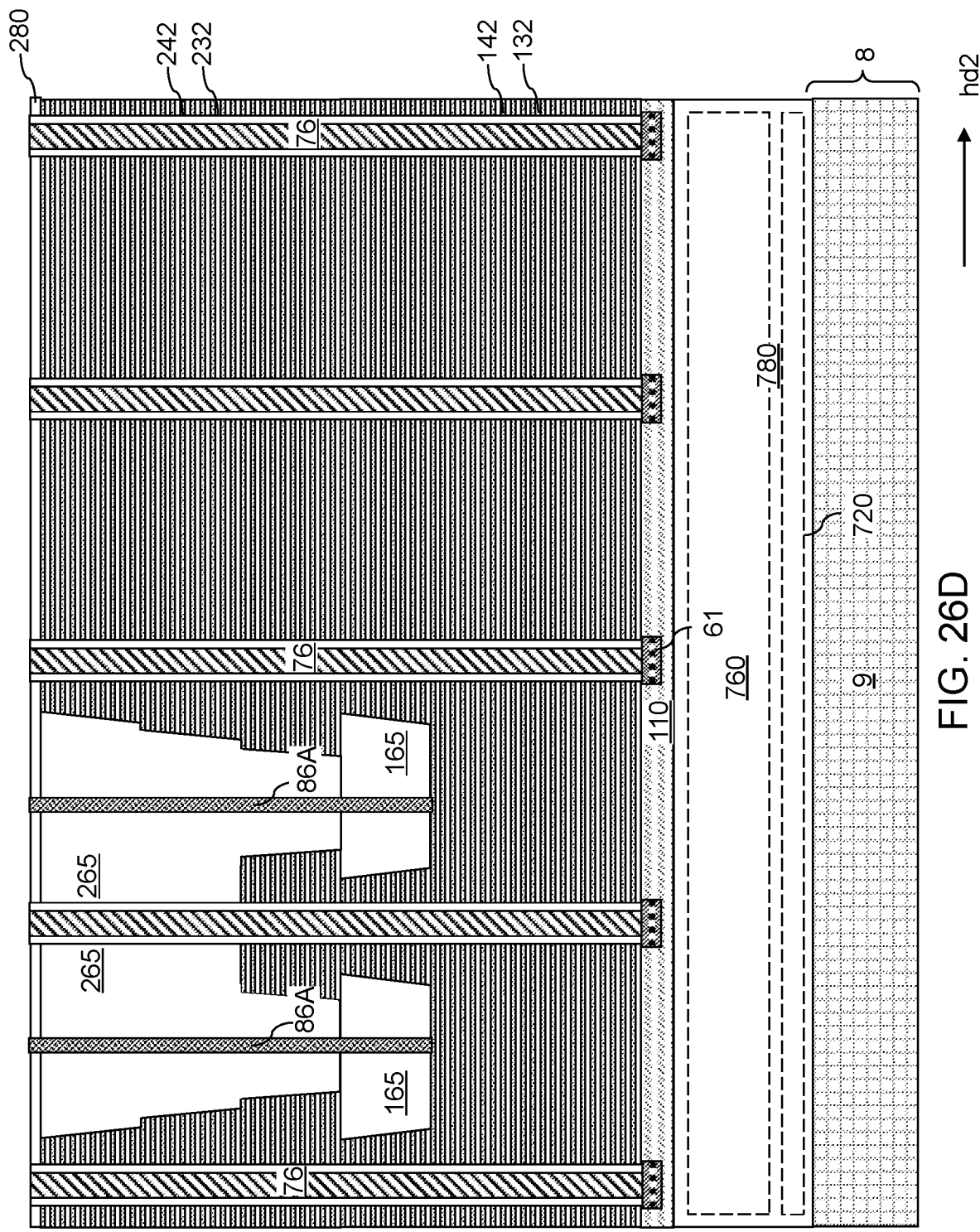
FIG. 26D is a vertical cross-sectional view of the exemplary structure along a vertical plane D-D' of FIG. 26A.
Figure 26E:
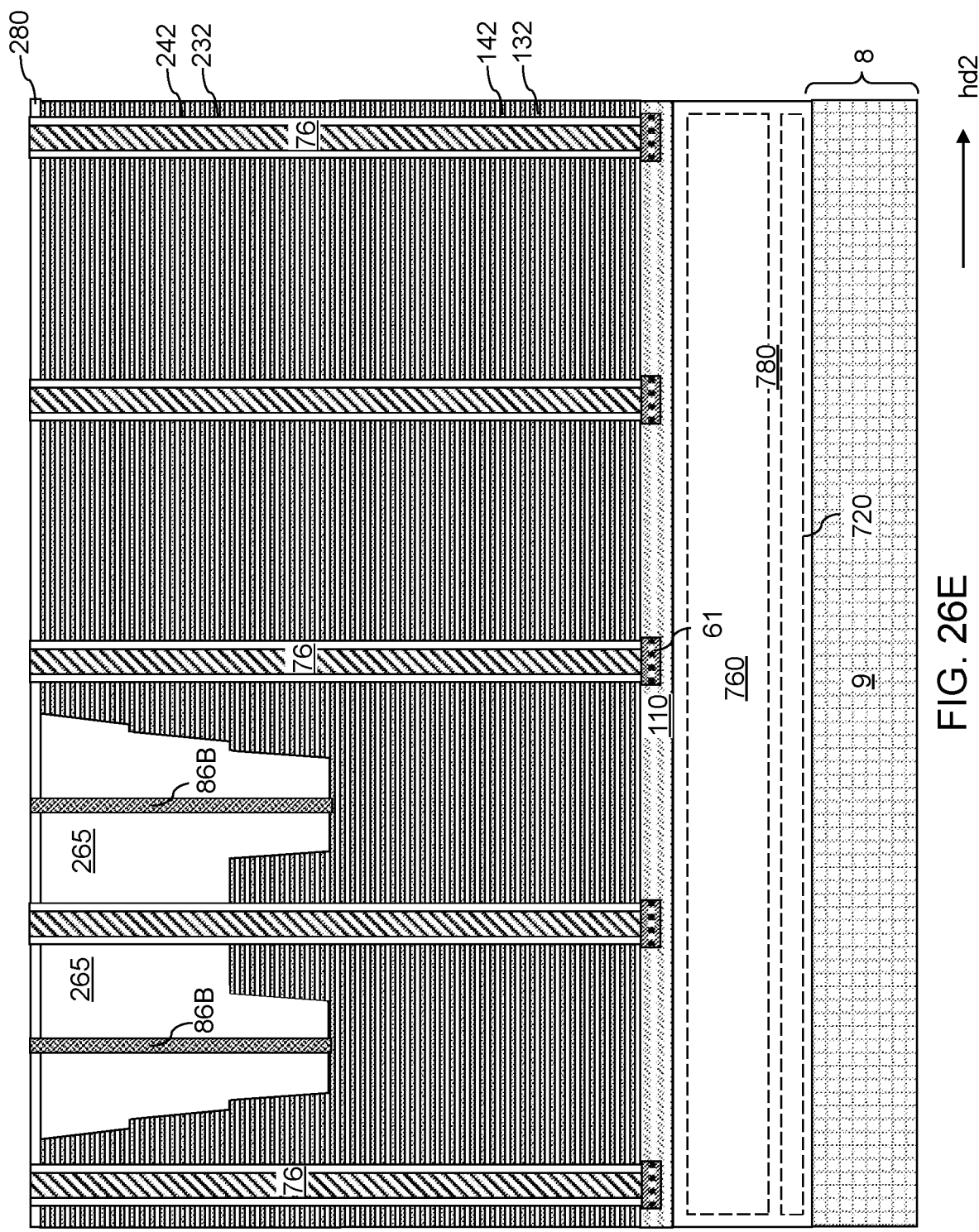
FIG. 26E is a vertical cross-sectional view of the exemplary structure along a vertical plane E-E' of FIG. 26A.
Figure 26F:
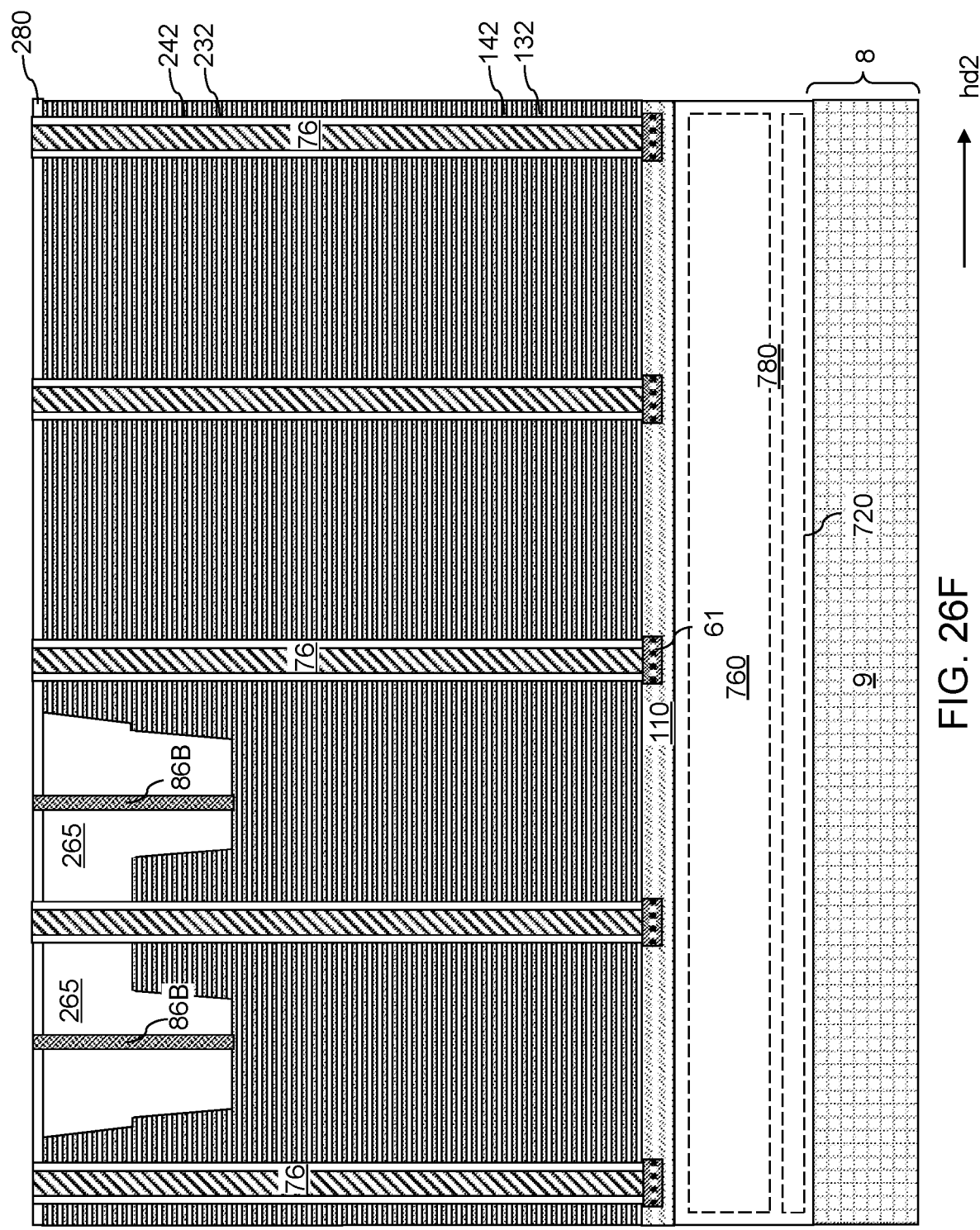
FIG. 26F is a vertical cross-sectional view of the exemplary structure along a vertical plane F-F' of FIG. 26A.
Figure 26G:
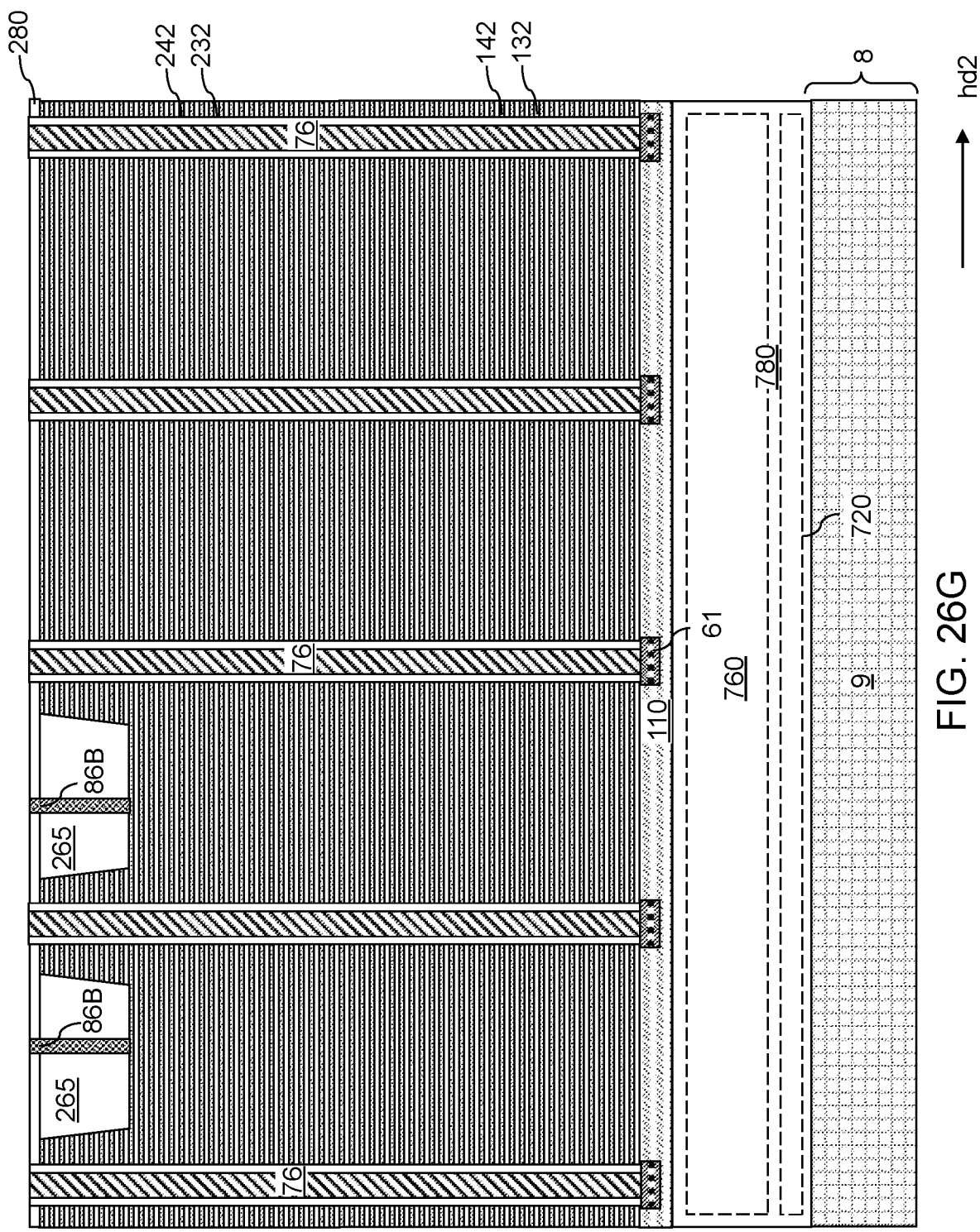
FIG. 26G is a vertical cross-sectional view of the exemplary structure along a vertical plane G-G' of FIG. 26A.
Figure 26H:
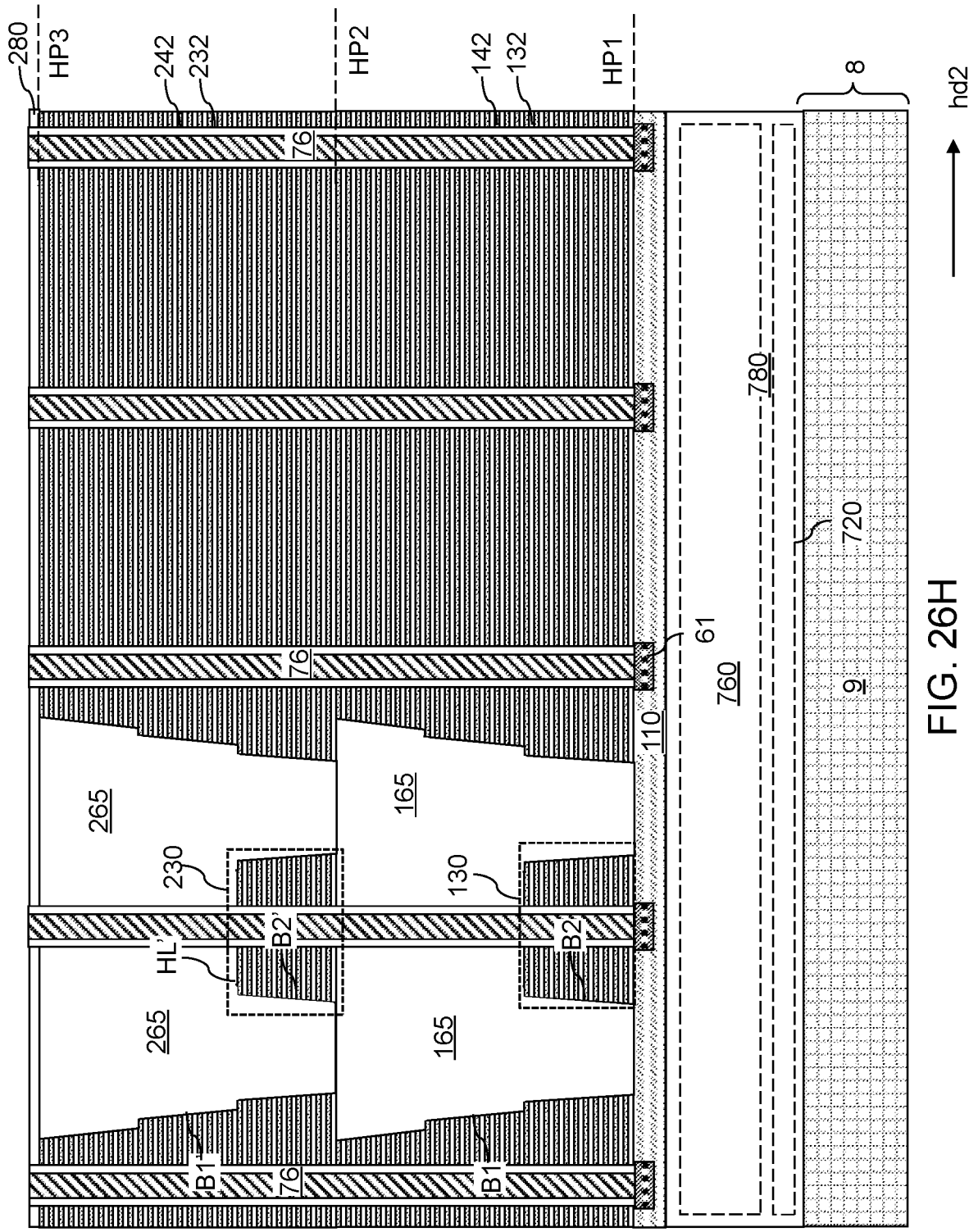
FIG. 26H is a vertical cross-sectional view of the exemplary structure along a vertical plane H-H' of FIG. 26A.

Referring to FIGS. 26A-26H, the processing steps of FIGS. 9A-23H may be performed with, or without, modification during the processing steps employed to pattern the second continuous retro-stepped cavities overlying a respective 2×P array of second stepped surfaces. In case a modification to the processing steps is employed, one or more of the recess etch mask layers may be modified to employ a pattern in which a single rectangular opening within a recess etch mask layer is employed over an area of a 2×K array of second stepped surfaces (K being less than P) in lieu of a pair of rectangular openings. In such cases, the height of a horizontal line HL' (i.e., the height of the strip portion 230) of the second embodiment can be lower (as illustrated in FIG. 26H) than the height of a corresponding horizontal line HL' (i.e., the height of the strip portion 230) in the exemplary structure of FIGS. 23A-23H (as illustrated in FIG. 23H) of the first embodiment.

Referring collectively to all drawings of the present disclosure and according to various embodiments of the present disclosure, a three-dimensional memory device is provided, which comprises: first alternating stacks of first insulating layers 132 and first electrically conductive layers 146 located over a substrate (8, 720, 760, 780, 110), wherein the first alternating stacks laterally extend along a first horizontal direction hd1 and are laterally spaced apart along a second horizontal direction hd2 that is perpendicular to the first horizontal direction hd2 by line trenches (such as the backside trenches 79), and wherein each of the first alternating stacks (132, 146) comprises a respective first staircase region in which a lateral extent of the first electrically conductive layers 146 along the first horizontal direction hd1 decreases with a vertical distance from the substrate (8, 720, 760, 780, 110); trench fill structures 76 located between and contacting a respective neighboring pair of the first alternating stacks (132, 146) and filling a respective one of the line trenches 79; arrays of memory stack structures 55 vertically extending through a respective one of the first alternating stacks (132, 146), wherein each of the memory stack structures 55 comprises a respective vertical stack of memory elements (comprising portions of the charge storage layers 54 located at levels of the first electrically conductive layers 146) located at levels of the first electrically conductive layers 146; first retro-stepped dielectric material portions 165 overlying a first staircase region of a respective one of the first alternating stacks (132, 146), wherein one of the first retro-stepped dielectric material portions 165 has a vertical cross-sectional profile (such as a vertical cross-sectional profile shown in FIG. 23H or in FIG. 26H) within a vertical plane that is perpendicular to the first horizontal direction hd1 in which: a first boundary B1 of the one of the first retro-stepped dielectric material portions 165 continuously extends from a first horizontal plane HP1 including a bottommost surface of the one of first retro-stepped dielectric material portions 165 to a second horizontal plane HP2 including topmost surfaces of the first alternating stacks (132, 146); and a second boundary B2 of the one of the first retro-stepped dielectric material portions 165 continuously extends from the first horizontal plane HP1 to a first point on a sidewall of a respective one of the trench fill structures 76, the first point being located at a height located between the first horizontal plane HP1 and the second horizontal plane HP2.

In one embodiment, the second boundary B2 in the vertical cross-sectional profile comprises a horizontal line HL that contacts the sidewall of the respective one of the trench fill structures 76. In one embodiment, a vertical distance between the horizontal line HL and the first horizontal plane HP1 is in a range from 20% to 80% of a vertical distance between the first horizontal plane HP1 and the second horizontal plane HP2.

In one embodiment, strip portions 130 (e.g., pedestals) of the first insulating layers and first electrically conductive layers are located between the first alternating stacks, wherein the horizontal line HL is located in top surfaces of the strip portions 130.

In one embodiment, upon sequentially numbering the trench fill structures 76 along the second horizontal direction hd2 with positive integers, each odd-numbered trench fill structure contacts 76 a respective pair of first retro-stepped dielectric material portions 165 and extends through one of the respective strip portions 130, and each even-numbered trench fill structure does not contact any of the first retro-stepped dielectric material portions 165 and does not contact any of the strip portions 130.

In one embodiment, the second boundary B2 in the vertical cross-sectional profile comprises at least one tapered sidewall contacting a respective subset of the first electrically conductive layers 146 within a respective one of the first alternating stacks (132, 146).

In one embodiment, the first boundary B1 comprises a plurality of tapered sidewalls that are interconnected to each other by a plurality of horizontal steps, wherein one of the plurality of horizontal steps is located at a same height as the horizontal line HL of the second boundary B2 in the vertical cross-sectional profile.

In one embodiment, the three-dimensional memory device comprises second alternating stacks of second insulating layers 232 and second electrically conductive layers 246 located over a respective one of the first alternating stacks (132, 146), wherein: the trench fill structures 76 vertically extend through the second alternating stacks (232, 246), and are located between, and contact, a respective neighboring pair of the second alternating stacks (232, 246); and the arrays of memory stack structures 55 vertically extend through a respective one of the second alternating stacks (232, 246).

In one embodiment, each of the second alternating stacks (232, 246) comprises a respective second staircase region in which a lateral extent of the second electrically conductive layers 246 along the first horizontal direction hd1 decreases with a vertical distance from the substrate (8, 720, 760, 780, 110); and second retro-stepped dielectric material portions 265 overlie a second staircase region of a respective one of the second alternating stacks (232, 246) and contacts a top surface of a respective one of the first retro-stepped dielectric material portions 165.

In one embodiment, one of the second retro-stepped dielectric material portions 165 has an additional vertical cross-sectional profile within the vertical plane of the vertical cross-sectional profile of the one of the first retro-stepped dielectric material portions 165 such that, within the additional vertical cross-sectional profile: a first boundary B1' of the one of the second retro-stepped dielectric material portions 265 continuously extends from a top surface of the one of first retro-stepped dielectric material portions 165 to a third horizontal plane HP3 including topmost surfaces of the second alternating stacks (232, 246); and a second boundary B2' of the one of the second retro-stepped dielectric material portions 265 continuously extends from the top surface of the one of first retro-stepped dielectric material portions 165 to a second point on the sidewall of the respective one of the trench fill structures 76, the second point being located at a height located the second horizontal plane HP2 and the third horizontal plane HP3.

In one embodiment, the bottommost surface of the one of the first retro-stepped dielectric material portions 165 contacts a top surface of a semiconductor material layer 110 within the substrate (8, 720, 760, 780, 110).

In one embodiment, each sidewall of the first alternating stacks (132, 146) is contacted by a sidewall of an insulating material portion (such as an insulating spacer 76A) of a respective one of the trench fill structures 76.

In one embodiment, each of the trench fill structures 76 comprises: a contact via structure 76B contacting a respective doped semiconductor region (such as a source region 61) located within a semiconductor material layer 110 in the substrate (8, 720, 760, 780, 110); and an insulating spacer 76A laterally surrounding the contact via structure 76B and continuously extending from the substrate (8, 720, 760, 780, 110) at least to the second horizontal plane HP2 (and above the third horizontal plane HP3).

In one embodiment, each of the memory stack structures 55 comprises vertical NAND string including the respective vertical stack of memory elements and a vertical semiconductor channel 60 that vertically extend through the first electrically conductive layers 146 adjacent to the respective vertical stack of memory elements.

The various embodiments of the present disclosure can be employed to increase the lithographic process window for recess etch mask layers and to increase the process window for depositing the dielectric materials of the retro-stepped dielectric material portions (165, 265) without forming a void or while minimizing the size of a void within the retro-stepped dielectric material portions (165, 265).

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly for-

What is claimed is:

1. A three-dimensional memory device, comprising:
first alternating stacks of first insulating layers and first electrically conductive layers located over a substrate, wherein the first alternating stacks laterally extend along a first horizontal direction and are laterally spaced apart along a second horizontal direction that is perpendicular to the first horizontal direction by line trenches, and wherein each of the first alternating stacks comprises a respective first staircase region in which a lateral extent of the first electrically conductive layers along the first horizontal direction decreases with an increasing vertical distance from the substrate;
trench fill structures located between and contacting a respective neighboring pair of the first alternating stacks and filling a respective one of the line trenches;
arrays of memory stack structures vertically extending through a respective one of the first alternating stacks, wherein each of the memory stack structures comprises a respective vertical stack of memory elements located at levels of the first electrically conductive layers;
first retro-stepped dielectric material portions overlying a first staircase region of a respective one of the first alternating stacks, wherein one of the first retro-stepped dielectric material portions has a vertical cross-sectional profile within a vertical plane that is perpendicular to the first horizontal direction in which:
a first boundary of the one of the first retro-stepped dielectric material portions continuously extends from a first horizontal plane including a bottommost surface of the one of first retro-stepped dielectric material portions to a second horizontal plane including topmost surfaces of the first alternating stacks; and
a second boundary of the one of the first retro-stepped dielectric material portions continuously extends from the first horizontal plane to a first point on a sidewall of a respective one of the trench fill structures, the first point being located at a height located between the first horizontal plane and the second horizontal plane.

2. The three-dimensional memory device of claim 1, wherein the second boundary in the vertical cross-sectional profile comprises a horizontal line that contacts the sidewall of the respective one of the trench fill structures, and a vertical distance between the horizontal line and the first horizontal plane is in a range from 20% to 80% of a vertical distance between the first horizontal plane and the second horizontal plane.

3. The three-dimensional memory device of claim 2, further comprising strip portions of the first insulating layers and first electrically conductive layers located between the first alternating stacks, wherein the horizontal line is located in top surfaces of the strip portions.

4. The three-dimensional memory device of claim 3, wherein upon sequentially numbering the trench fill structures along the second horizontal direction with positive integers, each odd-numbered trench fill structure contacts a respective pair of first retro-stepped dielectric material potions and extends through one of the respective strip portions, and each even-numbered trench fill structure does not contact any of the first retro-stepped dielectric material portions and does not contact any of the strip portions.

5. The three-dimensional memory device of claim 2, wherein the second boundary in the vertical cross-sectional profile comprises at least one tapered sidewall contacting a respective subset of the first electrically conductive layers within a respective one of the first alternating stacks.

6. The three-dimensional memory device of claim 2, wherein the first boundary comprises a plurality of tapered sidewalls that are interconnected to each other by a plurality of horizontal steps, wherein one of the plurality of horizontal steps is located at a same height as the horizontal line of the second boundary in the vertical cross-sectional profile.

7. The three-dimensional memory device of claim 1, further comprising second alternating stacks of second insulating layers and second electrically conductive layers located over a respective one of the first alternating stacks, wherein:
the trench fill structures vertically extend through the second alternating stacks, and are located between and contact a respective neighboring pair of the second alternating stacks; and
the arrays of memory stack structures vertically extend through a respective one of the second alternating stacks.

8. The three-dimensional memory device of claim 7, wherein:
each of the second alternating stacks comprises a respective second staircase region in which a lateral extent of the second electrically conductive layers along the first horizontal direction decreases with the increasing vertical distance from the substrate; and
second retro-stepped dielectric material portions overlie a second staircase region of a respective one of the second alternating stacks and contacts a top surface of a respective one of the first retro-stepped dielectric material portions.

9. The three-dimensional memory device of claim 8, wherein one of the second retro-stepped dielectric material portions has an additional vertical cross-sectional profile within the vertical plane of the vertical cross-sectional profile of the one of the first retro-stepped dielectric material portions such that, within the additional vertical cross-sectional profile:
a first boundary of the one of the second retro-stepped dielectric material portions continuously extends from a top surface of the one of first retro-stepped dielectric material portions to a third horizontal plane including topmost surfaces of the second alternating stacks; and
a second boundary of the one of the second retro-stepped dielectric material portions continuously extends from the top surface of the one of first retro-stepped dielectric material portions to a second point on the sidewall of the respective one of the trench fill structures, the second point being located at a height located between the second horizontal plane and the third horizontal plane.

10. The three-dimensional memory device of claim 1, wherein the bottommost surface of the one of the first retro-stepped dielectric material portions contacts a top surface of a semiconductor material layer within the substrate.

11. The three-dimensional memory device of claim 1, wherein each sidewall of the first alternating stacks is contacted by a sidewall of an insulating material portion of a respective one of the trench fill structures.

12. The three-dimensional memory device of claim 1, wherein each of the trench fill structures comprises:
a contact via structure contacting a respective doped semiconductor region located within a semiconductor material layer in the substrate; and an insulating spacer laterally surrounding the contact via structure and continuously extending from the substrate at least to the second horizontal plane.

13. The three-dimensional memory device of claim 1, wherein each of the memory stack structures comprises vertical NAND string including the respective vertical stack of memory elements and a vertical semiconductor channel that vertically extend through the first electrically conductive layers adjacent to the respective vertical stack of memory elements.

* * * * *